US007413628B2

(12) United States Patent
Shimbara et al.

(10) Patent No.: US 7,413,628 B2
(45) Date of Patent: Aug. 19, 2008

(54) SUBSTRATE TREATMENT METHOD AND SUBSTRATE TREATMENT APPARATUS

(75) Inventors: Kaoru Shimbara, Kyoto (JP); Masaharu Kimura, Kyoto (JP); Takashi Hara, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 239 days.

(21) Appl. No.: 11/332,637

(22) Filed: Jan. 13, 2006

(65) Prior Publication Data

US 2006/0113039 A1 Jun. 1, 2006

Related U.S. Application Data

(62) Division of application No. 10/623,927, filed on Jul. 21, 2003, now Pat. No. 7,018,555.

(30) Foreign Application Priority Data

| Jul. 26, 2002 | (JP) | ............................. 2002-218723 |
| Jul. 26, 2002 | (JP) | ............................. 2002-218724 |
| Sep. 26, 2002 | (JP) | ............................. 2002-281628 |
| Mar. 25, 2003 | (JP) | ............................. 2003-083695 |
| Mar. 25, 2003 | (JP) | ............................. 2003-083696 |

(51) Int. Cl.
*C23F 1/00* (2006.01)
*C23F 1/02* (2006.01)
*C23C 16/00* (2006.01)
*H01L 21/306* (2006.01)
*B08B 11/02* (2006.01)
*B23B 5/34* (2006.01)

(52) U.S. Cl. ................... 156/345.55; 134/137; 134/149; 156/345.51; 118/729; 118/730; 118/728

(58) Field of Classification Search ................. 134/137, 134/149; 156/345.51
See application file for complete search history.

(56) References Cited

U.S. PATENT DOCUMENTS 5,093,550 A 3/1992 Gerber et al.

(Continued)

FOREIGN PATENT DOCUMENTS

JP 04-186626 7/1992

(Continued)

OTHER PUBLICATIONS

Machine translation of JP 09-107023, inventor Tatshuhiko, Apr. 1997.*

(Continued)

*Primary Examiner*—Rudy Zervigon
*Assistant Examiner*—Keath T Chen
(74) *Attorney, Agent, or Firm*—Ostrolenk, Faber, Gerb & Soffen, LLP

(57) ABSTRACT

A substrate treatment method for treating a substrate by supplying a treatment liquid to the substrate while rotating the substrate. The method comprises the steps of: performing a first substrate rotation process for rotating the substrate while clamping the substrate by a first clamping member set; performing a second substrate rotation process after the first substrate rotation step for rotating the substrate while clamping the substrate by the first clamping member set and a second clamping member set provided separately from the first clamping member set; and performing a third substrate rotation process after the second substrate rotation step by unclamping the substrate from the first clamping member set for rotating the substrate while clamping the substrate by the second clamping member set.

19 Claims, 26 Drawing Sheets

U.S. PATENT DOCUMENTS

| | | | |
|---|---|---|---|
| 6,067,727 A | 5/2000 | Muraoka | |
| 6,683,007 B1 | 1/2004 | Yamasaki et al. | |
| 6,935,638 B2 | 8/2005 | Ivanov et al. | |
| 2002/0153676 A1 | 10/2002 | Noguchi | |
| 2002/0185163 A1* | 12/2002 | Peace et al. | 134/137 |

FOREIGN PATENT DOCUMENTS

| | | | |
|---|---|---|---|
| JP | 09-107023 | * | 4/1997 |
| JP | 9-107023 | | 4/1997 |
| JP | 10249613 A | | 9/1998 |
| JP | 2001-156039 | | 6/2001 |
| JP | 2003-088793 A | | 3/2003 |

OTHER PUBLICATIONS

Office Action issued on Jul. 3, 2007 in connection with the Japanese Patent Application No. 2003-083695.

* cited by examiner

SUBSTRATE TREATMENT METHOD AND SUBSTRATE TREATMENT APPARATUS

CROSS REFERENCE TO A RELATED APPLICATION

The present application is a Divisional Application of Ser. No. 10/623,927 filed Jul. 21, 2003 now U.S. Pat. No. 7,018,555, which application claims the benefit and priority of Japanese Application Serial No. 2002-218723, filed Jul. 26, 2002, Japanese Application Serial No. 2002-218724, filed Jul. 26, 2002, Japanese Application No. 2002-281628, filed Sep. 26,2002, Japanese Application Serial No. 2003-083695, filed Mar. 25, 2003 and Japanese Application Serial No. 2003-083696 filed Mar. 25, 2003, incorporated by reference.

BACKGROUND OF THE INVENTION

1. Field of the Invention

The present invention relates to a substrate treatment method and a substrate treatment apparatus for treating a substrate (particularly, treating a substrate with a treatment fluid such as a treatment liquid) while rotating the substrate. Examples of the substrate to be treated include various types of substrates such as semiconductor wafers, glass substrates for liquid crystal display devices, glass substrates for plasma display panels, substrates for optical disks, substrates for magnetic disks, substrates for magneto-optical disks and substrates for photo-masks.

2. Description of Related Arts

In the production of a semiconductor device, an etching process is often performed, after a thin metal film such as a thin copper film is formed on the entire front surface and peripheral surface (and the entire rear surface in some case) of a semiconductor substrate (hereinafter referred to simply as "wafer"), for etching away unnecessary portions of the thin metal film. For example, a thin copper film for wiring is merely required to be provided in a device formation region on the front surface of the wafer, so that portions of the copper thin film present on a peripheral edge portion of the front surface of the wafer (having a width of about 5 mm as measured from the peripheral edge of the wafer) and the peripheral surface and rear surface of the wafer are unnecessary. In addition, metallic or ionic copper deposited on the peripheral edge portion, the rear surface and the peripheral surface is likely to contaminate a hand of a substrate transport robot provided in a substrate treatment apparatus, and the contamination may be transferred to another substrate held by the hand.

Similarly, a non-metallic film (such as an oxide film or a nitride film) formed on the peripheral surface of the substrate is thinly etched for removal of metal contaminants (including metal ions) from the surface.

A typical substrate periphery treatment apparatus for selectively etching away portions of a thin film from the peripheral edge portion and peripheral surface of a wafer includes, for example, a spin chuck for rotating the wafer while horizontally holding the wafer, a shield plate provided above the spin chuck for limiting a space above the wafer, and an etching liquid supply nozzle for supplying an etching liquid to a lower surface of the wafer. The etching liquid supplied to the lower surface of the wafer flows over the lower surface of the wafer radially outwardly from a rotation center by a centrifugal force, and further flows over the peripheral surface of the wafer onto an upper surface of the wafer, whereby unnecessary substances are etched away from the peripheral edge portion of the upper surface of the wafer. At this time, the shield plate is located adjacent the upper surface of the wafer, and an inert gas such as nitrogen gas is supplied to the space between the shield plate and the wafer.

The amount of the etching liquid flowing onto the upper surface can be controlled by properly adjusting the flow rate of the inert gas and the rotation speed of the spin chuck, so that a peripheral edge portion of the upper surface of the wafer having a predetermined width (e.g., 1 to 7 mm) can selectively be subjected to the etching process (so-called bevel etching process).

The spin chuck includes a vertical rotary shaft, a spin base fixed to an upper end of the rotary shaft, and three chuck pins provided upright on a peripheral edge portion of the spin base. A torque is applied to the rotary shaft with the peripheral surface of the wafer clamped by the chuck pins, whereby the wafer is rotated together with the spin base.

During the rotation of the wafer held by the spin chuck, the unnecessary substances are etched away from the peripheral edge portion of the upper surface of the wafer by supplying the etching liquid to the lower surface of the wafer. After the upper and lower surfaces of the wafer are rinsed with deionized water, the spin chuck is rotated at a high speed to spin off water droplets from the upper and lower surfaces of the wafer for drying the wafer.

With this arrangement, however, the wafer is constantly clamped by the chuck pins, so that portions of the peripheral surface of the wafer kept in abutment against the chuck pins are liable to suffer from a treatment failure such as insufficient etching, insufficient rinsing or insufficient drying.

One approach to this problem is to once stop the rotation of the spin chuck during the treatment, then change wafer clamping positions and resume the rotation of the spin chuck. However, this approach is disadvantageous because the treatment time per wafer is prolonged and the productivity is drastically reduced.

Another conventional approach is disclosed in Japanese Unexamined Patent Publication No. 2001-118824, in which the wafer clamping positions are changed without stopping the rotation of the spin chuck by completely or slightly releasing the wafer from the chuck pins to relatively rotate (or slide) the wafer with respect to the spin chuck and then clamping the wafer again by the chuck pins during the rotation of the spin chuck.

In this conventional approach, however, the wafer is kept in sliding contact with the chuck pins of the spin chuck, because the wafer clamping positions are changed by sliding the wafer on the spin chuck. This results in generation of particles.

In the conventional approach described above, an air cylinder and a link mechanism are incorporated in the spin base for driving the chuck pins, and compressed air is supplied for driving the spin base. This complicates the construction of the apparatus, making the wafer clamping/unclamping motions of the chuck pins unstable.

With the aforesaid arrangement, the chuck pins are kept in sliding contact with the peripheral surface of the wafer during the relative rotation of the wafer with respect to the spin chuck, so that the chuck pins are abraded.

Further, the degree of the relative rotation of the wafer with respect to the spin chuck cannot accurately be controlled, so that the rotational position of the wafer cannot be controlled.

When the wafer is unclamped from the chuck pins during the treatment, a minute spacing between the wafer and the shield plate cannot be kept constant. This makes it impossible to accurately control the amount of the etching liquid flowing onto the front surface from the rear surface of the wafer.

SUMMARY OF THE INVENTION

It is one object of the present invention to provide a substrate treatment apparatus and a substrate treatment method, wherein substrate clamping positions can be changed during rotation of a substrate.

It is another object of the present invention to provide a substrate treatment method and a substrate treatment apparatus, wherein substrate clamping positions can be changed during rotation of a substrate and generation of particles can be suppressed so that the substrate can properly be treated.

It is further another object of the present invention to provide a substrate treatment apparatus and a substrate treatment method, wherein substrate clamping positions can be changed during rotation of a substrate so that the substrate can properly be treated without reduction in productivity.

It is still another object of the present invention to provide a substrate treatment apparatus and a substrate treatment method, wherein a substrate can be clamped and unclamped by clamping members during rotation of the substrate with a simplified construction.

It is further another object of the present invention to provide a substrate treatment apparatus and a substrate treatment method, wherein an operation mode can be switched between a mode in which clamping members are kept in a substrate clamping/unclamping state and a mode in which the clamping members are kept in a substrate clamping state or in a substrate unclamping state.

It is still another object of the present invention to provide a substrate treatment apparatus and a substrate treatment method, wherein abrasion of a component can be suppressed and a high-quality substrate treatment can be achieved by rotating a substrate while stably holding the substrate.

It is further another object of the present invention to provide a substrate treatment apparatus and a substrate treatment method, wherein the rotational position of a substrate can easily be controlled.

It is still another object of the present invention to provide a substrate treatment apparatus and a substrate treatment method, wherein a peripheral edge portion of a substrate can properly be treated.

It is further another object of the present invention to provide a substrate treatment apparatus and a substrate treatment method, wherein a substrate can constantly stably be held during a substrate treatment.

According to one aspect of the present invention, there is provided a substrate treatment method for treating a substrate by supplying a treatment liquid to the substrate while rotating the substrate, the method comprising the steps of: performing a first substrate rotation process for rotating the substrate while clamping the substrate by a first clamping member set including at least two clamping members; performing a second substrate rotation process after the first substrate rotation step for rotating the substrate while clamping the substrate by the first clamping member set and a second clamping member set provided separately from the first clamping member set and including at least two clamping members; and performing a third substrate rotation process after the second substrate rotation step by unclamping the substrate from the first clamping member set for rotating the substrate while clamping the substrate by the second clamping member set.

In this method, a substrate clamping state can be once switched from a first clamping state where the substrate is clamped by the first clamping member set and unclamped by the second clamping member set to an intermediate state where the substrate is clamped by the first and second clamping member sets, and then to a second clamping state where the substrate is clamped by the second clamping member set and unclamped by the first clamping member set while the substrate is continuously rotated. Thus, substrate clamping positions can be changed even during the rotation of the substrate.

With this arrangement, the entire surface of the substrate can properly be treated with the treatment liquid. In addition, there is no need to stop the rotation of the substrate for changing the substrate clamping positions, thereby preventing the reduction in productivity.

Further, the substrate is unlikely to be brought into sliding contact with the clamping members, so that the generation of particles can be suppressed. Thus, the substrate treatment can properly be performed.

Particularly, when the substrate clamping state is switched from the first clamping state to the second clamping state, the substrate is once clamped by both the first clamping member set and the second clamping member set in the intermediate state. Therefore, the substrate is constantly clamped by either or both of the first and second clamping member sets during the rotation of the substrate. Hence, the substrate is unlikely to be slid even during the switching from the first clamping state to the second clamping state, whereby the generation of particles can assuredly be suppressed.

The first clamping member set preferably includes at least three substrate clamp pins (e.g., abutment portions 96, A, B of clamping members F1 to F3 in embodiments to be described later). The second clamping member set preferably includes at least three substrate clamp pins (e.g., abutment portions 96, C, D of clamping members S1 to S3 in the embodiments to be described later).

In this case, the substrate clamp pins each have a smaller contact area with respect to the substrate for proper treatment of a peripheral edge portion of the substrate. Since the at least three clamp pins are employed, the substrate can assuredly be held.

The method preferably further comprises the step of supplying the treatment liquid to a surface of the substrate being rotated at least in the first substrate rotation step and the third substrate rotation step. The substrate is clamped at different substrate clamping positions in the first substrate rotation step and in the third substrate rotation step. Therefore, the entire surface of the substrate can be treated with the treatment liquid.

The treatment liquid supply step preferably comprises the step of supplying an etching liquid for etching away an unnecessary substance from the peripheral edge portion of the substrate. This makes it possible to perform a process for removing the unnecessary substance from the peripheral edge portion of the substrate. Since the substrate is clamped at different substrate clamping positions in the first substrate rotation step and in the third substrate rotation step as described above, the entire peripheral edge portion of the substrate can properly be treated.

Examples of the process for removing the unnecessary substance from the peripheral edge portion of the substrate include a process for etching away an unnecessary thin film from the peripheral edge portion of the substrate (so-called bevel etching process) and a process for removing unwanted particles or metal contaminants from the peripheral edge portion of the substrate (so-call bevel cleaning process).

The method may further comprise the step of supplying the treatment liquid to the substrate prior to the first substrate rotation step. In this case, the treatment liquid is not supplied to the substrate during any of the first substrate rotation step, the second substrate rotation step and the third substrate rotation step, but a drying process may be performed by spinning off the treatment liquid by the rotation of the substrate. The substrate is clamped at different substrate clamping positions in the first substrate rotation step and in the third substrate rotation step. Therefore, the entire surface of the substrate can properly be dried without the treatment liquid remaining at the substrate clamping positions.

The clamping members of at least one of the first clamping member set and the second clamping member set may each have at least two abutment portions which are selectively brought into abutment against the substrate. In this case, the method preferably further comprises the step of switchably bringing the at least two abutment portions into abutment against the substrate. Since the clamping members each have the at least two abutment portions, the substrate is clamped switchably at least at two different substrate abutting positions by each of the clamping members. That is, the substrate abutting positions can be changed by driving the clamping members to switchably bring the abutment portions into abutment against the substrate in the abutment portion switching step.

Therefore, the first and second clamping member sets can change the substrate abutting positions in at least three ways for clamping the substrate by employing two driving mechanisms respectively provided for driving the first and second clamping member sets. As a result, the substrate abutting positions are each covered with the corresponding abutment portions only for a limited period, so that the total substrate treatment period can be reduced.

More specifically, it is herein assumed that the treatment liquid should be supplied to the entire peripheral edge portion of the substrate for at least 60 seconds. Where the clamping member sets can change the substrate abutting positions only in two ways, it is impossible to reduce the treatment period to shorter than 120 seconds because the treatment liquid should be supplied to each of the substrate abutting positions for 60 seconds. On the contrary, where the clamping member sets can change the substrate abutting positions in four ways, for example, it is merely necessary to clamp the substrate in each of the four ways for 20 seconds so as to supply the treatment liquid to each of the substrate abutting positions for 60 seconds in total. That is, the treatment period can be reduced to about 80 seconds.

The first clamping member set may include three clamping members each having a first abutment portion and a second abutment portion which are selectively brought into abutment against the substrate, and the second clamping member set may include three clamping members each having a third abutment portion which is brought into abutment against the substrate. In this case, the first substrate rotation step preferably comprises the step of bringing the first abutment portions of the three clamping members of the first clamping member set into abutment against the substrate for clamping the substrate. The second substrate rotation step preferably comprises the step of bringing the third abutment portions of the three clamping members of the second clamping member set into abutment against the substrate with the first abutment portions of the three clamping members of the first clamping member set kept in abutment against the substrate. The third substrate rotation step preferably comprises the step of retracting the first abutment portions of the three clamping members of the first clamping member set from the substrate. The method preferably further comprises the steps of: performing a fourth substrate rotation process after the third substrate rotation step by bringing the second abutment portions of the three clamping members of the first clamping member set into abutment against the substrate with the third abutment portions of the three clamping members of the second clamping member set kept in abutment against the substrate for rotating the substrate while clamping the substrate by the first and second clamping member sets; and performing a fifth substrate rotation process after the fourth substrate rotation step by retracting the third abutment portions of the three clamping members of the second clamping member set from the substrate to unclamp the substrate from the second clamping member set for rotating the substrate while clamping the substrate by the first substrate clamping member set.

In the first substrate rotation step, the substrate is rotated while being stably clamped by the three first abutment portions. In the second substrate rotation step, the substrate is rotated while being stably clamped by a total of six abutment portions, i.e., the three first abutment portions and the three third abutment portions. In the third substrate rotation step, the substrate is rotated while being stably clamped by the three third abutment portions. In the fourth substrate rotation step, the substrate is rotated while being stably clamped by a total of six abutment portions, i.e., the three second abutment portions and the three third abutment portions. In the fifth substrate rotation step, the substrate is rotated while being stably clamped by the three second abutment portions. Thus, the substrate clamping state is once switched from a state where the substrate is clamped by the three first abutment portions to an intermediate state where the substrate is clamped by the six abutment portions including the three first abutment portions and the three third abutment portions, and then to a state where the substrate is clamped by the three third abutment portions. Then, the substrate clamping state is further switched to an intermediate state where the substrate is clamped by the three third abutment portions and the three second abutment portions, and then to a state where the substrate is clamped by the three second abutment portions.

The three clamping members of the second clamping member set may each have the third abutment portion and a fourth abutment portion which are selectively brought into abutment against the substrate. In this case, the method preferably further comprises the steps of: performing a sixth substrate rotation process after the fifth substrate rotation step by bringing the fourth abutment portions of the three clamping members of the second clamping member set into abutment against the substrate with the second abutment portions of the three clamping members of the first clamping member set kept in abutment against the substrate for rotating the substrate while clamping the substrate by the first and second clamping member sets; and performing a seventh substrate rotation process after the sixth substrate rotation step by retracting the second abutment portions of the three clamping members of the first clamping member set from the substrate to unclamp the substrate from the first clamping member set for rotating the substrate while clamping the substrate only by the second clamping member set.

In the sixth substrate rotation step of this method, the substrate is rotated while being stably clamped by a total of six abutment portions, i.e., the three second abutment portions and the three fourth abutment portions. In the seventh substrate rotation step, the substrate is rotated while being stably clamped by the three fourth abutment portions. Thus, the substrate clamping state is once switched to an intermediate state where the substrate is clamped by the three second abutment portions and the three fourth abutment portions, and then to a state where the substrate is clamped by the three fourth abutment portions.

The method may further comprise the steps of: performing an eighth substrate rotation process after the seventh substrate rotation step by bringing the first abutment portions of the three clamping members of the first clamping member set into abutment against the substrate with the fourth abutment portions of the three clamping members of the second clamping member set kept in abutment against the substrate for rotating the substrate while clamping the substrate by the first and second clamping member sets; and retracting the fourth abutment portions of the three clamping members of the second clamping member set from the substrate after the eighth substrate rotation step and repeating a process sequence starting from the first substrate rotation step.

Thus, the substrate clamping state can be once switched to an intermediate state where the substrate is clamped by the three fourth abutment portions and the three first abutment portions, and then back to the state where the substrate is rotated while being clamped by the three first abutment portions.

The method preferably comprises the step of supplying the treatment liquid to the surface of the substrate being rotated at least in the first substrate rotation step, the third substrate rotation step and the fifth substrate rotation step. In the first to fifth substrate rotation steps, the substrate clamping positions are changed, so that the entire surface of the substrate can be treated with the treatment liquid.

Further, the method preferably comprises the step of supplying the treatment liquid to the surface of the substrate being rotated at least in the first substrate rotation step, the third substrate rotation step, the fifth substrate rotation step and the seventh substrate rotation step. In the first to seventh substrate rotation steps, the substrate clamping positions are changed, so that the entire surface of the substrate can be treated with the treatment liquid.

The treatment liquid supply step may comprise the step of supplying the etching liquid for etching away an unnecessary substance from the peripheral edge portion of the substrate. Thus, the entire peripheral edge portion of the substrate can properly be subjected to the unnecessary substance removal process.

The method may further comprise the step of supplying the treatment liquid to the substrate prior to the first substrate rotation step. In this case, the treatment liquid is not supplied to the substrate during any of the first to fifth substrate rotation steps, but the drying process may be performed by spinning off the treatment liquid by the rotation of the substrate.

Alternatively, the method may further comprise the step of supplying the treatment liquid to the substrate prior to the first substrate rotation step, wherein the treatment liquid is not supplied to the substrate during any of the first to seventh substrate rotation steps, but the drying process is performed by spinning off the treatment liquid by the rotation of the substrate.

With these arrangements, the drying process can be performed while the substrate clamping positions are changed. Therefore, the entire surface of the substrate can properly be dried without the treatment liquid remaining at the substrate clamping positions.

According to another aspect of the present invention, there is provided a substrate treatment apparatus for treating a substrate by supplying a treatment liquid to the substrate while rotating the substrate, the apparatus comprising: a substrate holding mechanism comprising a first clamping member set including at least two clamping members and a second clamping member set provided separately from the first clamping member set and including at least two clamping members; a rotative drive mechanism for rotating the substrate holding mechanism; a first clamping member drive mechanism for driving the first clamping member set; a second clamping member drive mechanism for driving the second clamping member set; and a controller for controlling the rotative drive mechanism, the first clamping member drive mechanism and the second clamping member drive mechanism to perform a first substrate rotation process for rotating the substrate holding mechanism while clamping the substrate by the first clamping member set, to perform a second substrate rotation process after the first substrate rotation process for rotating the substrate holding mechanism while clamping the substrate by the first clamping member set and the second clamping member set, and to perform a third substrate rotation process after the second substrate rotation process by unclamping the substrate from the first clamping member set for rotating the substrate holding mechanism while clamping the substrate by the second clamping member set.

The clamping members of at least one of the first clamping member set and the second clamping member set may each have at least two abutment portions which are selectively brought into abutment against the substrate. In this case, the controller preferably performs an abutment portion switching process for switchably bringing the at least two abutment portions into abutment against the substrate.

According to further another aspect of the present invention, there is provided a substrate treatment apparatus for treating a substrate by supplying a treatment liquid while rotating the substrate, the apparatus comprising: a substrate holding mechanism comprising a first clamping member set including at least two clamping members and a second clamping member set provided separately from the first clamping member set and including at least two clamping members; a rotative drive mechanism for rotating the substrate holding mechanism; a first clamping member drive mechanism for driving the first clamping member set; a second clamping member drive mechanism for driving the second clamping member set; and a controller for independently controlling the first clamping member drive mechanism and the second clamping member drive mechanism.

With this arrangement, the first and second clamping member sets can independently be operated, so that first, second and third substrate rotation processes as described above can properly be performed.

The controller is preferably capable of controlling the first clamping member drive mechanism and the second clamping member drive mechanism so as to clamp the substrate by both the first clamping member set and the second clamping member set. With this arrangement, the second substrate rotation process described above can properly be performed.

The substrate holding mechanism may comprise a rotary member rotatable about a rotary shaft thereof. The first clamping member drive mechanism may comprise a first non-rotative movable member which is movable parallel to the rotary shaft, a first driving mechanism for moving the first non-rotative movable member parallel to the rotary shaft, a first rotative movable member which is movable parallel to the rotary shaft in association with movement of the first non-rotative movable member by a driving force received from the first non-rotative movable member and is rotatable together with the rotary member, and a first movement converting mechanism for converting movement of the first rotative movable member into movement of the first substrate clamping member set. Further, the second clamping member drive mechanism may comprise a second non-rotative movable member which is movable parallel to the rotary shaft, a second driving mechanism for moving the second non-rotative movable member parallel to the rotary shaft, a second rotative movable member which is movable parallel to the rotary shaft in association with movement of the second non-rotative movable member by a driving force received from the second non-rotative movable member and is rotatable together with the rotary member, and a second movement converting mechanism for converting movement of the second rotative movable member into movement of the second substrate clamping member set.

With this arrangement, when the first and second non-rotative movable members are respectively moved by the first and second driving mechanisms, the first and second rotative movable members are respectively moved by the driving forces received from the first and second non-rotative movable members. The movements of the first and second rotative movable members are converted into the movements of the clamping members for clamping and unclamping the substrate.

That is, the first and second rotative movable members are rotated together with the rotary member (in a rotative state), while the first and second non-rotative movable members are kept still (in a non-rotative state). Therefore, the movements of the first and second rotative movable members can respectively be converted into the movements of the clamping members by the first and second movement converting mechanisms without relative rotation of the first and second rotative movable members with respect to the rotary member even during the rotation of the rotary member.

In this manner, the substrate can be completely or slightly released from the clamping members and then clamped again by the clamping members even during the rotation of the rotary member. Thus, the clamping members can change substrate clamping positions even during the rotation of the substrate.

At least one of the first non-rotative movable member and the first rotative movable member may be configured annularly about the rotary shaft. Further, at least one of the second non-rotative movable member and the second rotative movable member may be configured annularly about the rotary shaft.

The substrate treatment apparatus may further comprise a first annular bearing as a first driving force transmission mechanism for transmitting the driving force from the first non-rotative movable member to the first rotative movable member, the first bearing coupling the first non-rotative movable member and the first rotative movable member so as to permit relative rotation of the first rotative movable member with respect to the first non-rotative movable member about the rotary shaft.

The first bearing may have a stationary ring provided around the rotary shaft and coupled to the first non-rotative movable member, and a rotary ring coupled to the first rotative movable member and rotatable relative to the stationary ring about the rotary shaft.

With this arrangement, the first rotative movable member can be rotated together with the rotary member (in a rotative state), while the first non-rotative movable member is kept still (in a non-rotative state).

The first driving force transmission mechanism may comprise a plurality of first rolling members provided on at least one of the first non-rotative movable member and the first rotative movable member so as to be rolled on a surface of the other movable member.

With this arrangement, the first rotative movable member can be rotated together with the rotary member (in a rotative state), while the first non-rotative movable member is kept still (in a non-rotative state).

The first driving force transmission mechanism may comprise a first stationary magnet and a first rotary magnet respectively provided on the first non-rotative movable member and the first rotative movable member with opposed poles thereof having the same polarity.

This arrangement constitutes a so-called magnetic bearing. Therefore, the first rotative movable member can be rotated together with the rotary member (in a rotative state), while the first non-rotative movable member is kept still (in a non-rotative state). In addition, the first rotative movable member can be supported in a non-contact manner by magnetic levitation, while the relative rotation of the first rotative movable member with respect to the first non-rotative movable member is permitted.

Further, the first driving force transmission mechanism may comprise a first gas supply mechanism for supplying a gas between the first non-rotative movable member and the first rotative movable member so as to keep the first non-rotative movable member and the first rotative movable member in spaced relation.

This arrangement constitutes a so-called pneumatic bearing. Therefore, the first rotative movable member can be rotated together with the rotary member (in a rotative state), while the first non-rotative movable member is kept still (in a non-rotative state) In addition, the first rotative movable member can be supported in a non-contact manner by pneumatic levitation, while the relative rotation of the first rotative movable member with respect to the first non-rotative movable member is permitted.

The substrate treatment apparatus may further comprise a second annular bearing as a second driving force transmission mechanism for transmitting the driving force from the second non-rotative movable member to the second rotative movable member, the second bearing coupling the second non-rotative movable member and the second rotative movable member so as to permit relative rotation of the second rotative movable member with respect to the second non-rotative movable member about the rotary shaft.

The second bearing may have a stationary ring provided around the rotary shaft and coupled to the second non-rotative movable member, and a rotary ring coupled to the second rotative movable member and rotatable relative to the stationary ring about the rotary shaft.

The second driving force transmission mechanism may comprise a plurality of second rolling members provided on at least one of the second non-rotative movable member and the second rotative movable member so as to be rolled on a surface of the other movable member.

The second driving force transmission mechanism may comprise a second stationary magnet and a second rotary magnet respectively provided on the second non-rotative movable member and the second rotative movable member with opposed poles thereof having the same polarity.

The second driving force transmission mechanism may comprise a second gas supply mechanism for supplying a gas between the second non-rotative movable member and the second rotative movable member so as to keep the second non-rotative movable member and the second rotative movable member in spaced relation.

The first driving mechanism and the second driving mechanism preferably comprise a first driving force source and a second driving force source, respectively, which are independently controllable.

With this arrangement, the substrate can be clamped switchably by the first clamping member set (first substrate clamping mechanism) and by the second clamping member set (second substrate clamping mechanism), because the first substrate clamping mechanism and the second substrate C clamping mechanism can independently be operated.

More specifically, the controller controls the first and second driving mechanisms to switch a substrate clamping state between a first clamping state where the substrate is clamped by the clamping members of the first substrate clamping mechanism and unclamped by the clamping members of the second substrate clamping mechanism and a second clamping state where the substrate is clamped by the clamping members of the second substrate clamping mechanism and unclamped by the clamping members of the first substrate clamping mechanism when the rotary member is rotated by the rotative drive mechanism.

This arrangement obviates the need for relatively rotating (or sliding) the substrate with respect to the rotary member when the substrate clamping positions are changed. Therefore, the generation of particles can be suppressed without sliding contact of the substrate with any components of the rotary member.

The controller preferably further controls the first and second driving mechanisms so as to switch the substrate clamping state to an intermediate state where the substrate is clamped by the clamping members of the first substrate clamping mechanism and the clamping members of the second substrate clamping mechanism when the substrate clamping state is switched between the first clamping state and the second clamping state.

With this arrangement, the substrate is once clamped by both the first substrate clamping mechanism and the second substrate clamping mechanism in the intermediate state when the substrate clamping state is switched from the first clamping state effected by the first substrate clamping mechanism to the second clamping state effected by the second substrate clamping mechanism. Thus, the substrate is constantly clamped by some or all of the clamping members during the rotation of the rotary member. Therefore, the generation of particles due to the sliding of the substrate can be suppressed, and the substrate is prevented from spinning out when the substrate clamping state is switched from the first clamping state to the second clamping state.

The apparatus may further comprise a first relative rotation restricting mechanism for restricting the relative rotation of the first rotative movable member with respect to the rotary member. The apparatus may further comprise a second relative rotation restricting mechanism for restricting the relative rotation of the second rotative movable member with respect to the rotary member. The first relative rotation restricting mechanism may comprise a first guide mechanism which is rotatable together with the rotary member and guides the first rotative movable member parallel to the rotary shaft. The second relative rotation restricting mechanism may comprise a second guide mechanism which is rotatable together with the rotary member and guides the second rotative movable member parallel to the rotary shaft.

According to still another aspect of the present invention, there is provided a substrate treatment apparatus, which comprises: a rotary member having a rotary shaft and a plurality of clamping members which are capable of clamping and unclamping a substrate, the rotary member being rotatable about the rotary shaft; a rotative drive mechanism for applying a torque to the rotary shaft to rotatively drive the rotary member; a non-rotative movable member which is movable parallel to the rotary shaft; a driving mechanism for moving the non-rotative movable member parallel to the rotary shaft; a rotative movable member which is movable parallel to the rotary shaft in association with movement of the non-rotative movable member by a driving force received from the non-rotative movable member and is rotatable together with the rotary member; a movement converting mechanism for converting movement of the rotative movable member into movements of the clamping members of the rotary member; and a controller for operating the driving mechanism so that the substrate is completely or slightly released from the clamping members and then clamped again by the clamping members while the rotary member is rotated by the rotative drive mechanism.

With this arrangement, when the non-rotative movable member is moved by the driving mechanism, the rotative movable member is moved by the driving force received from the non-rotative movable member. The movement of the rotative movable member is converted into the movements of the clamping members for clamping and unclamping the substrate.

That is, the rotative movable member can be rotated together with the rotary member (in a rotative state), while the non-rotative movable member is kept still (in a non-rotative state). Therefore, the movement of the rotative movable member can be converted into the movements of the clamping members by the movement converting mechanism without relative rotation of the rotative movable member with respect to the rotary member even during the rotation of the rotary member.

In this manner, the substrate can be completely or slightly released from the clamping members and then clamped again by the clamping members even during the rotation of the rotary member. Thus, the clamping members can change substrate clamping positions during the rotation of the substrate.

The apparatus may further comprise a relative rotation restricting mechanism for restricting the relative rotation of the rotative movable member with respect to the rotary member. The relative rotation restricting mechanism may comprise a guide mechanism which is rotatable together with the rotary member and guides the rotative movable member parallel to the rotary shaft.

At least one of the non-rotative movable member and the rotative movable member may be configured annularly about the rotary shaft.

The controller may control the rotative drive mechanism to accelerate or decelerate the rotation of the rotary member when the substrate is completely or slightly released from the clamping members.

With this arrangement, the rotation of the rotary member is accelerated or decelerated when the substrate is completely or slightly released from the clamping members. Therefore, the substrate is inertially rotated relative to the rotary member. Thus, the substrate clamping positions can assuredly be changed.

The clamping members may each have a first abutment portion and a second abutment portion which are selectively brought into abutment against the substrate. In this case, the controller preferably operates the driving mechanism so that the first abutment portion and the second abutment portion are switchably brought into abutment against the substrate during the rotation of the rotary member.

With this arrangement, the first abutment portions and the second abutment portions of the clamping members are switchably brought into abutment against the substrate by operating the driving mechanism, so that the substrate can be clamped by either the first abutment portions or the second abutment portions. Therefore, the substrate clamping positions can be changed by the switching between the first abutment portions and the second abutment portions even during the rotation of the substrate.

The substrate treatment apparatus preferably further comprises an annular bearing as a driving force transmission mechanism for transmitting the driving force from the non-rotative movable member to the rotative movable member, the bearing coupling the non-rotative movable member and the rotative movable member so as to permit relative rotation of the rotative movable member with respect to the non-rotative movable member about the rotary shaft.

The bearing may comprise a stationary ring provided around the rotary shaft and coupled to the non-rotative movable member, and a rotary ring coupled to the rotative movable member and rotatable relative to the stationary ring about the rotary shaft.

With this arrangement, the rotative movable member can be rotated together with the rotary member (in a rotative state), while the non-rotative movable member is kept still (in a non-rotative state).

The driving force transmission mechanism may comprise a plurality of rolling members provided on at least one of the non-rotative movable member and the rotative movable member so as to be rolled on a surface of the other movable member.

With this arrangement, the rotative movable member can be rotated together with the rotary member (in a rotative state), while the non-rotative movable member is kept still (in a non-rotative state).

The driving force transmission mechanism may comprise a stationary magnet and a rotary magnet respectively provided on the non-rotative movable member and the rotative movable member with opposed poles thereof having the same polarity.

This arrangement constitutes a so-called magnetic bearing. Therefore, the rotative movable member can be rotated together with the rotary member (in a rotative state), while the non-rotative movable member is kept still (in a non-rotative state). In addition, the rotative movable member can be supported in a non-contact manner by magnetic levitation, while the relative rotation of the rotative movable member with respect to the non-rotative (movable member is permitted.

Further, the driving force transmission mechanism may comprise a gas supply mechanism for supplying a gas between the non-rotative movable member and the rotative movable member so as to keep the non-rotative movable member and the rotative movable member in spaced relation.

This arrangement constitutes a so-called pneumatic bearing. Therefore, the rotative movable member can be rotated together with the rotary member (in a rotative state), while the non-rotative movable member is kept still (in a non-rotative state). In addition, the rotative movable member can be supported in a non-contact manner by pneumatic levitation, while the relative rotation of the rotative movable member with respect to the non-rotative movable member is permitted.

According to further another aspect of the present invention, there is provided a substrate treatment method, which comprises the steps of: providing a rotary member rotatable about a rotary shaft and having a plurality of clamping members which are capable of clamping and unclamping a substrate; providing a non-rotative movable member which is movable parallel to the rotary shaft; providing a rotative movable member which is movable parallel to the rotary shaft in association with movement of the non-rotative movable member by a driving force received from the non-rotative movable member and is rotatable together with the rotary member; providing a movement converting mechanism for converting movement of the rotative movable member into movements of the clamping members of the rotary member; rotating the rotary member by a rotative drive mechanism; moving the non-rotative movable member parallel to the rotary shaft to completely or slightly release the substrate from the clamping members in the rotary member rotation step; and moving the non-rotative movable member parallel to the rotary shaft to clamp the substrate again by the clamping members after the complete/slight release step.

The method preferably further comprises the step of controlling the rotative drive mechanism to accelerate or decelerate the rotation of the rotary member in the complete/slight release step.

According to still another aspect of the present invention, there is provided a substrate treatment method, which comprises the steps of: providing a rotary member rotatable about a rotary shaft and comprising a first substrate clamping mechanism and a second substrate clamping mechanism each having a plurality of clamping members which are capable of clamping and unclamping a substrate; providing a first non-rotative movable member which is movable parallel to the rotary shaft; providing a second non-rotative movable member which is movable parallel to the rotary shaft; providing a first rotative movable member which is movable parallel to the rotary shaft in association with movement of the first non-rotative movable member by a driving force received from the first non-rotative movable member and is rotatable together with the rotary member; providing a second rotative movable member which is movable parallel to the rotary shaft in association with movement of the second non-rotative movable member by a driving force received from the second non-rotative movable member and is rotatable together with the rotary member; providing a first movement converting mechanism for converting movement of the first rotative movable member into movement of the first substrate clamping mechanism of the rotary member; providing a second movement converting mechanism for converting movement of the second rotative movable member into movement of the second substrate clamping mechanism of the rotary member; performing a first clamping process by controlling positions of the first and second non-rotative movable embers along the rotary shaft for keeping a substrate clamping state in a first clamping state where the substrate is clamped by the clamping members of the first substrate clamping mechanism and unclamped by the clamping members of the second substrate clamping mechanism; performing a second clamping process by controlling the positions of the first and second non-rotative movable members along the rotary shaft for keeping the substrate clamping state in a second clamping state where the substrate is clamped by the clamping members of the second substrate clamping mechanism and unclamped by the clamping members of the first substrate clamping mechanism; and switching the substrate clamping state between the first clamping state and the second clamping state when the rotary member is rotated by a rotative drive mechanism.

The switching step may comprise the step of controlling first and second driving mechanisms, which drive the first and second non-rotative movable members, respectively, so as to switch the substrate clamping state to an intermediate state where the substrate is clamped by the clamping members of the first substrate clamping mechanism and the second substrate clamping mechanism when the substrate clamping state is switched between the first clamping state and the second clamping state.

According to further another aspect of the present invention, there is provided a substrate treatment apparatus, which comprises: a substrate rotating member which is rotated about a rotary shaft thereof while holding a substrate; a plurality of clamping members attached to the substrate rotating member, and operative in a substrate clamping state for clamping the substrate and in a substrate unclamping state for unclamping the substrate; and a link mechanism for associating substrate clamping/unclamping motions of the plural clamping members with rotation of the substrate rotating member; wherein the link mechanism comprises a cam member having a cam surface undulated parallel to the rotary shaft and configured as circularly surrounding the rotary shaft of the substrate rotating member, and a movement converting mechanism attached to the substrate rotating member and including a cam follower which moves generally parallel to the rotary shaft while traveling along the cam surface of the cam member in abutment against the cam surface in association with relative, rotation of the cam member with respect to the substrate rotating member, whereby movement of the cam follower is converted into the substrate clamping/unclamping motions of the plural clamping members.

With this arrangement, when the substrate rotating member is rotated about the rotary shaft, the cam follower circularly travels along the cam surface of the cam member in association with the relative rotation of the cam member with respect to the substrate rotating member. As a result, the cam follower moves parallel to the rotary shaft. The movement of the cam follower is converted into the motions of the plural clamping members attached to the substrate rotating member. This simple construction permits the clamping members to clamp and unclamp the substrate, while the substrate is rotated.

The plural clamping members may simultaneously be operative in the substrate clamping state and in the substrate unclamping state. Where the rotation of the substrate rotating member is accelerated or decelerated with all the clamping members kept in the substrate unclamping state, for example, the substrate is rotated relative to the substrate rotating member. Thus, the clamping members can change substrate clamping positions.

However, this arrangement entails abrasion of the clamping members due to sliding contact between the clamping members and the substrate. Therefore, the relative rotation of the substrate with respect to the substrate rotating member is preferably prevented.

A relationship between the cam surface and the cam follower is preferably defined so that at least one pair of clamping members out of the plural clamping members undergo the substrate clamping/unclamping motions with a timing offset.

With this arrangement, the at least one pair of clamping members out of the plural clamping members undergo the substrate clamping/unclamping motions with a timing offset. Therefore, some of the clamping members can be C retracted from a peripheral surface of the substrate, while the substrate is clamped by the other clamping members. Hence, the entire peripheral surface and peripheral edge portion of the substrate can properly be treated with a treatment fluid (a treatment liquid or a treatment gas) by sequentially retracting the plural clamping members from the peripheral surface. In addition, there is no need for rotating the substrate relative to the substrate rotating member, so that the abrasion of the clamping members can be suppressed.

Further, the clamping members may be operative so that the substrate is constantly clamped by some of the clamping members. Thus, the substrate can constantly stably be held during the rotation of the substrate. Where the treatment of a surface of the substrate is performed with a shield plate located adjacent the substrate surface, for example, a spacing between the shield plate and the substrate surface can constantly strictly be controlled. Thus, the quality of the treatment of the substrate can be improved.

Further, the substrate is constantly clamped by some of the clamping members for prevention of the relative rotation of the substrate with respect to the substrate rotating member during the rotation of the substrate, whereby the rotational position of the substrate can easily be controlled.

The substrate treatment apparatus preferably further comprises a mode switching mechanism for switching an operation mode of the link mechanism between an active mode and an inactive mode by changing a distance between the substrate rotating member and the cam surface of the cam member as measured along the rotary shaft.

With this arrangement, the distance between the substrate rotating member and the cam surface of the cam member is changed to bring the cam follower and the cam surface into non-contact relation, to permit the cam follower to travel along the cam surface so as to bring the clamping members into the substrate clamping state and into the substrate unclamping state, or to bring the substrate rotating member and the cam surface into close relation so as to constantly keep the clamping members in the substrate unclamping state. In this manner, the operation mode of the link mechanism can be switched between the active mode in which the substrate clamping/unclamping motions of the clamping members are associated with the rotation of the substrate rotating member and the inactive mode in which the substrate clamping/unclamping motions are not associated with the rotation of the substrate rotating member.

When the substrate is to be loaded onto or unloaded from the substrate rotating member, for example, the clamping members are preferably kept in the substrate unclamping state irrespective of the rotational position of the substrate rotating member. Therefore, the operation mode is switched to the inactive mode. Particularly, when the peripheral edge portion of the substrate held by the substrate rotating member is treated with the treatment fluid, the operation mode of the link mechanism is preferably switched to the active mode to bring the clamping members into the substrate clamping state and into the substrate unclamping state. When the substrate is rotated at a high rotation speed to spin off the treatment liquid from the substrate surface for drying the substrate after the treatment of the substrate with the treatment liquid, the operation mode of the link mechanism is preferably switched to the inactive mode to keep the clamping members in the substrate clamping state.

According to still another aspect of the present invention, there is provided a substrate treatment apparatus, which comprises: a substrate rotating member which are rotated while holding a substrate; a plurality of clamping members attached to the substrate rotating member, and operative in a substrate clamping state for clamping the substrate and in a substrate unclamping state for unclamping the substrate; a link mechanism for associating substrate clamping/unclamping motions of the plural clamping members with rotation of the substrate rotating member, and causing at least one pair of clamping members out of the plural clamping members to undergo the substrate clamping/unclamping motions with a timing offset; and a mode switching mechanism for switching an operation mode of the link mechanism between an active mode and an inactive mode.

The mode switching mechanism is preferably adapted to switch the operation mode of the link mechanism between the active mode in which the plural clamping members are brought into the substrate clamping state and into the substrate unclamping state in association with the rotation of the substrate rotating member and the inactive mode in which the plural clamping members are kept in the substrate clamping state.

With this arrangement, the clamping members undergo the substrate clamping/unclamping motions in the active mode, and are kept in the substrate clamping state in the inactive mode. When a peripheral edge portion of the substrate is treated by supplying a treatment fluid, for example, the operation mode is switched to the active mode. When the treatment liquid is spun off from a surface of the substrate for drying the substrate, the operation mode is switched to the inactive mode. Thus, the peripheral edge portion of the substrate can properly be treated and, in addition, the substrate can stably be held in the drying process.

The mode switching mechanism may be adapted to switch the operation mode of the link mechanism among the active mode in which the plural clamping members are brought into the substrate clamping state and into the substrate unclamping state in association with the rotation of the substrate rotating member, a first inactive mode in which the plural clamping members are kept in the substrate clamping state, and a second inactive mode in which the plural clamping members are kept in the substrate unclamping state.

With this arrangement, when the substrate is treated by supplying the treatment fluid, the operation mode is switched to the active mode. When the rotation of the substrate rotating member is accelerated or decelerated, or when the substrate rotating member is rotated at a high speed for removal of the treatment liquid from the substrate surface, the operation mode is switched to the first inactive mode. Further, when the substrate is rotated relative to the substrate rotating member, or when the substrate is loaded onto or unloaded from the substrate rotating member, the operation mode is switched to the second inactive mode.

In the active mode, the substrate clamping state preferably includes a first substrate clamping state where the substrate is clamped by some of the plural clamping members, a second substrate clamping state where the substrate is clamped by the other clamping members, and an intermediate clamping state where the substrate is clamped by all the plural clamping members when the substrate clamping state is switched between the first substrate clamping state and the second substrate clamping state.

With this arrangement, the substrate clamping state is switched between the first substrate clamping state where the substrate is clamped by some of the plural clamping members and the second substrate clamping state where the substrate is clamped by the other clamping members in the active mode. Thus, when the peripheral edge portion of the substrate is treated with the treatment fluid, for example, the treatment fluid can properly be supplied to the entire peripheral edge portion of the substrate. Further, the substrate clamping state is once switched to the intermediate clamping state where the substrate is clamped by all the plural clamping members, when being switched between the first substrate clamping state and the second substrate clamping state. Hence, there is no possibility that the substrate is unstably held during the switching of the substrate clamping state of the clamping members. When the treatment of the substrate surface is performed with a shield plate located adjacent the substrate surface, for example, a spacing between the shield plate and the substrate can constantly stably be kept during the treatment of the substrate. The intermediate clamping state can assuredly prevent the relative rotation of the substrate with respect to the substrate rotating member. Therefore, the abrasion of the clamping members due to the relative rotation can be suppressed.

The link mechanism preferably comprises a cycle changing mechanism for changing a substrate clamping/unclamping cycle of the plural clamping members in the active mode.

With this arrangement, the substrate clamping/unclamping cycle of the clamping members can be changed, so that the substrate clamping/unclamping motions of the clamping members can be caused at a speed such as not to adversely affect the treatment of the peripheral edge portion of the substrate with the treatment fluid.

Where a cam member having a cam surface rotatable about a rotary shaft as described above and a cam rotative drive mechanism for rotatively driving the cam member for the rotation of the cam surface about the rotary shaft are provided, for example, the cycle changing mechanism may comprise a cam rotation controlling mechanism for controlling the cam rotative drive mechanism to variably control the rotation speed of the cam member.

The substrate treatment apparatus preferably further comprises an etching liquid supply mechanism for supplying an etching liquid to the peripheral edge portion of the substrate held by the substrate rotating member.

With this arrangement, the peripheral edge portion of the substrate can be subjected to an etching process or a cleaning process.

According to further another aspect of the present invention, there is provided a substrate treatment method, which comprises the steps of: rotating a substrate while holding the substrate by a substrate rotating member; associating substrate clamping/unclamping motions of a plurality of clamping members attached to the substrate rotating member with rotation of the substrate rotating member, and causing at least one pair of clamping members out of the plural clamping members to undergo the substrate clamping/unclamping motions with a timing offset; and switching an operation mode between an active mode in which the substrate clamping/unclamping motions of the plural clamping members are associated with the rotation of the substrate rotating member and an inactive mode in which the substrate clamping/unclamping motions are not associated with the rotation of the substrate rotating member.

The foregoing and other objects, features and effects of the present invention will become more apparent from the following description of the preferred embodiments with reference to the attached drawings.

DESCRIPTION OF THE PREFERRED EMBODIMENTS

Figure 1:
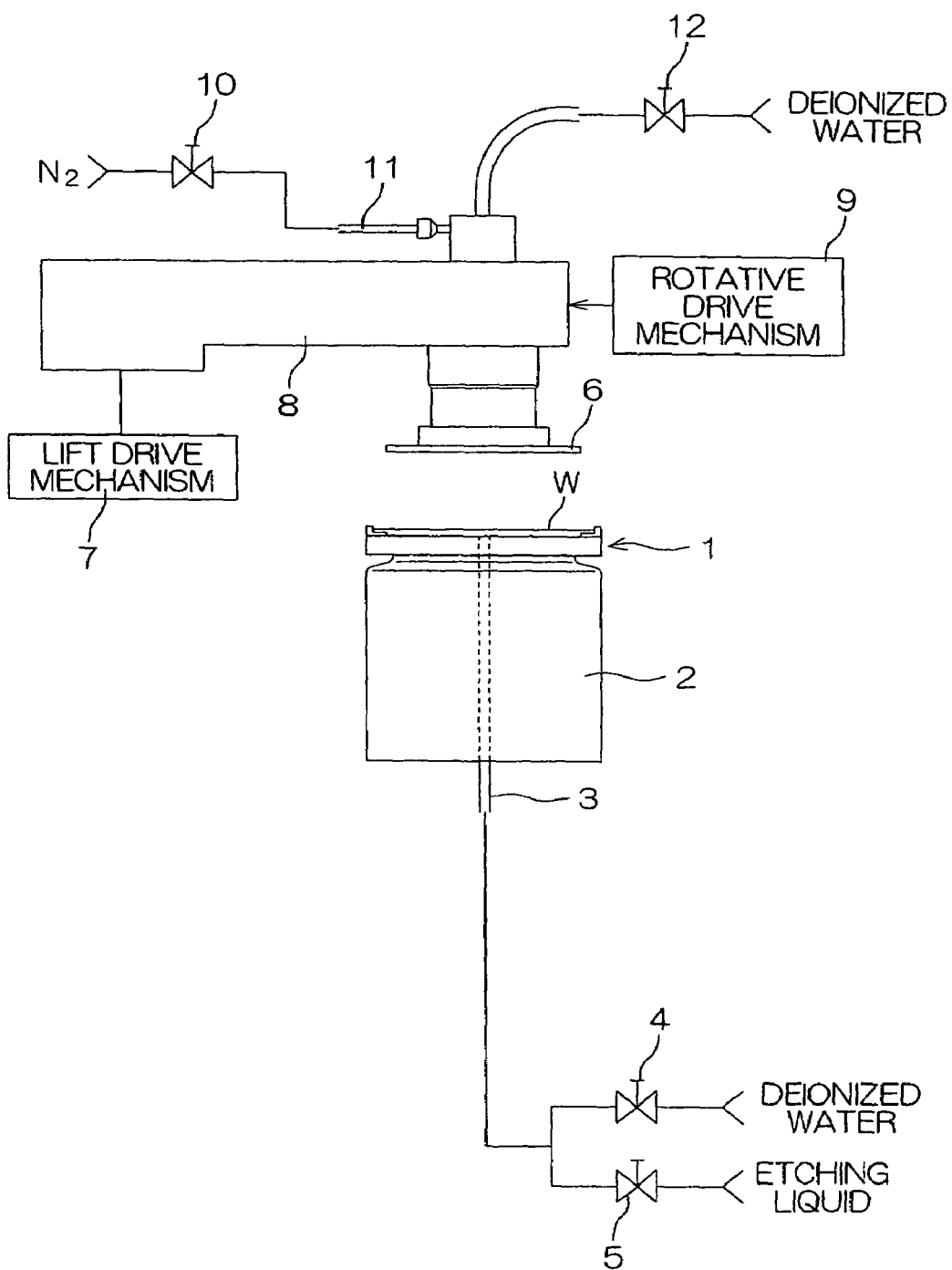
FIG. 1 is a schematic diagram for explaining the construction of a substrate treatment apparatus according to one embodiment of the present invention.

FIG. 1 is a schematic diagram for explaining the construction of a substrate treatment apparatus according to one embodiment of the present invention. The substrate treatment apparatus is capable of treating a semiconductor. wafer W as a generally round substrate (hereinafter referred to simply as "wafer") formed with a thin film for simultaneously removing portions of the thin film present on a rear surface of the wafer W, a peripheral edge portion of a front surface of the wafer W and a peripheral surface of the wafer W. The substrate treatment apparatus includes a spin chuck 1 provided in a treatment cup (not shown) for horizontally holding the wafer W with the rear surface of the wafer W facing downward and rotating the wafer W thus held about an axis vertically extending through a center portion of the wafer W.

The spin chuck 1 is coupled to a rotation shaft (drive shaft) of a motor 2 as a rotative drive mechanism for rotation thereof. The rotation shaft has a hollow inside in which a treatment liquid supply pipe 3 is inserted for supplying deionized water or an etching liquid. The treatment liquid supply pipe 3 is connected to a center nozzle (fixed nozzle) having an outlet port which is located adjacent the center of the lower surface of the wafer W held by the spin chuck 1. Therefore, the etching liquid or deionized water can be supplied toward the lower surface of the wafer W from the outlet port of the center nozzle.

The etching liquid or deionized water is supplied to the treatment liquid supply pipe 3 through a deionized water supply valve 4 connected to a deionized water supply source or through an etching liquid supply valve 5 connected to an etching liquid supply source when required.

The etching liquid to be employed is determined depending on the type of the thin film to be removed from the surface (the upper or lower surface) of the wafer W. Where a metal film such as a thin copper film is removed from the lower surface of the wafer W, for example, a mixture of hydrochloric acid and hydrogen peroxide aqueous solution, a mixture of hydrofluoric acid and hydrogen peroxide aqueous solution or a mixture of hydrofluoric acid and nitric acid is used as the etching liquid. Where a polysilicon film, an amorphous silicon film or a silicon oxide film is removed from the wafer W, for example, a mixture of hydrofluoric acid and nitric acid is used as the etching liquid. Where an oxide film is removed from the wafer W, for example, dilute hydrofluoric acid is used as the etching liquid.

Though not shown, a scan nozzle may further be provided, which is reciprocally movable between an upper position above the wafer W and a retracted position apart from the upper position for supplying the etching liquid or deionized water toward the upper surface of the wafer W. The scan nozzle is used for treatment of the entire upper surface of the wafer W.

A disk-shaped shield plate 6 is horizontally disposed above the spin chuck 1 in opposed relation to the wafer W held by the spin chuck 1. The shield plate 6 is dimensioned so as to cover substantially the entire upper surface of the wafer W, and is attached to a distal end portion of an arm 8 coupled to a lift drive mechanism 7 rotatably about a vertical axis.

The shield plate 6 can be moved up and down with respect to the spin chuck 1 by the lift drive mechanism 7. Further, the shield plate 6 can be rotated about a rotation axis thereof aligned with the rotation axis of the spin chuck 1 by a rotative drive mechanism 9. Nitrogen gas as an inert gas can be supplied to a space between the shield plate 6 and the wafer W. Nitrogen gas is introduced from a nitrogen gas supply valve 10 through a nitrogen gas supply pipe 11 to a nitrogen gas outlet port (not shown) provided in a center portion of a lower surface of the shield plate 6. As required, deionized water supplied from a deionized water supply valve 12 or any other treatment liquid may be supplied to the upper surface of the wafer W from a nozzle provided at the center of the lower surface of the shield plate 6.

Figure 2:
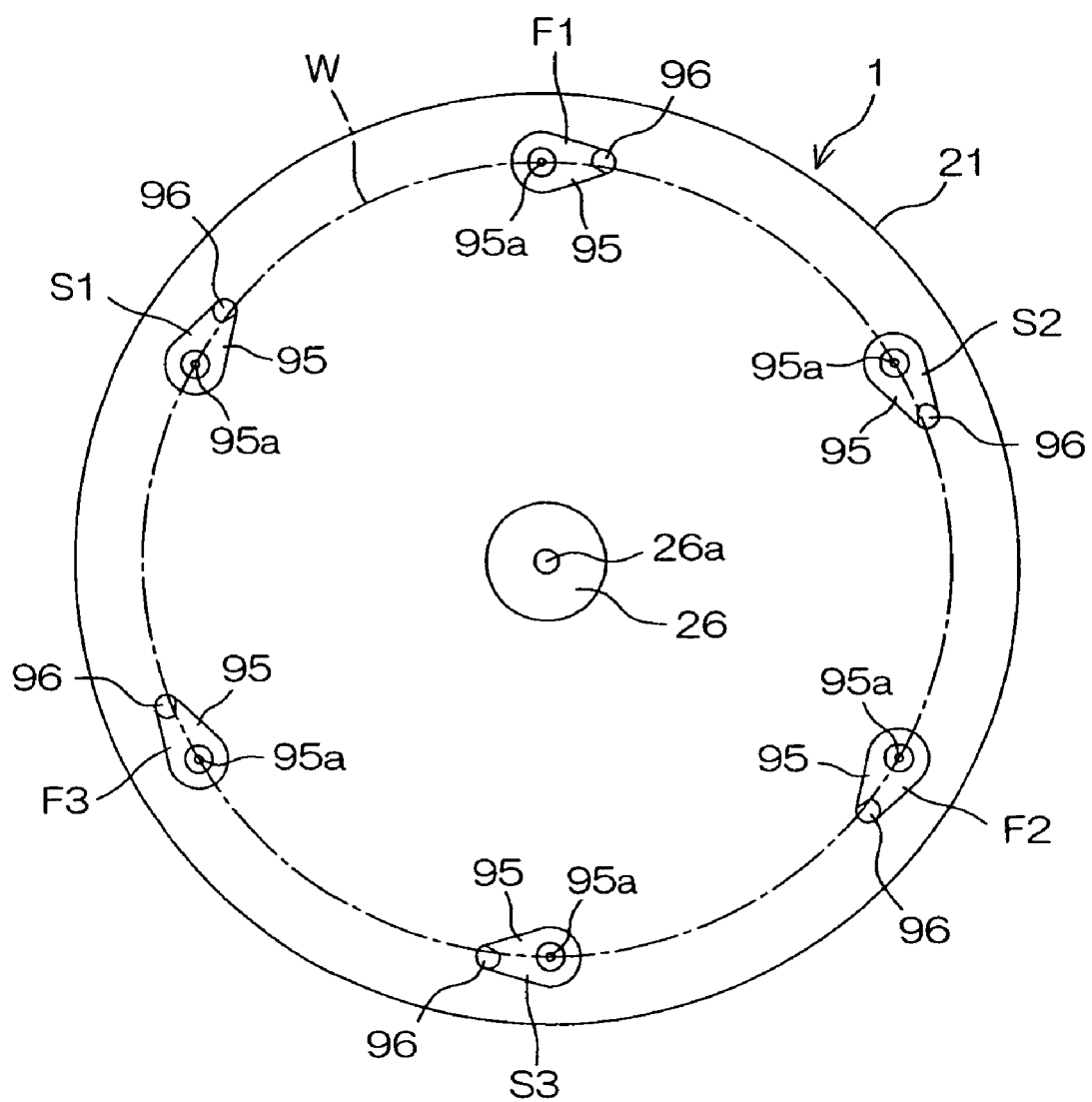
FIG. 2 is a plan view of a spin chuck provided in the substrate treatment apparatus.

FIG. 2 is a plane view of the spin chuck 1. The spin chuck 1 includes a disk-shaped spin base 21 and a plurality of clamping members (six clamping members F1 to F3 and S1 to S3 in this embodiment) generally equiangularly disposed in a peripheral edge portion of the spin base 21 on an upper surface of the spin base 21. Of these clamping members, three alternate clamping members F1 to F3 circumferentially disposed constitute a first clamping member set, and are operatively associated with each other to clamp and unclamp the wafer W. The other three clamping members S1 to S3 constitute a second clamping member set, and are operatively associated with each other to clamp and unclamp the wafer W.

The clamping members F1 to F3 of the first clamping member set (first substrate clamping mechanism) are operable independently of the clamping members S1 to S3 of the second clamping member set (second substrate clamping mechanism). That is, when the clamping members F1 to F3 clamp the wafer W at circumferential positions of the wafer W spaced at an angular interval of about 120 degrees, the clamping members S1 to S3 may unclamp the wafer W. Alternatively, the clamping members S1 to S3 may clamp the wafer W in abutment against three circumferential positions of the wafer W spaced at an angular interval of about 120 degrees, when the clamping members F1 to F3 unclamp the wafer W. Further, the wafer W may be clamped by all the clamping members F1 to F3 and S1 to S3. In this case, the wafer W is clamped at six circumferential positions of the wafer W spaced at an angular interval of about 60 degrees.

Figure 3:
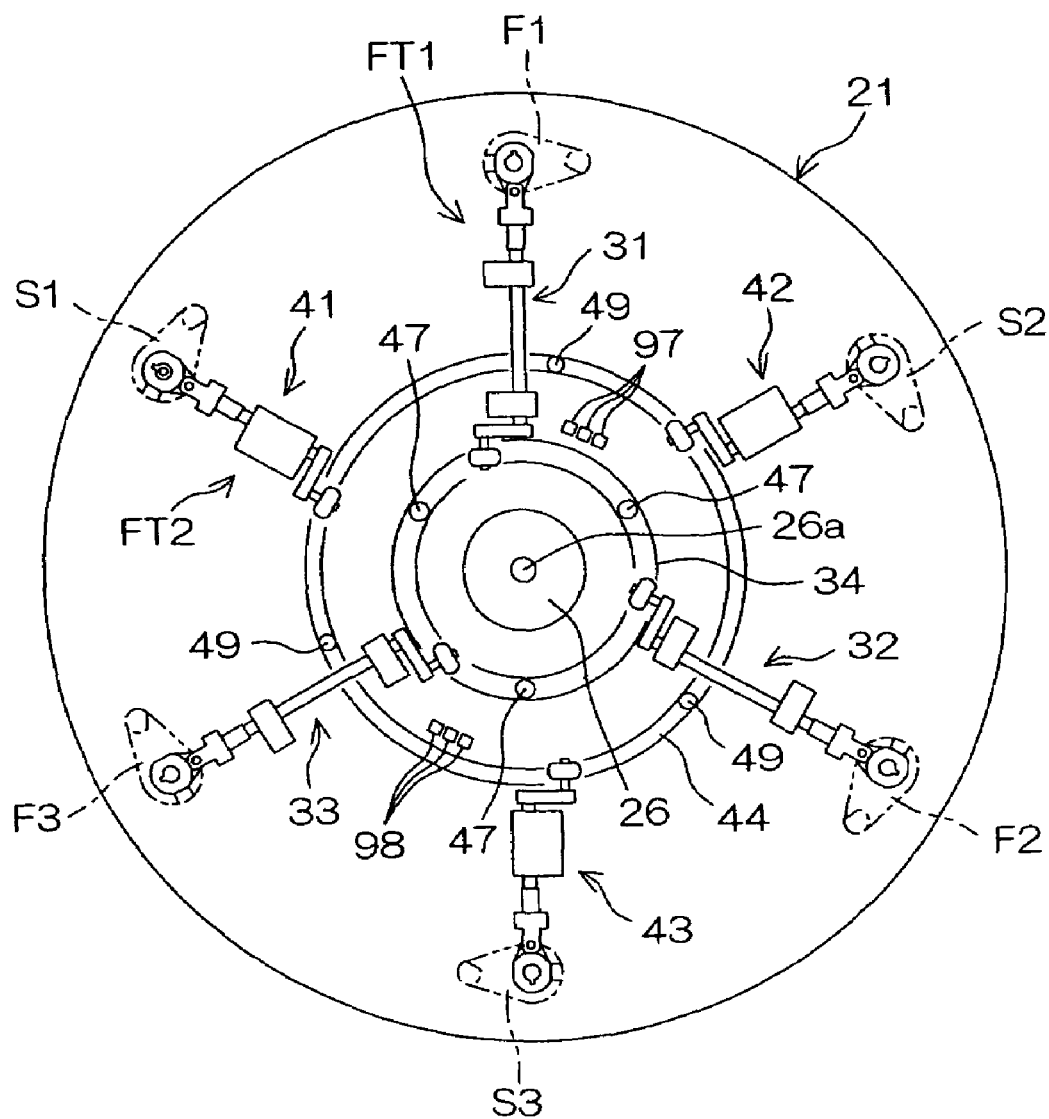
FIG. 3 is a plan view for explaining the arrangement of movement converting mechanisms provided in a spin base of the spin chuck.

FIG. 3 is a plan view for explaining the arrangement of movement converting mechanisms provided in the spin base 21. The spin base 21 includes a first movement converting mechanism FT1 for operating the clamping members F1, F2, F3 in association with each other, and a second movement converting mechanism FT2 for operating the clamping members S1, S2, S3 in association with each other. The movement converting mechanism FT1 includes link mechanisms 31, 32 and 33 for operating the clamping members F1, F2 and F3, respectively, and a first link ring 34 for linking the link mechanisms 31 to 33. Similarly, the second movement converting mechanism FT2 includes link mechanisms 41, 42 and 43 for operating the clamping members S1, S2 and S3, respectively, and a second link ring 44 for linking the link mechanisms 41 to 43.

The first link ring 34 and the second link ring 44 are generally annular members disposed coaxially with a rotation axis of the spin base 21. The second link ring 44 is disposed outwardly of the first link ring 34. The first and second link rings 34, 44 are movable up and down along the rotation axis of the spin base 21. The clamping members F1 to F3 can be operated by moving up and down the first link ring 34, while the clamping members S1 to S3 can be operated by moving up and down the second link ring 44.

Figure 4:
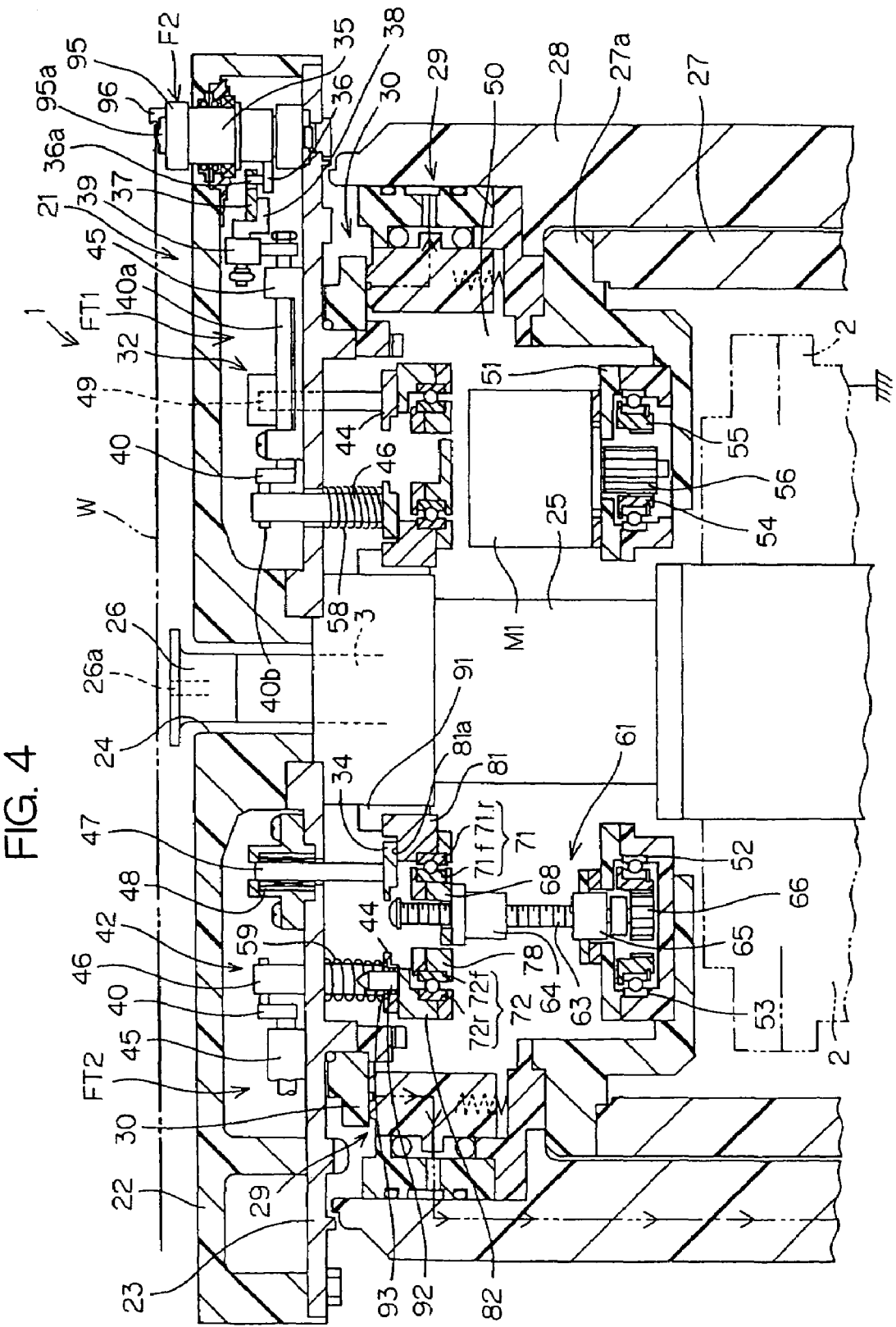
FIG. 4 is a sectional view (taken along a line IV-IV in FIG. 5) for explaining a construction associated with the spin chuck.

FIG. 4 is a sectional view (taken along a line IV-IV n FIG. 5) for explaining a construction associated with he spin chuck 1. The spin base 21 includes an upper plate 22 and a lower plate 23 fixed to each other by bolts. A space for accommodating the first and second movement converting mechanisms FT1, FT2 is defined between the upper plate 22 and the lower plate 23. A through-hole 24 is formed in center portions of the upper and lower plates 22, 23 as extending through the spin base 21. The treatment liquid supply pipe 3 extends through the through-hole 24 and further through a rotary shaft 25 of the spin chuck 1. The center nozzle 26, which has the outlet port 26a to be opposed to the center of the lower surface of the wafer W held by the spin chuck 1, is fixed to an upper end of the treatment liquid supply pipe 3.

The rotary shaft 25 is unitary with the drive shaft of the motor 2 and extends through the motor 2. The motor 2 is surrounded by a casing 27, which is further surrounded by a cylindrical cover member 28. The cover member 28 has an upper edge located in the vicinity of a lower surface of the spin base 21, and a seal mechanism 29 is provided on an interior surface portion of the cover member 28 adjacent to the upper edge of the cover member 28. The seal mechanism 29 is kept in sliding contact with a seal member 30 fixed to the lower surface of the spin base 21, and a mechanical member accommodating space 50 is defined between the seal mechanism 29 and the rotary shaft 25 as being isolated from an external environment.

In the mechanical member accommodating space 50, a generally annular gear case 51 is attached to an upper cover 27a of the casing 27 as surrounding the rotary shaft 25. A first motor M1 and a second motor M2 are fixed onto the gear case 51 in symmetrical relation about the rotary shaft 25 as shown in plan in FIG. 5.

As shown in FIG. 4, bearings 52 and 53 are respectively press-fitted on interior surfaces of inner and outer peripheral walls of the gear case 51. The bearings 52, 53 are disposed coaxially with the rotary shaft 25. A first ring-shaped gear 54 is fixed to a rotary ring of the inner bearing 52 as surrounding the rotary shaft 25, while a second ring-shaped gear 55 is fixed to a rotary ring of the outer bearing 53 as surrounding the rotary shaft 25. Therefore, the first gear 54 and the second gear 55 are rotatable coaxially about the rotary shaft 25 in the gear case 51, and the second gear 55 is disposed outwardly of the first gear 54. The first gear 54 has gear teeth provided on an outer peripheral surface thereof, while the second gear 55 has gear teeth provided on an inner peripheral surface thereof.

Figure 5:
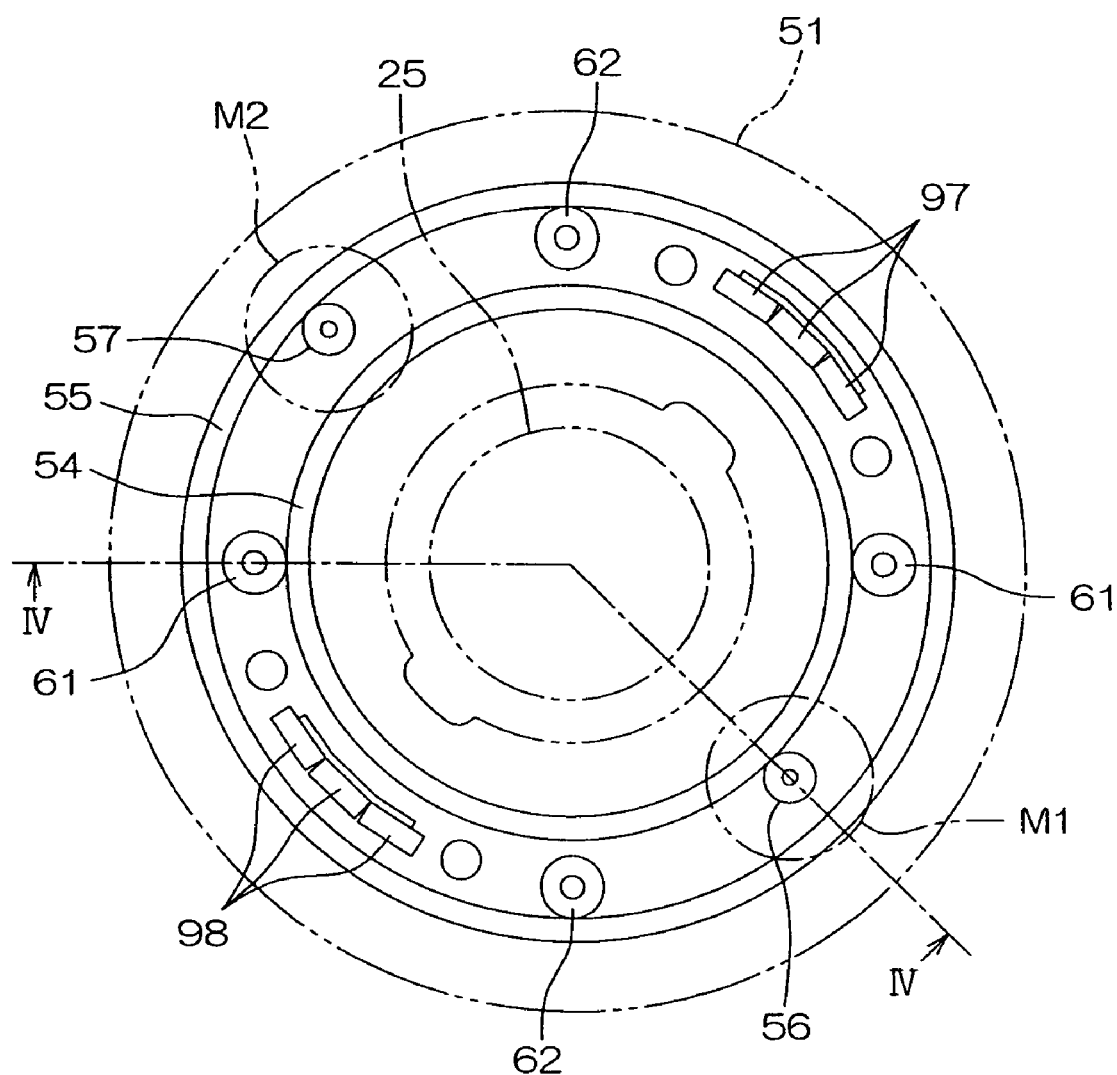
FIG. 5 is a plan view for explaining the construction of a drive mechanism for driving clamping members.

A pinion 56 fixed to a drive shaft of the first motor M1 is disposed between the first gear 54 and the second gear 55, and meshed with the first gear 54 disposed inwardly thereof. Similarly, a pinion 57 fixed to a drive shaft of the second motor M2 is disposed between the first gear 54 and the second gear 55, and meshed with the second gear 55 disposed outwardly thereof as shown in FIG. 5.

A pair of first ball thread mechanisms 61, 61 are disposed in opposed relation with the rotary shaft 25 interposed therebetween (i.e., laterally of the rotary shaft 25) apart from the motors M1, M2 on the gear case 51. Further, a pair of second ball thread mechanisms 62, 62 are disposed in opposed relation with the rotary shaft 25 interposed therebetween (i.e., laterally of the rotary shaft 25) apart from the motors M1, M2 and the first ball thread mechanisms 61, 61 on the gear case 51.

As shown in FIG. 4, the first ball thread mechanisms 61, 61 each include a thread shaft 63 disposed parallel to the rotary shaft 25 and a ball nut 64 threadingly engaged with the thread shaft 63. The thread shaft 63 is attached to an upper cover of the gear case 51 via a bearing 65, and a lower end portion thereof extends into the gear case 51. A gear 66 is fixed to the lower end of the thread shaft 63. The gear 66 is disposed between the first gear 54 and the second gear 55, and meshed with the first gear 54 disposed inwardly thereof.

On the other hand, a first non-rotative movable member 68 is attached to the ball nut 64. The first on-rotative movable member 68 is an annular member surrounding the rotary shaft 25, and a stationary ring 71f of a first bearing 71 disposed around the rotary shaft 25 is fixed to an inner peripheral surface of the first non-rotative movable member 68. A rotary ring 71r of the first bearing 71 is disposed inwardly of the stationary ring 71f around the rotary shaft 25. The rotary ring 71r is fixed to an outer peripheral surface of a first annular rotative movable member 81 surrounding the rotary shaft 25. The first rotative movable member 81 is engaged with guide rails 91 projecting from an outer peripheral surface of the rotary shaft 25. The guide rails 91 extend parallel to the rotary shaft 25. Therefore, the first rotative movable member 81 is coupled to the rotary shaft 25 so as to be guidedly movable along the rotary shaft 25.

When the first motor M1 is driven to rotate the pinion 56, the rotation of the pinion 56 is transmitted to the first gear 54. Thus, the gears 66 each meshed with the first gear 54 are rotated to rotate the thread shafts 63 of the ball thread mechanisms 61, 61. Thus, the ball nuts 64 and the first non-rotative movable member 68 coupled to the ball nuts 64 are moved up and down along the rotary shaft 25. The first rotative movable member 81 to be rotated together with the rotary shaft 25 is coupled to the first non-rotative movable member 68 via the bearing 71. Therefore, the first rotative movable member 81 can be moved up and down along the guide rails 91 by the up and down movement of the first non-rotative movable member 68 even during the rotation of the rotary shaft 25.

Figure 6:
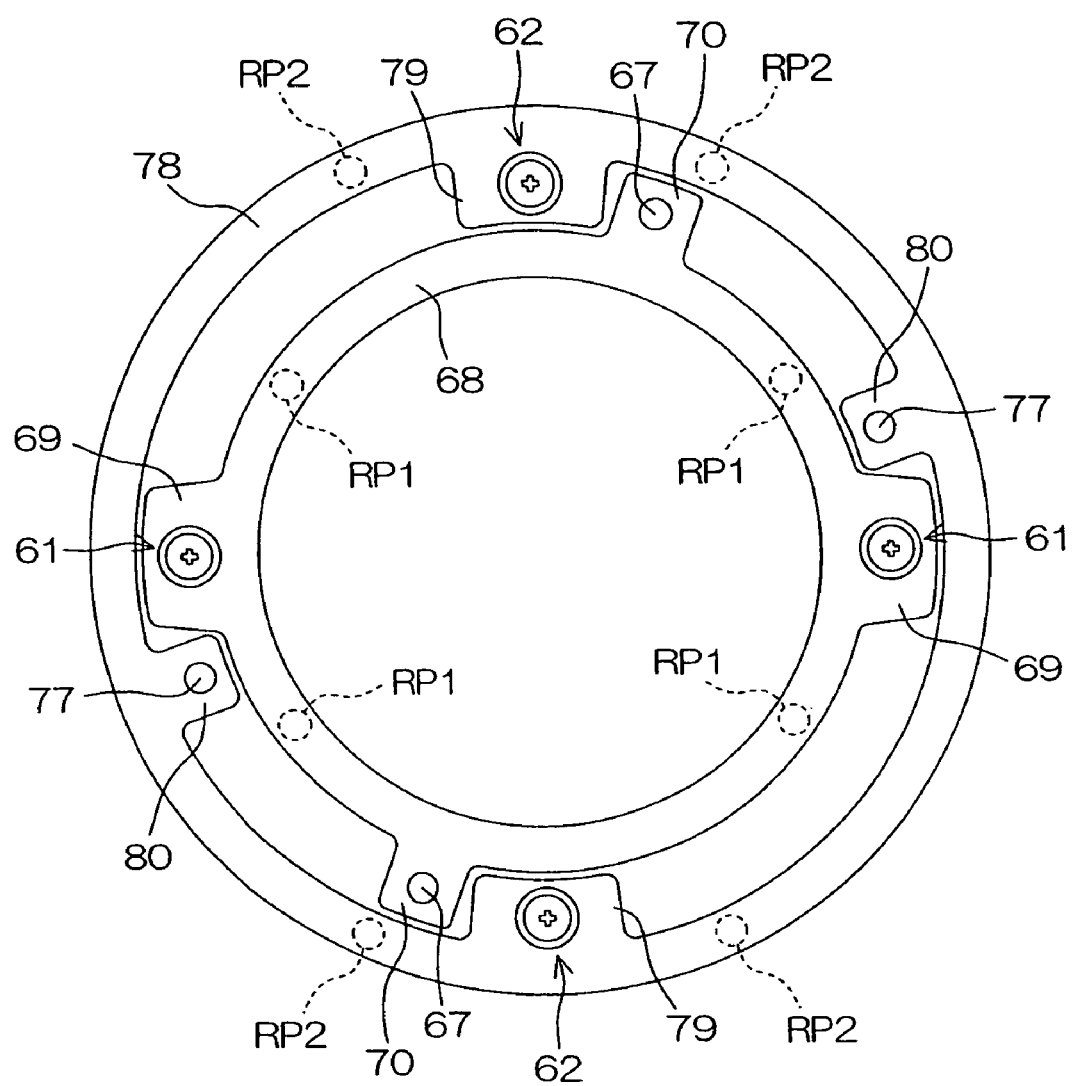
FIG. 6 is a plan view for explaining the constructions of first and second non-rotative movable members driven by the drive mechanism.

As shown in FIG. 6, a second ring-shaped non-rotative movable member 78 is disposed outwardly of the first ring-shaped non-rotative movable member 68 which is moved up and down by the first ball thread mechanisms 61, 61. The first non-rotative movable member 68 has a pair of projections 69, 69 respectively projecting radially outwardly in association with the ball nuts 64 of the pair of first ball thread mechanisms 61, 61, and another pair of projections 70, 70 respectively projecting radially outwardly from positions thereof circumferentially offset from the projections 69, 69. Guide shafts 67, 67 extending along the rotary shaft 25 are respectively coupled to the projections 70, 70. The guide shafts 67, 67 are vertically guided along the rotary shaft 25. Thus, the first non-rotative movable member 68 is movable up and down along the rotary shaft 25, while being kept horizontally.

On the other hand, the second ring-shaped non-rotative movable member 78 has a pair of projections 79, 79 respectively projecting radially inwardly in association with the second ball thread mechanisms 62, 62. The second ball thread mechanisms 62, 62 each have substantially the same construction as the first ball thread mechanism 61, except that a gear provided at a lower end of a thread shaft thereof is inwardly meshed with the second gear 55 between the first gear 54 and the second gear 55 within the gear case 51. Therefore, ball nuts of the second ball thread mechanisms 62, 62 can be moved up and down by driving the pinion 57 meshed with the second gear 55 by the second motor M2. These ball nuts are coupled to the projections 79, 79 of the second non-rotative movable member 78.

The second non-rotative movable member 78 further has another pair of projections 80, 80 respectively projecting radially inwardly from positions thereof circumferentially offset from the projections 79, 79. Guide shafts 77, 77 are respectively coupled to the projections 80, 80. The guide shafts 77, 77 are vertically guided along the rotary shaft 25. Thus, the second non-rotative movable member 78 is vertically movable up and down along the rotary shaft 25, while being kept horizontally.

As shown in FIG. 4, a stationary ring 72f of a second bearing 72 surrounding the rotary shaft 25 is fixed to an outer peripheral surface of the second non-rotative movable member 78. A rotary ring 72r of the second bearing 72 is fixed to an inner peripheral surface of a second ring-shaped rotative movable member 82 surrounding the rotary shaft 25. Guide pins 92 are implanted in the second rotative movable member 82 as vertically projecting from an upper surface of the second rotative movable member 82 along the rotary shaft 25.

When the second non-rotative movable member 78 is moved up and down together with the nuts of the second ball thread mechanisms 62, 62, the second rotative movable member 82 coupled to the second bearing 72 is moved up and down simultaneously with the second non-rotative movable member 78. As will be described later, the second rotative movable member 82 is rotated together with the spin base 21 (i.e., together with the rotary shaft 25). Even during the rotation of the second rotative movable member 82, the second rotative movable member 82 can be moved up and down by driving forces received from the second ball thread mechanisms 62.

Figure 7:
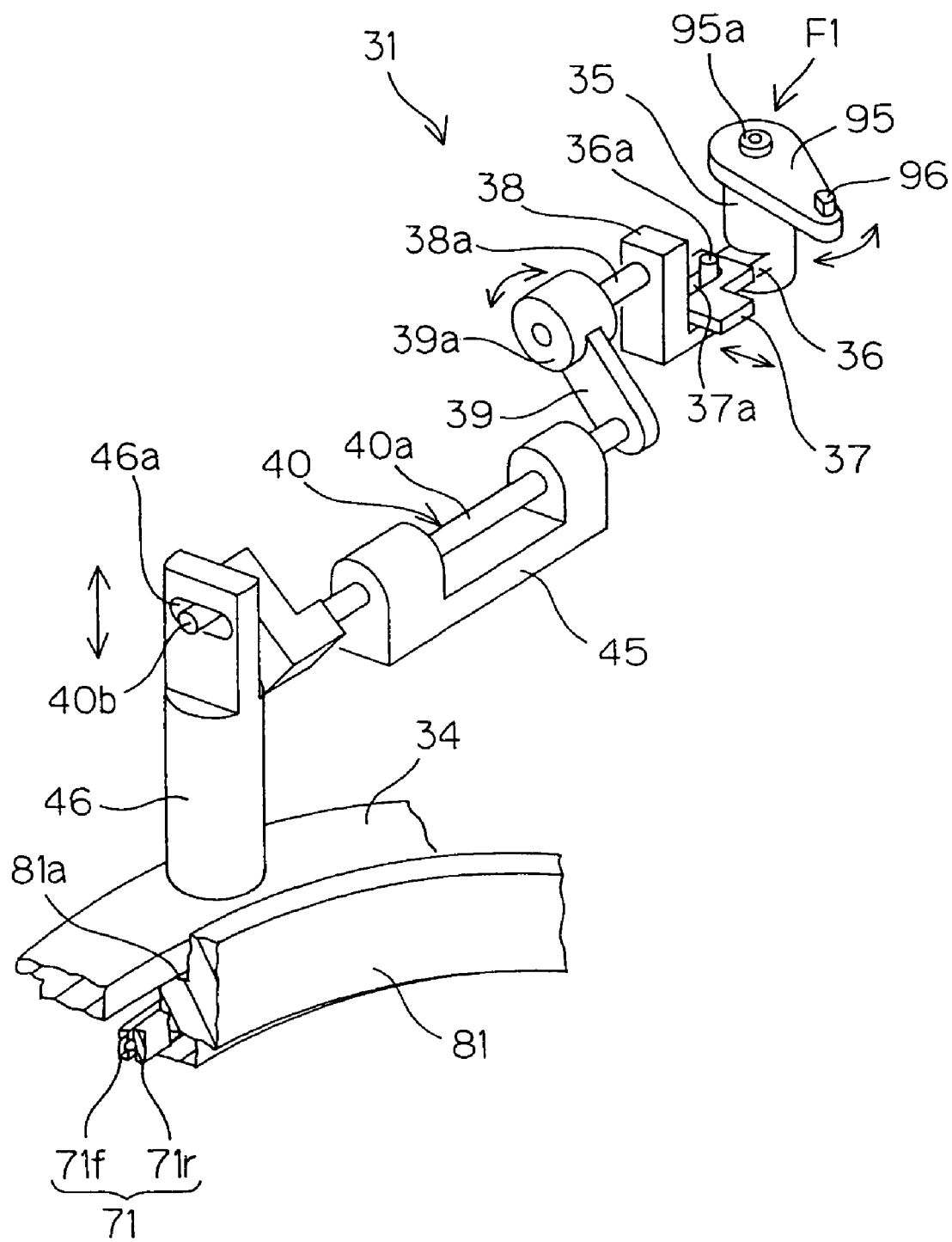
FIG. 7 is a perspective view for explaining the construction of the movement converting mechanism for converting a driving force transmitted from the first non-rotative movable member into the movements of the clamping members.

FIG. 7 is a perspective view for explaining the construction of the link mechanism 31 of the first movement converting mechanism FT1. The clamping member F1 is fixed to an upper end of a rotatable vertical shaft 35, and includes a plate portion 95 having a generally wedge shape as seen in plan and an abutment portion 96 (substrate clamp pin) provided upright on the plate portion 95 apart from a rotation axis of the shaft 35 so as to be brought into opposed relation to the peripheral surface of the wafer W. A wafer support portion 95a projects from a rotation center of the plate portion 95. The wafer support portion 95a is located in association with a lower surface portion of the wafer W slightly inwardly spaced from the peripheral edge of the wafer W to support a peripheral edge portion of the lower surface of the wafer W from a lower side.

A lever 36 is fixed to the shaft 35 as projecting laterally below the clamping member F1, and a pin 36a is provided on an end portion of the lever 36 as extending vertically upward. The link mechanism 31 includes the lever 36, a rocking plate 37 having an elongate hole 37a engaged with the lever 36, a crank member 38 coupled to the rocking plate 37, a lever 39 having a bearing member 39a supporting a shaft 38a of the crank member 38 pivotally about an axis thereof, a crank member 40 coupled to the lever 39, a bearing member 45 pivotally supporting a shaft 40a of the crank member 40, and a lift member 46 having an elongate hole 46a engaged with a shaft 40b of the crank member 40. A lower end of the lift member 46 is connected to an upper surface of the first link ring 34. The first link ring 34 is disposed in engagement with an outer circumferential shoulder 81a of the first rotative movable member 81.

As shown in FIG. 4, a plurality of guide shafts 47 (three guide shafts in this embodiment) are equiangularly provided on the upper surface of the first link ring 34 as extending vertically upward along the rotary shaft 25. The guide shafts 47 extend through the lower plate 23 of the spin base 21, and are held in an upwardly and downwardly movable manner by bushes 48 provided within the spin base 21.

Therefore, the first link ring 34 is movable up and down along the rotary shaft 25 together with the first rotative movable member 81, while being kept horizontally. As the lift member 46 is correspondingly moved up and down, the crank member 40 is rotated about the shaft 40a supported by the bearing member 45. The elongate hole 46a formed in the lift member 46 extends horizontally, so that the up and down movement of the lift member 46 is smoothly converted into a pivotal movement of the crank member 40.

The pivotal movement of the crank member 40 pivots the lever 39, so that the crank member 38 supported by the bearing member 39a of the lever 39 is moved circumferentially of the spin base 21 as seen in plan. The elongate hole 37a formed in the rocking plate 37 extends radially of the spin base 21, and the pin 36a is vertically engaged with the elongate hole 37a. Therefore, the rocking plate 37 is rocked slightly up and down with respect to the spin base 21, while being kept horizontally. Since the pin 36a is moved circumferentially of the spin base 21 by the rocking of the rocking plate 37, the clamping member F1 is pivoted about the shaft 35 by the lever 36. Thus, the link mechanism 31 converts the up and down movement of the first rotative movable member 81 into the pivotal movement of the clamping member F1.

The link mechanisms 32, 33 each have the same construction as the link mechanism 31. These link mechanisms 31, 32, 33 are operative in association with each other by the operation of the first link ring 34.

The link mechanisms 41, 42, 43 for the clamping members S1, S2, S3 each have substantially the same construction as the link mechanism 31 and, therefore, no explanation will be given thereto. However, the second link ring 44 is disposed radially outwardly of the first link ring 34 around the spin base 21. Therefore, the shaft 40a of the crank member 40 of the link mechanism 41 to 43 has a smaller length than that of the link mechanism 31, so that the bearing member 45 is correspondingly slightly different in structure. In FIG. 3, a reference numeral 49 denotes guide shafts provided upright on the second link ring 44. The guide shafts 49 have the same function as the guide shafts 47 provided upright on the first link ring 34, and are coupled to the spin base 21 in an upwardly and downwardly movable manner like the guide shafts 47.

As shown in FIG. 4, a compression coil spring 58 is wound around the lift member 46 of each of the link mechanisms 31, 32, 33 between a lower surface of the lower plate 23 of the spin base 21 and the upper surface of the first link ring 34. Thus, the first link ring 34 is biased downward. As a result, the clamping member F1 is biased in a closing direction with the abutment portion 96 thereof directing inwardly radially of the spin base 21.

Similarly, a compression coil spring 59 is wound around the lift member 46 of each of the link mechanisms 41, 42, 43 between the lower surface of the lower plate 23 of the spin base 21 and an upper surface of the second link ring 44. Therefore, the clamping members F1, F2, F3, S1, S2, S3 are each biased in a closing direction with the abutment portions 96 thereof directing inwardly radially of the spin base 21. Where the ball nuts 64 of the first and second ball thread mechanisms 61, 62 are sufficiently lowered, the wafer W is clamped by the clamping members F1 to F3 and S1 to S3 by spring forces of the compression coil springs 58, 59. Since the wafer W is resiliently clamped by utilizing the resilient forces of the compression coil springs 58, 59, a damage to the wafer W can advantageously be suppressed.

As shown in FIG. 3, sensor sections 97, 98 for detecting the heights of the first link ring 34 and the second link ring 44, respectively, are provided for detection of a wafer clamping state effected by the clamping members F1 to F3 and S1 to S3. For example, the sensor sections 97, 98 each have three sensors. These sensors are capable of detecting the first link ring 34 and the second link ring 44 at a first height which corresponds to a state where the abutment portions 96 of the clamping members F1 to F3, S1 to S3 are retracted from the peripheral surface of the wafer W, at a second height which corresponds to a state where the clamping members F1 to F3, S1 to S3 clamp the wafer W in abutment against the peripheral surface of the wafer W, and at a third height which corresponds to a state where the abutment portions 96 of the clamping members F1 to F3, S1 to S3 are located inwardly of a wafer peripheral surface position radially of the spin base 21 in the absence of the wafer W on the spin base 21. The first height is the highest, and the second height is the second highest. The third height is the lowest.

The wafer clamping state and wafer unclamping state of the clamping members F1 to F3 and S1 to S3 and the absence of the wafer W on the spin base 21 are detected on the basis of outputs from the sensor sections 97, 98.

Sensors for detecting the heights of the first and second non-rotative movable members 68, 78 may additionally be provided to check if the first and second link rings 34, 44 are moved up and down in association with the up and down movements of the ball nuts 64 of the first and second ball thread mechanisms 61, 62.

Figure 8:
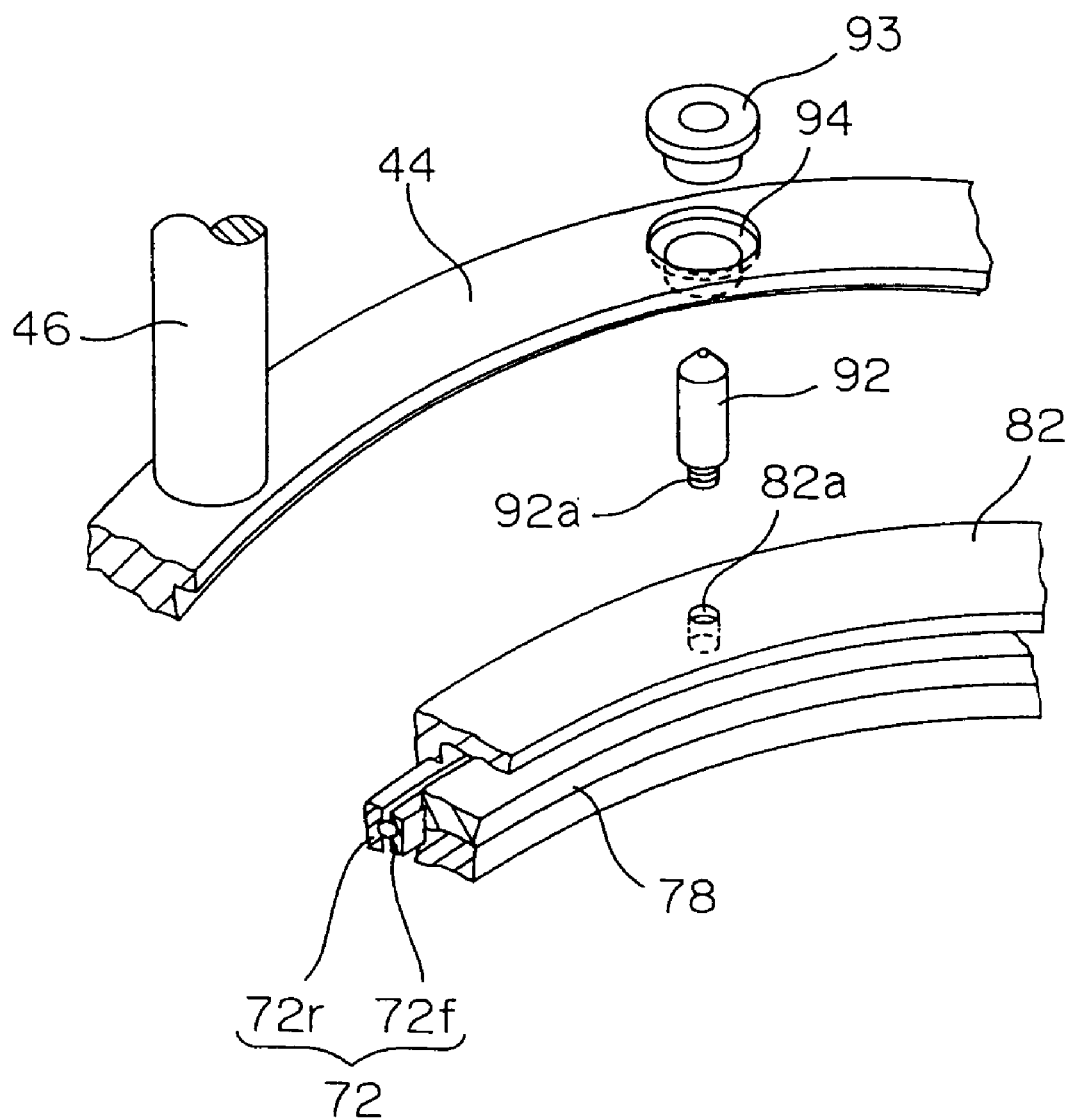
FIG. 8 is a perspective view for explaining the construction of another portion of the movement converting mechanism.

FIG. 8 is an exploded perspective view illustrating an arrangement for coupling the second link ring 44 and the lift member 46 of the link mechanism 41, 42, 43. The three lift members 46 are provided upright on the upper surface of the second link ring 44 in 120-degree spaced relation. Two stepped through-holes 94 are formed at positions offset from the lift members 46 in 180-degree spaced relation on the upper surface of the second link ring 44. Bushes 93 are respectively fitted in the through-holes 94. The guide pins 92 provided upright on the upper surface of the second rotative movable member 82 are respectively inserted through the bushes 93. The guide pins 92 are fixed to the second rotative movable member 82 with lower thread portions 92a thereof threadingly engaged with threaded holes 82a formed in the upper surface of the second rotative movable member 82.

Thus, the guide pins 92 are respectively engaged with the bushes 93, whereby the rotation of the second rotative movable member 82 relative to the second link ring 44 and the lift members 46 (for the link mechanisms 41, 42, 43) is prevented.

Therefore, the lift members 46, the second link ring 44 and the second rotative movable member 82 are moved up and down along the rotary shaft 25 without relative rotation thereof even during the co-rotation with the spin base 21, when the second non-rotative movable member 78 is moved up and down by the second ball thread mechanisms 62.

In this embodiment, the clamping members F1 to F3 and S1 to S3 are composed of an electrically conductive resin (e.g., an electrically conductive PEEK (polyetheretherketone), and components of the first and second movement converting mechanisms FT1, FT2 are composed of an electrically conductive resin or a metal (e.g., stainless steel (SUS) or the like). Further, the lower plate 23 of the spin base 21 is composed of an electrically conductive material (e.g., SiC or aluminum). The rotary shaft 25 connected to the lower plate 23 is composed of a metal such as SUS, and the casing (metal casing) of the motor 2 is grounded.

With this arrangement, a grounding path is established, which extends from the clamping members F1 to F3 and S1 to S3 to the casing of the motor 2 through the first and second movement converting mechanisms FT1, FT2, the lower plate 23 and the rotary shaft 25. Thus, electrostatic charges occurring due to friction between the wafer W and the treatment liquid (etching liquid or deionized water) supplied to the surface of the wafer W can be released, whereby an electrostatic discharge damage to a device formed in the wafer W can be prevented.

Since the removal of the electrostatic charges from the wafer W can be achieved by utilizing the driving mechanisms for the clamping members F1 to F3 and S1 to S3 during a spinning process, easier design and cost reduction can be realized without the need for additionally providing an electrostatic charge remover of discharge type or X-ray type. Where the discharge type electrostatic charge remover is employed, generation of metal particles is problematic. Where the X-ray type electrostatic charge remover is employed, X-ray safeguards are problematic. In contrast, the arrangement according to the present invention is free from these problems.

Figure 9:
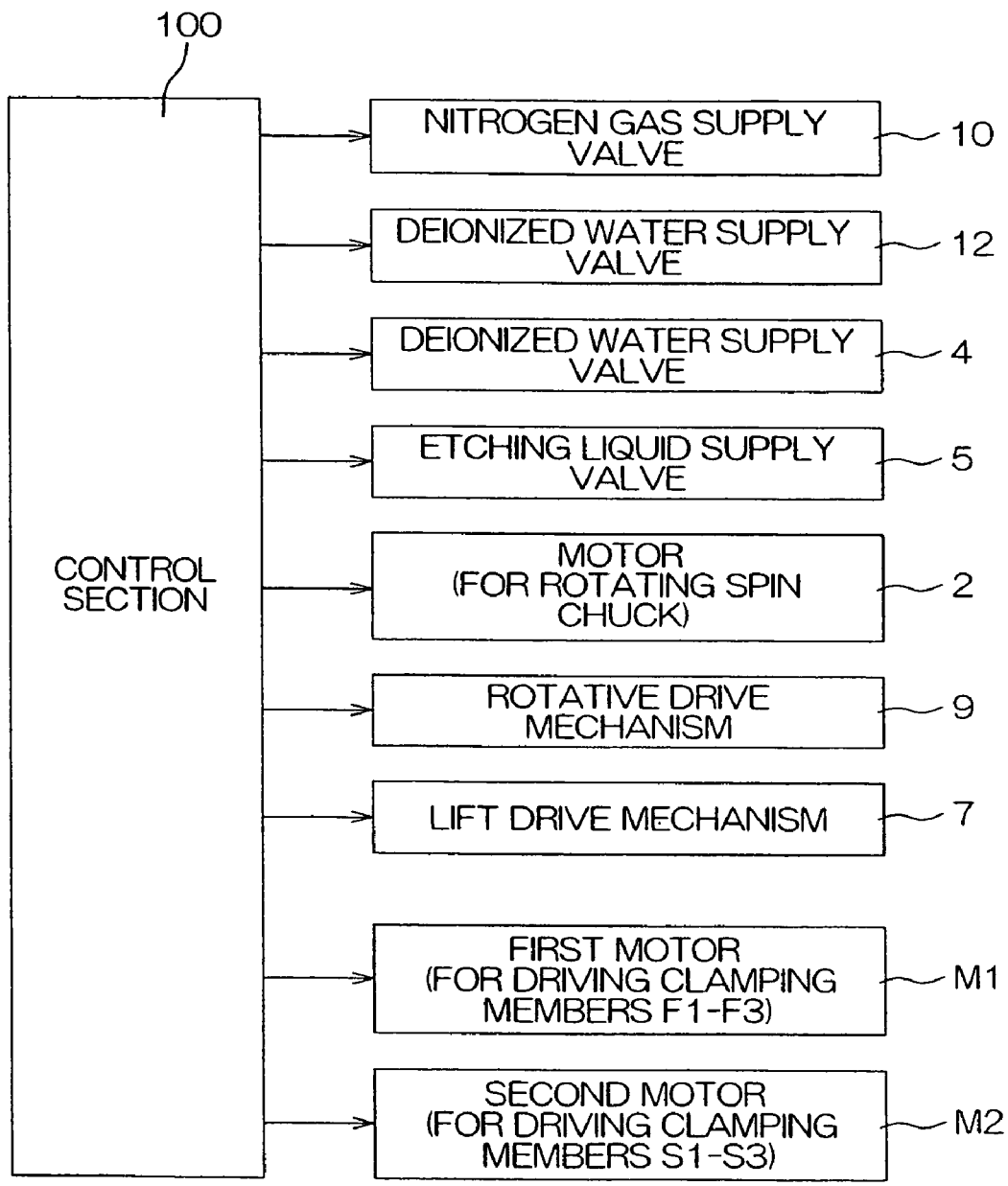
FIG. 9 is a block diagram for explaining the electrical construction of the substrate treatment apparatus.

FIG. 9 is a block diagram for explaining the electrical construction of the substrate treatment apparatus. A control section 100 including a microprocessor and the like controls the first and second motors M1, M2, the motor 2 for rotating the spin chuck 1, the rotative drive mechanism 9 and the lift drive mechanism 7. The control section 100 further controls the opening and closing of the nitrogen gas supply valve 10, the deionized water supply valve 12, the deionized water supply valve 4 and the etching liquid supply valve 5.

When a wafer W is loaded onto the spin chuck 1 by a substrate transport robot not shown, the motor 2 and the rotative drive mechanism 9 are kept in halt under the control of the control section 100. Further, the control section 100 controls the lift drive mechanism 7 to move the shield plate 6 to a retracted position above the spin chuck 1, and the valves 10, 12, 4, 5 are kept closed under the control of the control section 100.

The control section 100 controls the first and second motors M1, M2 to move the first and second link rings 34, 44 to an upper position (at the first height). Thus, the clamping members F1 to F3 and S1 to S3 are opened with the abutment portions 96 retracted radially outwardly of the spin base 21. In this sate, the substrate transport robot places the wafer W on the wafer support portions 95a of the plate portions 95 of the clamping members F1 to F3 and S1 to S3.

In this state, the control section 100 controls, for example, the first motor M1 to drive the first ball thread mechanisms 61 so as to lower the ball nuts 64. Thus, the first rotative movable member 81 is lowered, whereby the first link ring 34 is moved down and the lift members 46 are moved down by the spring forces of the compression coil springs 58 and the gravity. As a result, the clamping members F1 to F3 are pivoted, so that the abutment portions 96 thereof are brought into abutment against the peripheral surface of the wafer W. Thus, the wafer W is clamped by the clamping members F1 to F3. At this time, the clamping members S1 to S3 are kept open (with the abutment portions 96 thereof retracted from the peripheral surface of the wafer W), because the electric motor M2 is not driven.

Thereafter, the control section 100 energizes the motor 2 to rotate the spin chuck 1 (first substrate rotation step, rotation step, and substrate clamping/rotating step) At the same time, the lift drive mechanism 7 is controlled to lower the shield plate 6 to the vicinity of the wafer W, and then the rotative drive mechanism 9 is energized to rotate the shield plate 6 in synchronization with the spin chuck 1.

Subsequently, the control section 100 opens the etching liquid supply valve 5 and the nitrogen gas supply valve 10. Thus, the etching liquid is supplied toward the center of the lower surface of the wafer W from the center nozzle 26 (treatment liquid supply step, treatment fluid supply step, etching liquid supply step). The etching liquid flows radially outwardly over the lower surface of the wafer W and then over the peripheral surface of the wafer W onto the upper surface of the wafer W. The amount of the etching liquid flowing onto the upper surface of the wafer W is controlled by ejecting nitrogen gas from he center of the shield plate 6. As a result, an etching process is performed to etch the entire rear surface of the wafer W, to etch away an unnecessary substance from the peripheral surface of the wafer W, and to etch away an unnecessary substance from the peripheral edge portion of the upper surface of the wafer W.

In the midst of the etching process, the control section 100 drives the electric motor M2 to lower the second link ring 44, while continuously rotating the spin chuck 1. That is, the ball nuts 64 of the ball thread mechanisms 62 are lowered, whereby the second link ring 44 is correspondingly lowered by spring forces of the compression coil springs 59 and the gravity. Thus, the lift members 46 (of the link mechanisms 41, 42, 43) are lowered. Therefore, the clamping members S1 to S3 are pivoted by the operation of the second movement converting mechanism FT2, whereby the wafer W is clamped by the clamping members S1 to S3 with the abutment portions 96 thereof in abutment against the peripheral surface of the wafer W (intermediate state). At this time, the clamping members F1 to F3 keep clamping the wafer W, so that the wafer W is clamped by all the six clamping members F1 to F3 and S1 to S3 (second substrate rotation step).

In this state, the control section 100 further controls the electric motor M1, while continuously rotating the spin chuck 1. That is, the ball nuts 64 of the ball thread mechanisms 61 are lifted, whereby the first link ring 34 is correspondingly lifted against the spring forces of the compressing coil springs 58. As a result, the clamping members F1 to F3 are pivoted by the operation of the first movement converting mechanism FT1, so that the abutment portions 96 thereof are retracted from the peripheral surface of the wafer W. Thus, the clamping members F1 to F3 are opened in the wafer unclamping state (third substrate rotation step, second clamping step). Therefore, the wafer W is thereafter clamped only by the clamping members S1 to S3, while being continuously rotated.

Thus, the wafer clamping state is once switched from a first clamping state where the wafer W is clamped by the clamping members F1 to F3 to the intermediate state where the wafer W is clamped by all the clamping members F1 to F3 and S1 to S3 and then to a second clamping state where the wafer W is clamped by the clamping members S1 to S3 during the rotation of the spin chuck 1 without stopping the rotation of the spin chuck 1 (switching step). Thus, wafer clamping positions on the peripheral surface of the wafer W can be changed during the etching process performed by supplying the etching liquid to the wafer W. Therefore, the entire peripheral surface and peripheral edge portion of the wafer W can properly be treated without reduction in productivity.

In addition, the intermediate state where the wafer is clamped by all the clamping members F1 to F3 and S1 to S3 is present between the first clamping state where the wafer W is clamped by the clamping members F1 to F3 and the second clamping state where the wafer W is clamped by the clamping members S1 to S3. Therefore, the wafer is unlikely to be slid even when the wafer clamping positions are changed. Hence, the apparatus is virtually free from the generation of particles. Further, the wafer W can assuredly be held by the spin chuck 1 even when the wafer clamping positions are changed. Hence, there is no possibility that the wafer W is spun out of the spin chuck 1.

After the wafer W is treated with the etching liquid, the control section 100 closes the etching liquid supply valve 5 and opens the deionized water supply valves 4, 12. Thus, a deionized water rinse process is performed by supplying deionized water to the upper and lower surfaces of the wafer W. By transferring the wafer W between the clamping members F1 to F3 and the clamping members S1 to S3 in the aforesaid manner during the deionized water rinse process, the entire surfaces of the wafer W can uniformly and properly be rinsed.

Thereafter, the control section 100 closes the deionized water supply valves 4, 12, and controls the motor 2 to rotate the spin chuck 1 at a high speed. Thus, a drying process is performed by spinning off water from the upper and lower surfaces of the wafer W. In the drying process, the wafer W is preferably transferred between the clamping members F1 to F3 and the clamping members S1 to S3 in the aforesaid manner by switching the wafer clamping state from the first clamping state where the wafer W is clamped by the clamping members F1 to F3 and unclamped by the clamping members S1 to S3 (first substrate rotation step) through the intermediate state where the wafer W is clamped by all the clamping members F1 to F3 and S1 to S3 (second substrate rotation step) to the second clamping state where the wafer W is clamped by the clamping members S1 to S3 and unclamped by the clamping members F1 to F3 (third substrate rotation step) while continuously rotating the spin chuck 1. Thus, water droplets are prevented from remaining on the portions of the wafer W brought into abutment against the clamping members F1 to F3 and S1 to S3.

In the above explanation, the etching liquid is continuously supplied to the wafer W in the first to third substrate rotation steps in the etching process. However, it is merely necessary to supply the etching liquid to the wafer W at least in the first and third substrate rotation steps for proper treatment of the entire peripheral surface and peripheral edge portion of the wafer W.

After the third substrate rotation step, the wafer W may be once clamped by all the clamping members F1 to F3 and S1 to S3 in the intermediate state, and then subjected again to the respective processes starting from the first substrate rotation step.

Upon completion of the treatment of the wafer W, the abutment portions 96 of the respective clamping members F1 to F3 and S1 to S3 are retracted from the peripheral surface of the wafer W, and then the treated wafer W is unloaded from the spin chuck 1 by the substrate transport robot.

During the transfer of the wafer W between the clamping members F1 to F3 and the clamping members S1 to S3, the control section 100 may control the motor 2 to continuously rotate the spin chuck 1 at a constant rotation speed or, as required, control the motor 2 to change the rotation speed of the spin chuck 1. In either case, the wafer W is once held in the intermediate state for the transfer of the wafer W, so that the wafer W is not relatively rotated with respect to the spin chuck 1. Therefore, the generation of particles can be suppressed without sliding contact between the wafer W and any portion of the spin chuck 1.

Where it is desired to relatively rotate the wafer with respect to the spin chuck 1 when the wafer W is held in one of the first clamping state, the second clamping state and the intermediate state described above, the control section 100 controls the motors M1, M2 to lift the link rings 34, 44, whereby the wafer W is slightly or completely released from the clamping members F1 to F3, S1 to S3 (complete/slight release step). In this state, the control section 100 controls the motor 2 to accelerate or decelerate the rotation of the spin chuck 1 (acceleration/deceleration step), whereby the wafer W is inertially rotated relative to the spin chuck 1. Thereafter, the wafer W is clamped again by the clamping members F1 to F3 and/or S1 to S3 (re-clamping step).

In the above explanation, the wafer W is first clamped by the clamping members F1 to F3, and then transferred to the clamping members S1 to S3. Alternatively, the wafer W may be first clamped by the clamping members S1 to S3, and then transferred to the clamping members F1 to F3.

Figure 10:
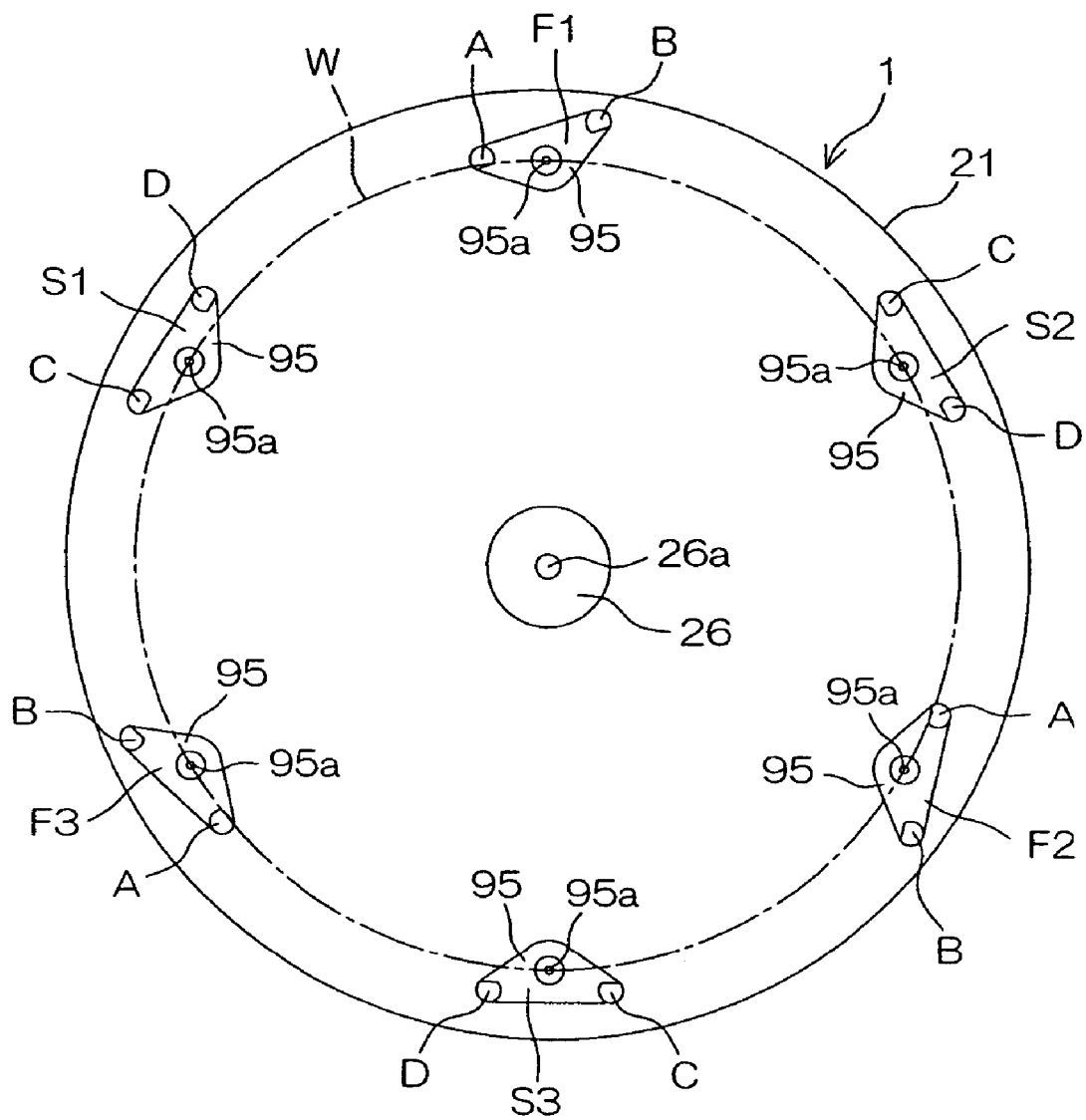
FIG. 10 is a plan view of a spin chuck provided in a substrate treatment apparatus according to a second embodiment of the present invention.

FIG. 10 is a diagram for explaining the construction of a substrate treatment apparatus according to a second embodiment of the present invention. A reference will be made again to FIGS. 1, 3, 4 and 9 for the explanation of the second embodiment.

The substrate treatment apparatus according to the second embodiment has substantially the same construction as the apparatus according to the first embodiment, except that a spin chuck 1 thereof has a construction as illustrated in plan in FIG. 10. In this embodiment, the three clamping members F1 to F3 of the first clamping member set each have a first abutment portion A and a second abutment portion B, and the three clamping members S1 to S3 of the second clamping member set each have a third abutment portion C and a fourth abutment portion D.

Figure 11:
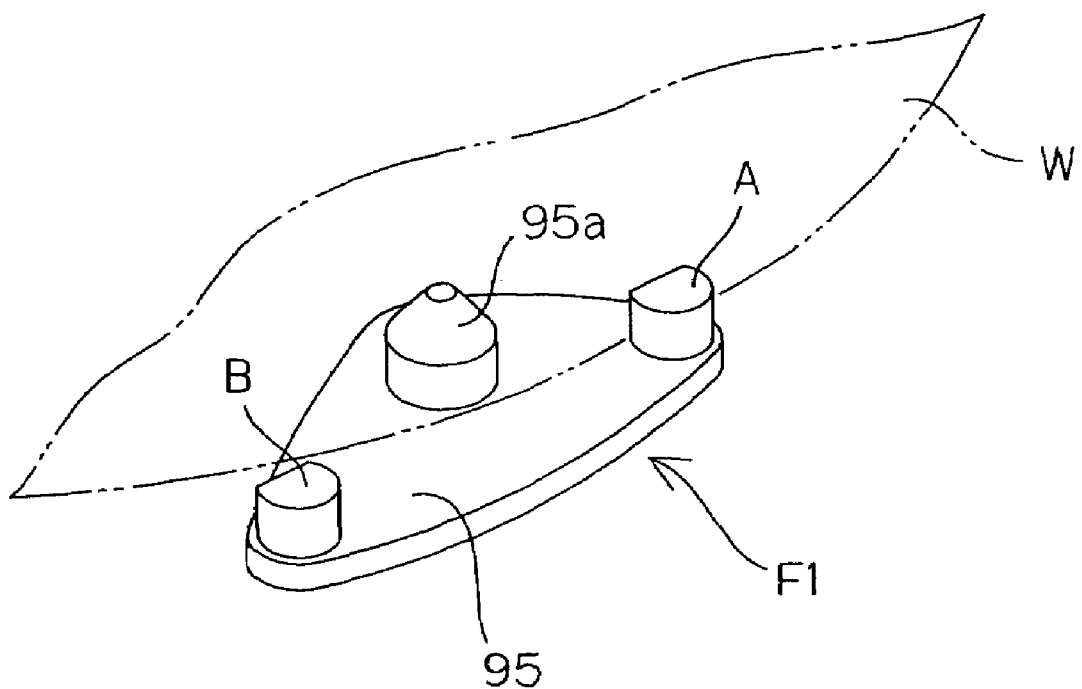
FIG. 11 is a perspective view illustrating the common construction of clamping members according to the second embodiment.

FIG. 11 is a perspective view illustrating the construction of the clamping member F1. The clamping member F1 includes a generally boat-shaped plate portion 95, and the first abutment portion A and the second abutment portion B thereof are provided upright as substrate clamp pins at opposite ends of the plate portion 95. A wafer support portion 95a is provided on a pivot center of the plate portion 95. By pivoting the clamping member F1 about a vertical axis extending through the wafer support portion 95a, the clamping member F1 can be brought into a state where the first abutment portion A abuts against the peripheral surface of the wafer W, a state where the second abutment portion B abuts against the peripheral surface of the wafer W, or a state where both the first abutment portion A and the second abutment portion B are retracted from the peripheral surface of the wafer W. That is, either the first abutment portion A or the second abutment portion B can selectively be brought into abutment against the peripheral surface of the wafer W. The clamping members F2, F3 each have the same construction as the clamping member F1.

The clamping members S1 to S3 of the second clamping member set have the same construction as the clamping members F1 to F3. That is, the clamping members S1 to S3 each have a generally boat-shaped plate portion 95, and the third abutment portion C and the fourth abutment portion D are provided upright as substrate clamp pins at opposite ends of the plate portion 95. A wafer support portion 95a is provided on a pivot center of the plate portion 95. By pivoting the clamping member S1 to S3 about a vertical axis extending through the wafer support portion 95a, the clamping member S1 to S3 can be brought into a state where the third abutment portion C abuts against the peripheral surface of the wafer W, a state where the fourth abutment portion D abuts against the peripheral surface of the wafer W, or a state where both the third abutment portion C and the fourth abutment portion D are retracted from the peripheral surface of the wafer W. That is, either the third abutment portion C or the fourth abutment portion D can selectively be brought into abutment against the peripheral surface of the wafer W.

With the same arrangement as employed in the first embodiment described above, the clamping members F1 to F3 are operative in association with each other and, similarly, the clamping members S1 to S3 are operative in association with each other.

In the second embodiment, the wafer clamping state can selectively be switched among a state where the wafer W is clamped by the three first abutment portions A, a state where the wafer W is clamped by the three first abutment portions A and the three third abutment portions C, a state where the wafer W is clamped by the three first abutment portions A and the three fourth abutment portions D, a state where the wafer W is clamped by the three second abutment portions B, a state where the wafer W is clamped by the three second abutment portions B and the three third abutment portions C, a state where the wafer W is clamped by the three second abutment portions B and the three fourth abutment portions D, a state where the wafer W is clamped by the three third abutment portions C, a state where the wafer W is clamped by the three fourth abutment portions D, and a state where the first to fourth abutment portions A to D are all retracted from the peripheral surface of the wafer W.

Figure 12A:
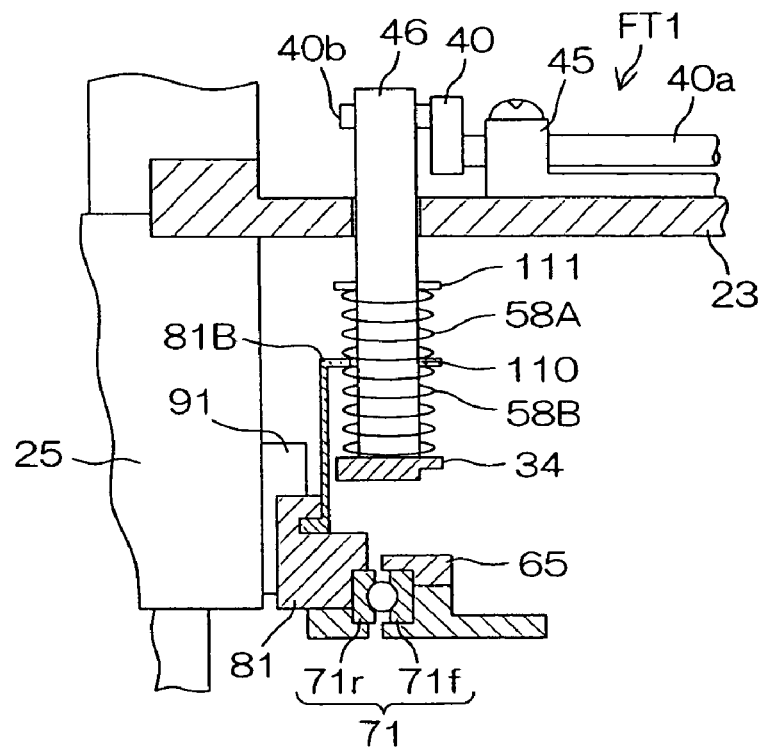
FIG. 12(a) is a partial sectional view illustrating an arrangement for transmitting a driving force between a first rotative movable member and a lift member for one clamping member according to the second embodiment.
Figure 12B:
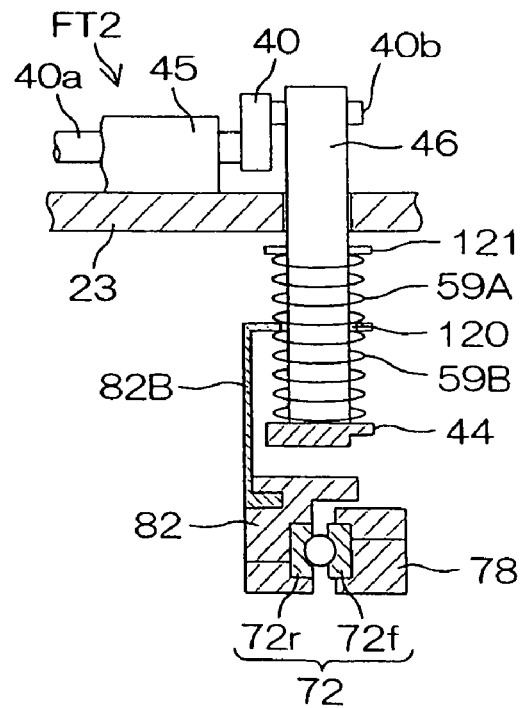
FIG. 12(b) is a partial sectional view illustrating an arrangement for transmitting a driving force between a second rotative movable member and a lift member for another clamping member according to the second embodiment.

FIG. 12(a) is a partial sectional view illustrating an arrangement for transmitting the driving force between the first rotative movable member 81 and the lift member 46 for the clamping member F1 to F3, and FIG. 12(b) is a partial sectional view illustrating an arrangement for transmitting the driving force between the second rotative movable member 82 and the lift member 46 for the clamping member S1 to S3.

A bracket 81B having a generally inverted L-shape in section is fixed to the first rotative movable member 81. The lift member 46 is inserted through an insertion hole 110 formed in the bracket 81B. A spring stopper pin 111 extends through a portion of the lift member 46 between the bracket 81B and the lower plate 23 of the spin base 21. A first compression coil spring 58A is wound around the lift member 46 between the bracket 81B and the spring stopper pin 111, and a second compression coil spring 58B is wound around the lift member 46 between the bracket 81B and the first link ring 34.

With this arrangement, when the first rotative movable member 81 is lifted, the upward driving forces are transmitted to the lift members 46 through the first compression coil springs 58A to lift the lift members 46. Thus, the clamping members F1 to F3 are pivoted by the operation of the first movement converting mechanism FT1 to move the first abutment portions A toward the peripheral surface of the wafer W. With the first abutment portions A in abutment against the peripheral surface of the wafer W, the first rotative movable member 81 is lifted against the spring forces of the first compression coil springs 58A, whereby the wafer W is clamped by the first abutment portions A of the three clamping members F1 to F3 and resiliently held by the spring forces of the first compression coil springs 58A.

Similarly, when the first rotative movable member 81 is lowered, the downward driving forces are transmitted to the first link ring 34 and the lift members 46 through the second compression coil springs 58B to lower the lift members 46. Thus, the clamping members F1 to F3 are pivoted by the operation of the first movement converting mechanism FT1 to move the second abutment portions B toward the peripheral surface of the wafer W. With the second abutment portions B in abutment against the peripheral surface of the wafer W, the first rotative movable member 81 is lowered against the spring forces of the second compression coil springs 58B, whereby the wafer W is clamped by the second abutment portions B of the three clamping members F1 to F3 and resiliently held by the spring forces of the second compression coil springs 58B.

The transmission of the driving forces between the second rotative movable member 82 and the lift members 46 for the clamping members S1 to S3 is achieved by the same arrangement as described above. That is, a bracket 82B having a generally inverted L-shape in section is fixed to the second rotative movable member 82. The lift member 46 is inserted through an insertion hole 120 formed in the bracket 82B. A spring stopper pin 121 extends through a portion of the lift member 46 between the bracket 82B and the lower plate 23 of the spin base. A first compression coil spring 59A is wound around the lift member 46 between the bracket 82B and the spring stopper pin 121, and a second compression coil spring 59B is wound around the lift member 46 between the bracket 82B and the second link ring 44.

With this arrangement, when the second rotative movable member 82 is lifted, the wafer W is resiliently held with the third abutment portions C of the clamping members S1 to S3 in abutment against the peripheral surface of the wafer W. When the second rotative movable member 82 is lowered, the wafer W is resiliently held with the fourth abutment portions D of the clamping members S1 to S3 in abutment against the peripheral surface of the wafer W.

Next, an explanation will be given to the flow of the treatment of the wafer W.

When a wafer W is loaded onto the spin chuck 1 by the substrate transport robot not shown, the motor 2 and the rotative drive mechanism 9 are kept in halt under the control of the control section 100. Further, the control section 100 controls the lift drive mechanism 7 to move the shield plate 6 to the retracted position above the spin chuck 1, and the valves 10, 12, 4, 5 are kept closed under the control of the control section 100.

Figure 13A:
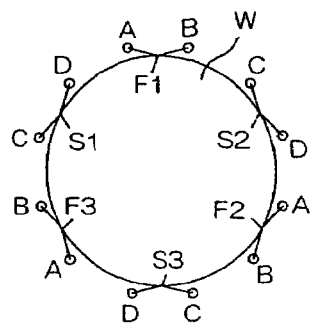
FIGS. 13(a) to 13(i) are schematic diagrams illustrating wafer clamping states according to the second embodiment.

The control section 100 controls the first and second motors M1, M2 to locate the first and second rotative movable members 81, 82 at an intermediate height. The intermediate height is corresponds to a state where the clamping members F1 to F3 are opened with the first and second abutment portions A, B thereof retracted radially outwardly of the spin base 21 out of abutment against the peripheral surface of the wafer W, and the clamping members S1 to S3 are opened with the third and fourth abutment portions C, D thereof retracted radially outwardly of the spin base 21 out of abutment against the peripheral surface of the wafer W (see FIG. 13(a)). In this state, the substrate transport robot places the wafer W on the wafer support portions 95a of the plate portions 95 of the clamping members F1 to F3 and S1 to S3.

Figure 13B:
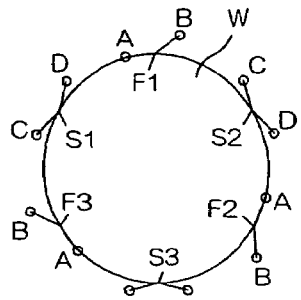
Figure 13C:
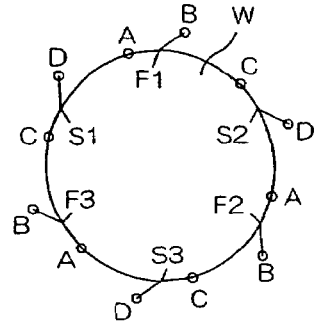
Figure 13D:
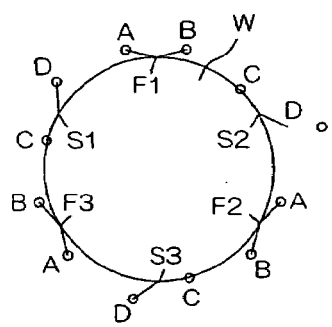
Figure 13E:
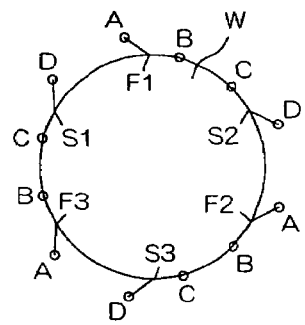
Figure 13F:
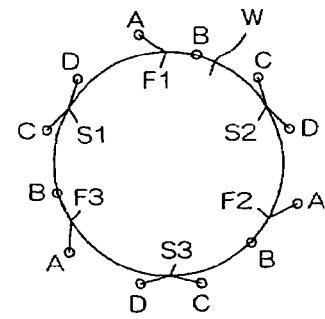
Figure 13G:
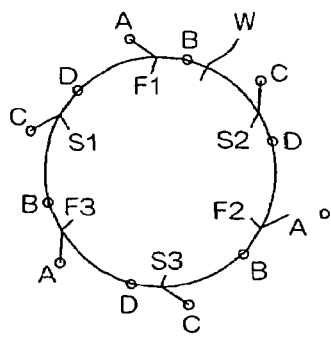
Figure 13H:
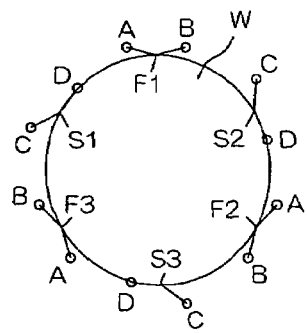
Figure 13I:
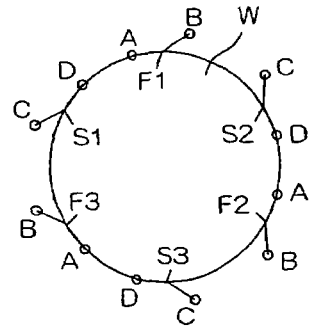

In this state, the control section 100 controls, for example, the first motor M1 to drive the first ball thread mechanisms 61 so as to lift the ball nuts 64. Thus, the first rotative movable member 81 is lifted, so that the lift members 46 are moved up by the upward driving forces received from the compression coil springs 58A. As a result, the clamping members F1 to F3 are pivoted, whereby the first abutment portions A thereof are brought into abutment against the peripheral surface of the wafer W. Thus, the wafer W is clamped by the first abutment portions A of the clamping members F1 to F3 as schematically illustrated in FIG. 13(b). At this time, the clamping members S1 to S3 are kept open (with the third and fourth abutment portions C, D thereof retracted from the peripheral surface of the wafer W), because the electric motor M2 is not driven.

Thereafter, the control section 100 energizes the motor 2 to rotate the spin chuck 1 (first substrate rotation step). At the same time, the lift drive mechanism 7 is controlled to lower the shield plate 6 to the vicinity of the wafer W, and then the rotative drive mechanism 9 is energized to rotate the shield plate 6 in synchronization with the spin chuck 1.

Subsequently, the control section 100 opens the etching liquid supply valve 5 and the nitrogen gas supply valve 10. Thus, the etching liquid is supplied toward the center of the lower surface of the wafer W from the center nozzle 26 (treatment liquid supply step, etching liquid supply step). The etching liquid flows radially outwardly over the lower surface of the wafer W and further flows over the peripheral surface of the wafer W onto the upper surface of the wafer W. The amount of the etching liquid flowing onto the upper surface of the wafer W is controlled by ejecting nitrogen gas from the center of the shield plate 6. As a result, the etching process is performed to etch the entire rear surface of the wafer W, to etch away an unnecessary substance from the peripheral surface of the wafer W, and to etch away an unnecessary substance from the peripheral edge portion of the upper surface of the wafer W.

In the midst of the etching process, the control section 100 drives the electric motor M2 to lift the second rotative movable member 82, while continuously rotating the spin chuck 1. That is, the ball nuts 64 of the ball thread mechanisms 62 are lifted, so that the lift members 46 of the link mechanisms 41, 42, 43 are correspondingly lifted by upward forces received from the first compression coil springs 59A. Therefore, the clamping members S1 to S3 are pivoted by the operation of the second movement converting mechanism FT2. Thus, the wafer W is clamped by the clamping members S1 to S3 with the third abutment portions C thereof in abutment against the peripheral surface of the wafer W (intermediate state). At this time, the first abutment portions A of the clamping members F1 to F3 keep clamping the wafer W, so that the wafer W is clamped by the six abutment portions A, C of the clamping members F1 to F3 and S1 to S3 as shown in FIG. 13(*c*) (second substrate rotation step).

In this state, the control section 100 further controls the electric motor M1, while continuously rotating the spin chuck 1. That is, the ball nuts 64 of the ball thread mechanisms 61 are lowered to lower the first rotative movable member 81 to the intermediate height. As a result, the lift members 46 are lowered, and the clamping members F1 to F3 are pivoted by the operation of the first movement converting mechanism FT1, whereby the first abutment portions A of the clamping members F1 to F3 are retracted from the peripheral surface of the wafer W. Thus, the clamping members F1 to F3 are opened in the wafer unclamping state (third substrate rotation step). Therefore, the wafer W is thereafter clamped by the three third abutment portions C of the clamping members S1 to S3 as shown in FIG. 13(*d*), while being continuously rotated.

In this state, the control section 100 further controls the electric motor M1, while continuously rotating the spin chuck 1. That is, the ball nuts 64 of the ball thread mechanisms 61 are lowered, so that the first rotative movable member 81 is further lowered from the intermediate height. As a result, the lift members 46 are lowered, and the clamping members F1 to F3 are pivoted by the operation of the first movement converting mechanism FT1, whereby the second abutment portions B of the clamping members F1 to F3 are brought into abutment against the peripheral surface of the wafer W. Thus, the wafer W is clamped by the three second abutment portions B of the clamping members F1 to F3 and the three third abutment portions C of the clamping members S1 to S3 as shown in FIG. 13(*e*), while being continuously rotated (fourth substrate rotation step).

In this state, the control section 100 drives the electric motor M2 to lower the second rotative movable member 82 to the intermediate height, while continuously rotating the spin chuck 1. That is, the ball nuts 64 of the ball thread mechanisms 62 are lowered, so that the lift members 46 of the link mechanisms 41, 42, 43 are correspondingly lowered. Therefore, the clamping members S1 to S3 are pivoted by the operation of the second movement converting mechanism FT2, whereby the third abutment portions C of the clamping members S1 to S3 are retracted from the peripheral surface of the wafer W. Thus, the wafer W is clamped by the three second abutment portions B of the clamping members F1 to F3 as shown in FIG. 13(*f*) (fifth substrate rotation step). In this manner, the wafer W is transferred from the first abutment portions A to the second abutment portions B of the clamping members F1 to F3 (abutment portion switching step).

Thereafter, the control section 100 further drives the electric motor M2 to further lower the second rotative movable member 82 from the intermediate height, while continuously rotating the spin chuck 1. The lift members 46 are correspondingly lowered, and the clamping members S1 to S3 are pivoted by the operation of the second movement converting mechanism FT2, whereby the fourth abutment portions D of the clamping members S1 to S3 are brought into abutment against the peripheral surface of the wafer W. Thus, the wafer W is clamped by the three second abutment portions B of the clamping members F1 to F3 and the three fourth abutment portions D of the clamping members S1 to S3 as shown in FIG. 13(*g*) (sixth substrate rotation step).

In this state, the control section 100 controls the electric motor M1, while continuously rotating the spin chuck 1. That is, the ball nuts 64 of the ball thread mechanisms 61 are lifted to lift the first rotative movable member 81 to the intermediate height. As a result, the lift members 46 are lifted, and the clamping members F1 to F3 are pivoted by the operation of the first movement converting mechanism FT1, whereby the second abutment portions B of the clamping members F1 to F3 are retracted from the peripheral surface of the wafer W. Thus, the wafer W is clamped by the three fourth abutment portions D of the clamping members S1 to S3 as shown in FIG. 13(*h*), while being continuously rotated (seventh substrate rotation step). Thus, the wafer W is transferred from the third abutment portions C to the fourth abutment portions D of the clamping members S1 to S3 (abutment portion switching step).

Where the entire peripheral surface of the wafer W is to be treated for a predetermined period T (e.g., 60 seconds), the first, third, fifth and seventh substrate rotation steps are each performed for a period T/3 (e.g., 20 seconds). Thus, the etching liquid can be supplied to the portions of the peripheral surface of the wafer W clamped switchably by the first to fourth abutment portions A to D for the predetermined period T. Therefore, the time required for the etching process per wafer W is the total of the predetermined period T and the time required for the second, fourth and sixth substrate rotation steps. Accordingly, the process time can be minimized by reducing the time required for the second, fourth and sixth substrate rotation steps as much as possible.

In the aforesaid first embodiment, on the other hand, the first and third substrate rotation steps should each be performed for the predetermined period T in order to supply the etching liquid to the portions of the wafer W clamped switchably by the abutment portions 96 of the clamping members F1 to F3 and S1 to S3 for the predetermined period T. That is, the time required for the etching process is the total of twice the predetermined period (e.g., 120 seconds) and the time required for the second substrate rotation step.

Thus, the time required for the etching process can drastically be reduced according to the second embodiment.

As described above, the substrate clamping state is switched from a first clamping state where the wafer W is clamped by the first abutment portions A through a first intermediate state where the wafer W is clamped by the first abutment portions A and the third abutment portions C to a second clamping state where the wafer W is clamped by the third abutment portions C, then switched from the second clamping state through a second intermediate state where the wafer W is clamped by the third abutment portions C and the second abutment portions B to a third clamping state where the wafer W is clamped by the second abutment portion B, and switched from the third clamping state through a third intermediate state where the wafer W is clamped by the second abutment portions B and the fourth abutment portions D to a fourth clamping state where the wafer W is clamped by the fourth abutment portions D during the rotation of the spin chuck 1 without stopping the rotation of the spin chuck 1. Thus, the wafer clamping positions on the peripheral surface of the wafer W can be changed during the supply of the etching liquid to the wafer W. Therefore, the entire peripheral surface and peripheral edge portion of the wafer W can properly be treated without reduction in productivity.

In addition, the wafer clamping state is once switched from a state where the wafer W is clamped by the clamping members F1 to F3 to an intermediate state where the wafer W is clamped by the clamping members F1 to F3 and S1 to S3, and then switched to a state where the wafer W is clamped by the clamping members S1 to S3 as in the aforesaid first embodiment. Therefore, the wafer W is unlikely to be slid even when the wafer clamping positions are changed. Further, the wafer W can assuredly be held even when the wafer clamping positions are changed.

After the wafer W is treated with the etching liquid, the control section 100 closes the etching liquid supply valve 5 and opens the deionized water supply valves 4, 12. Thus, the deionized water rinse process is performed by supplying deionized water to the upper and lower surfaces of the wafer W. By transferring the wafer W among the first to fourth abutment portions A to D in the aforesaid manner during the deionized water rinse process, the entire surfaces of the wafer W can uniformly and properly be rinsed, and the time required for the rinse process can be reduced.

Thereafter, the control section 100 closes the deionized water supply valves 4, 12, and controls the motor 2 to rotate the spin chuck 1 at a high speed. Thus, the drying process is performed by spinning off water from the upper and lower surfaces of the wafer W. In the drying process, the wafer W is preferably transferred among the first to fourth abutment portions A to D by performing the aforesaid first to seventh substrate rotation steps while continuously rotating the spin chuck 1. Thus, water droplets are prevented from remaining on the portions of the wafer W brought into abutment against the clamping members F1 to F3 and S1 to S3.

In the above explanation, the etching liquid is continuously supplied to the wafer W in the first to seventh substrate rotation steps in the etching process. However, it is merely necessary to supply the etching liquid to the wafer W at least in the first, third and seventh substrate rotation steps for proper treatment of the entire peripheral surface and peripheral edge portion of the wafer W.

After the seventh substrate rotation step, the wafer W may be once clamped in an intermediate state by the fourth abutment portions D and the first abutment portions A (eighth substrate rotation step, see FIG. 13(*i*)) and then subjected again to the respective processes starting from the first substrate rotation step (see FIG. 13(*b*)).

Upon completion of the treatment of the wafer W, the first to fourth abutment portions A, B, C, D of the clamping members F1 to F3 and S1 to S3 are retracted from the peripheral surface of the wafer W (see FIG. 13(*a*)), and then the treated wafer W is unloaded from the spin chuck 1 by the substrate transport robot.

Figure 14:
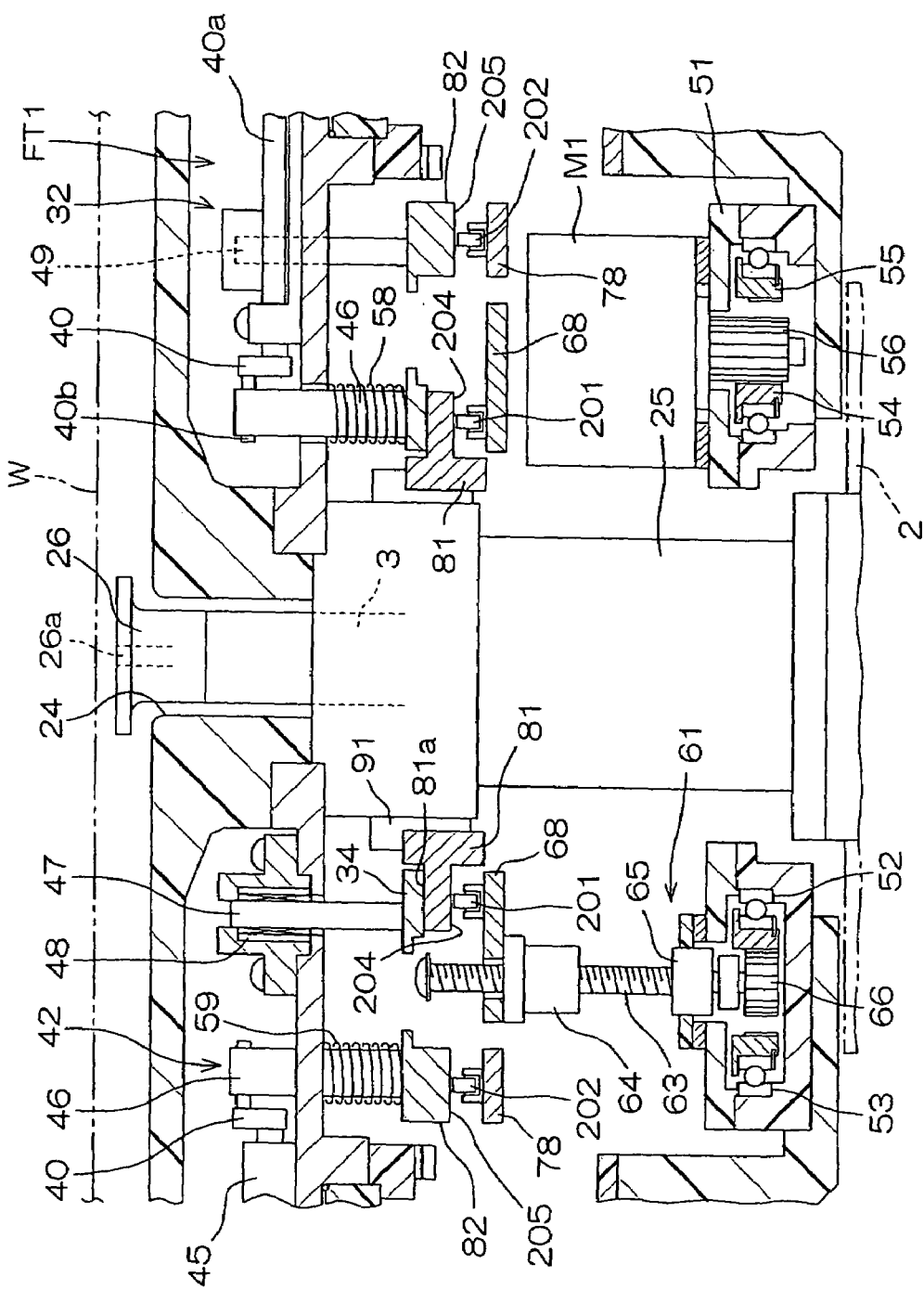
FIG. 14 is a sectional view for explaining the construction of a substrate treatment apparatus according to a third embodiment of the present invention.

FIG. 14 is a sectional view for explaining the construction of a substrate treatment apparatus according C to a third embodiment of the present invention. In FIG. 14, components corresponding to those shown in FIG. 4 are denoted by the same reference characters as in FIG. 4.

In the embodiments described above, the first bearing 71 transmits the driving force between the first non-rotative movable member 68 and the first rotative movable member 81, while permitting the relative rotation of the first rotative movable member 81 with respect to the first non-rotative movable member 68 about the rotary shaft 25. The second bearing 72 transmits the driving force between the second non-rotative movable member 78 and the second rotative movable member 82, while permitting the relative rotation of the second rotative movable member 82 with respect to the second non-rotative movable member 78 about the rotary shaft 25.

In this embodiment, on the other hand, a plurality of rolls 201 (at least two rolls 201) are provided on an upper surface of the first non-rotative movable member 68, and a plurality of rolls 202 (at least two rolls 202) are provided on an upper surface of the second non-rotative movable member 78. The rolls 201 and the rolls 202 roll along circular tracks about the rotary shaft 25 in contact with a rolling surface 204 formed on a lower surface of the first ring-shaped rotative movable member 81 and a rolling surface 205 formed on a lower surface of the second ring-shaped rotative movable member 82, respectively. This arrangement allows for the relative rotation of the first rotative movable member 81 with respect to the first non-rotative movable member 68 about the rotary shaft 25 and the transmission of the driving force from the first non-rotative movable member 68 to the first rotative movable member 81. Further, this arrangement allows for the relative rotation of the second rotative movable member 82 with respect to the second non-rotative movable member 78 about the rotary shaft 25 and the transmission of the driving force from the second non-rotative movable member 78 to the second rotative movable member 82.

When the lift members 46 of the link mechanisms 31, 32, 33 of the first movement converting mechanism FT1 are lowered to the lowermost height, the first non-rotative movable member 68 is lowered to a position at which the rolls 201 do not contact the rolling surface 204. Similarly, when the lift members 46 of the link mechanisms 41, 42, 43 of the second movement converting mechanism FT2 are lowered to the lowermost height, the second non-rotative movable member 78 is lowered to a position at which the rolls 202 do not contact the rolling surface 205. The second rotative movable member 82 providing the rolling surface 205 is connected to lower ends of the lift members 46 and the guide shafts 49.

The rolls 201 and the rolls 202 are provided on the upper surfaces of the first non-rotative movable member 68 and the second non-rotative movable member 78, respectively. For example, four rolls 201 may be disposed at positions RP1 (see FIG. 6) on the upper surface of the first non-rotative movable member 68, and four rolls 202 may be disposed at positions RP2 (see FIG. 6) on the upper surface of the second non-rotative movable member 78. In FIG. 6, the roll positions PR1 are located in pairs on opposite sides of the two first ball thread mechanisms 61, 61 which are provided in opposed relation with the rotary shaft 25 interposed therebetween. Similarly, the roll positions PR2 are located in pairs on opposite sides of the two second ball thread mechanisms 62, 62 which are provided in opposed relation with the rotary shaft 25 interposed therebetween.

Of course, the arrangements of the rolls 201 and the rolls 202 may be modified. For example, three rolls may be disposed on the upper surface of each of the first non-rotative movable member 68 and the second non-rotative movable member 78. Alternatively, five rolls may be disposed on the upper surface of each of the first non-rotative movable member 68 and the second non-rotative movable member 78.

Further, the first non-rotative movable member 68 and the second non-rotative movable member 78 are not necessarily required to have a ring shape, but may have any of various configurations as long as the rolls 201 and the rolls 202 can be moved up and down in association with the movements of the first ball thread mechanisms 61 and the second ball thread mechanisms 62.

For example, a pair of movable members provided in the vicinity of the pair of first ball thread mechanisms 61, 61 may be employed instead of the first non-rotative movable member 68. In this case, rolls 201, 201 are respectively provided on the movable members, and the movable members are respectively moved up and down by the first ball thread mechanisms 61, 61. The pair of first ball thread mechanisms 61, 61 are interlocked by the ring-shaped first gear 54, so that the pair of movable members are movable up and down in association with each other. Of course, the second non-rotative movable member 78 may also be modified in this manner.

Figure 15:
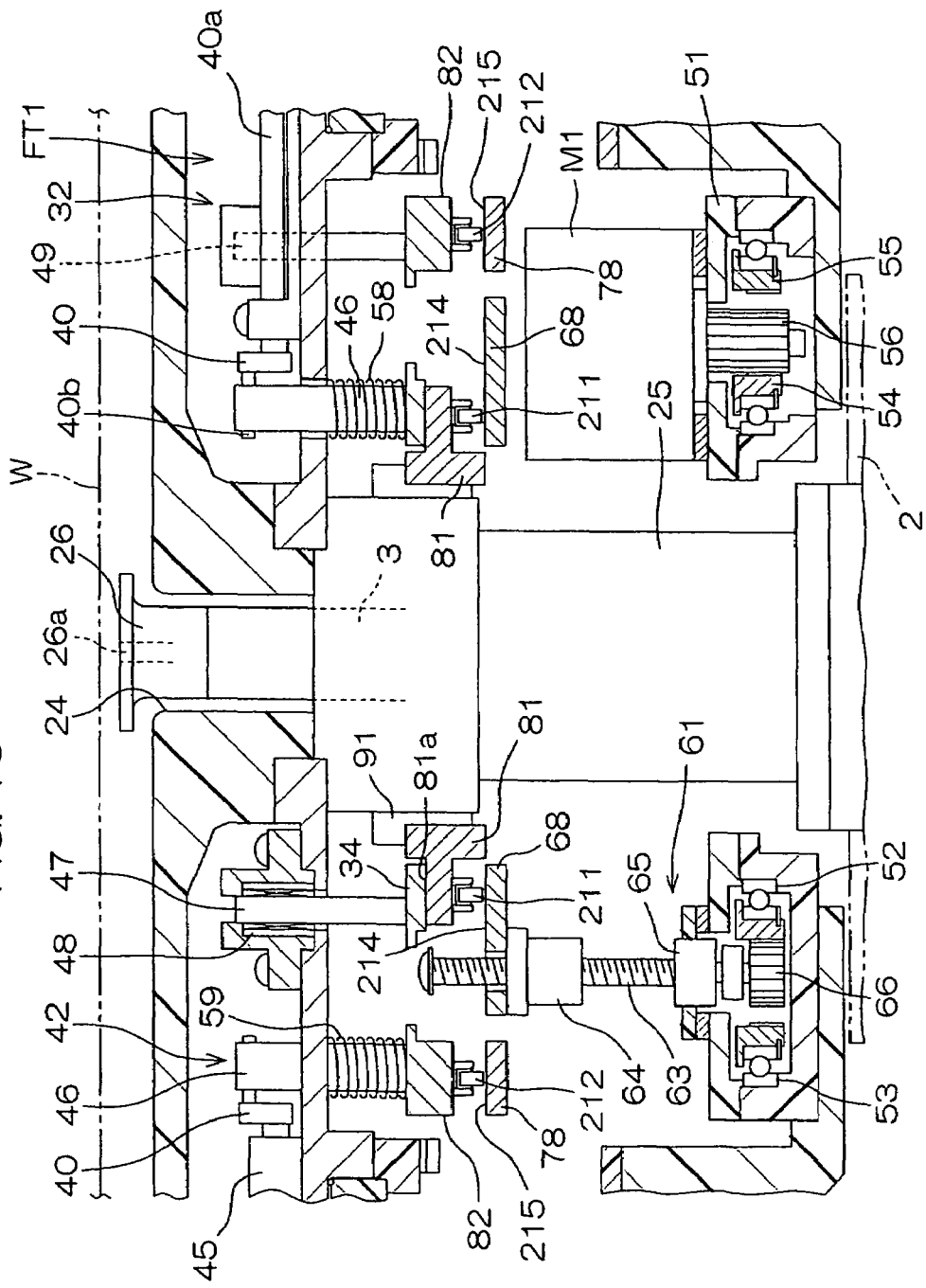
FIG. 15 is a sectional view for explaining the construction of a substrate treatment apparatus according to a fourth embodiment of the present invention.

FIG. 15 is a sectional view for explaining the construction of a substrate treatment apparatus according to a fourth embodiment of the present invention. In FIG. 15, components corresponding to those shown in FIG. 14 are denoted by the same reference characters as in FIG. 14.

In this embodiment, a plurality of rolls 211 (at least two rolls 211) are provided on the lower surface of the first rotative movable member 81, and a plurality of rolls 212 (at least two rolls 212) are provided on the lower surface of the second rotative movable member 82. The rolls 211 and the rolls 212 roll along circular tracks about the rotary shaft 25 in contact with a rolling surface 214 formed on the upper surface of the first ring-shaped non-rotative movable member 68 and a rolling surface 215 formed on the upper surface of the second ring-shaped non-rotative movable member 78, respectively. This arrangement allows for the relative rotation of the first rotative movable member 81 with respect to the first non-rotative movable member 68 about the rotary shaft 25 and the transmission of the driving force from the first non-rotative movable member 68 to the first rotative movable member 81. Further, this arrangement allows for the relative rotation of the second rotative movable member 82 with respect to the second non-rotative movable member 78 about the rotary shaft 25 and the transmission of the driving force from the second non-rotative movable member 78 to the second rotative movable member 82.

When the lift members 46 of the link mechanisms 31, 32, 33 of the first movement converting mechanism FT1 are lowered to the lowermost height, the first non-rotative movable member 68 is lowered to a position at which the rolls 211 do not contact the rolling surface 214. Similarly, when the lift members 46 of the link mechanisms 41, 42, 43 of the second movement converting mechanism FT2 are lowered to the lowermost height, the second non-rotative movable member 78 is lowered to a position at which the rolls 212 do not contact the rolling surface 215. The second rotative movable member 82 to which the rolls 212 are fixed is connected to lower ends of the lift members 46 and the guide shafts 49.

The rolls 211 and the rolls 212 are provided on the lower surfaces of the first rotative movable member 81 and the second rotative movable member 82, respectively. For example, the rolls 211 may be disposed on the lower surface of the first rotative movable member 81 below the guide shafts 47 (see FIG. 3), and the rolls 212 may be disposed on the lower surface of the second rotative movable member 82 below the guide shafts 49 (see FIG. 3). That is, three rolls are provided as the rolls 211 or 212, which are arranged equiangularly around the rotary shaft 25 in this embodiment.

Of course, the arrangements of the rolls 211 and the rolls 212 may be modified. For example, two or four or more rolls may be disposed on the lower surface of each of the first rotative movable member 81 and the second rotative movable member 82.

Further, the first rotative movable member 81 and the second rotative movable member 82 are not necessarily required to have a ring shape, but may have any of various configurations as long as the rolls 211 and the rolls 212 can roll along the rolling surfaces 214 and 215 formed on the upper surfaces of the first non-rotative movable member 68 and the second non-rotative movable member 78, respectively.

For example, a rotative movable member fixed to the lower ends of the lift members 46 of the link mechanisms 31, 32, 33 of the first movement converting mechanism FT1 may be employed instead of the first rotative movable member 81, and rolls 211 may be fixed to the rotative movable member. The second rotative movable member 81 may also be modified in this manner.

Figure 16:
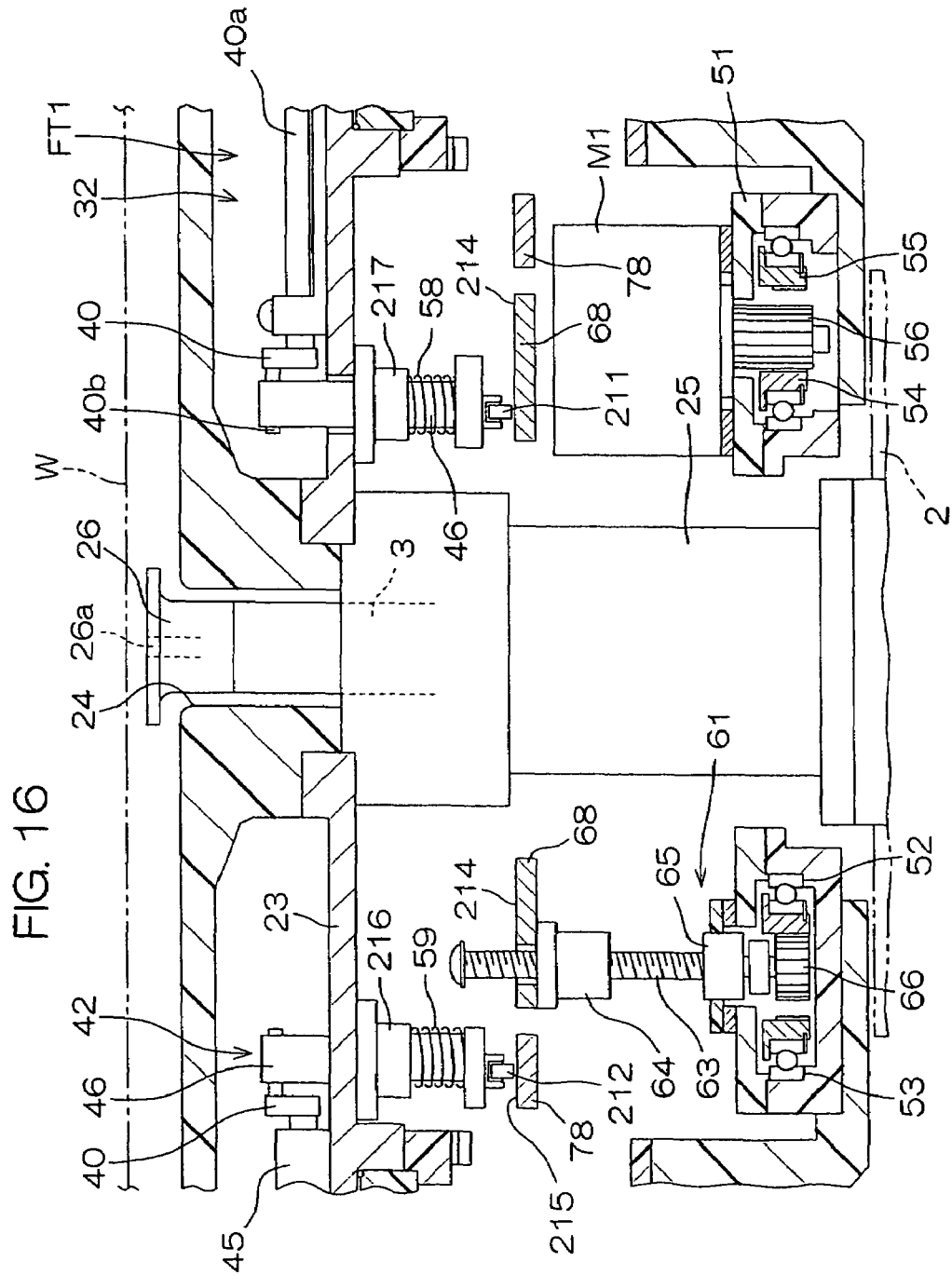
FIG. 16 is a sectional view for explaining a modification of the fourth embodiment.

In this case, however, bushes 216, 217 are preferably provided on the lower plate 23 of the spin base 21 as vertical guide means for vertically guiding the lift members 46, as shown in FIG. 16. In this case, the guide shafts 47, 49 and the bushes 48 as vertical guide means for the guide shafts 47, 49 are not required.

Figure 17:
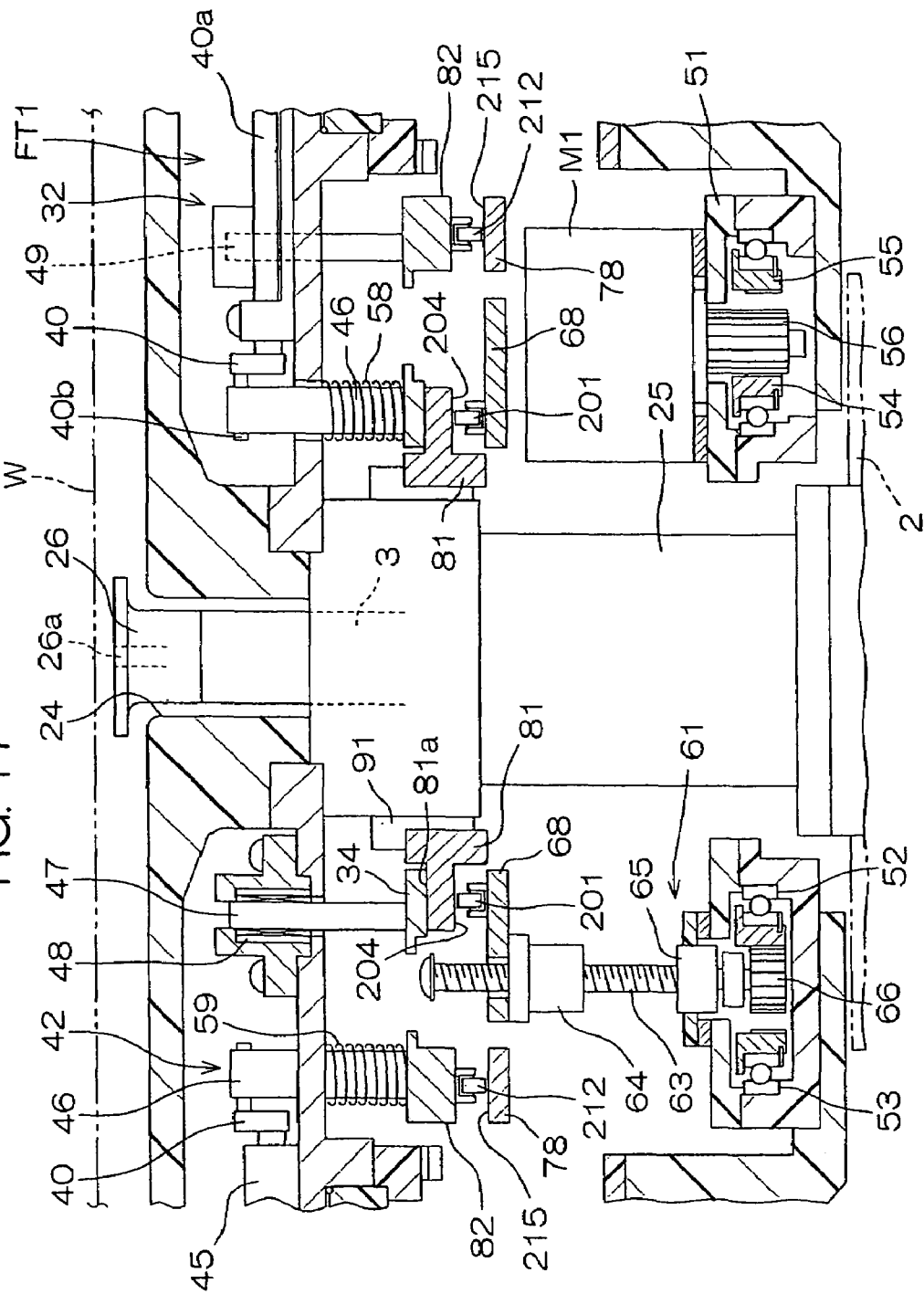
FIG. 17 is a sectional view for explaining the construction of a substrate treatment apparatus according to a fifth embodiment of the present invention.

FIG. 17 is a sectional view for explaining the construction of a substrate treatment apparatus according to a fifth embodiment of the present invention. In FIG. 17, components corresponding to those shown in FIGS. 14 and 15 are denoted by the same reference characters as in FIGS. 14 and 15.

In this embodiment, rolls 201 are provided on the upper surface of the first non-rotative movable member 68. The rolls 201 roll along a rolling surface 204 formed on the lower surface of the first rotative movable member 81. Further, rolls 212 are provided on the lower surface of the second rotative movable member 82. The rolls 212 roll along a rolling surface 215 formed on the upper surface of the second non-rotative movable member 78. That is, this embodiment employs the arrangement of the third embodiment and the arrangement of the fourth embodiment in combination.

Therefore, the arrangement associated with the first non-rotative movable member 68 may be modified in the same manner as described in the third embodiment, and the arrangement associated with the second rotative movable member 82 may be modified in the same manner as described in the fourth embodiment.

Of course, rolls 202 may be provided on the upper surface of the second non-rotative movable member 78, so that the rolls 202 can roll along a rolling surface 205 formed on the lower surface of the second rotative movable member 82 (see FIG. 14). Further, rolls 211 may be provided on the lower surface of the first rotative movable member 81, so that the rolls 211 can roll along a rolling surface 214 formed on the upper surface of the first non-rotative movable member 68 (see FIG. 15).

In this case, the arrangement associated with the second non-rotative movable member 78 may be modified in the same manner as described in the third embodiment, and the arrangement associated with the first rotative movable member 81 may be modified in the same manner as described in the fourth embodiment.

Although the rolls are employed as rolling members in the third, fourth and fifth embodiments, spherical members (balls) may be employed instead of the rolls. Alternatively, toothed rolls (gears) may be employed. In this case, circular gear portions (racks) to be meshed with the toothed rolls may respectively be provided along the tracks of the toothed rolls on the rolling surfaces 204, 205, 214, 215.

Figure 18:
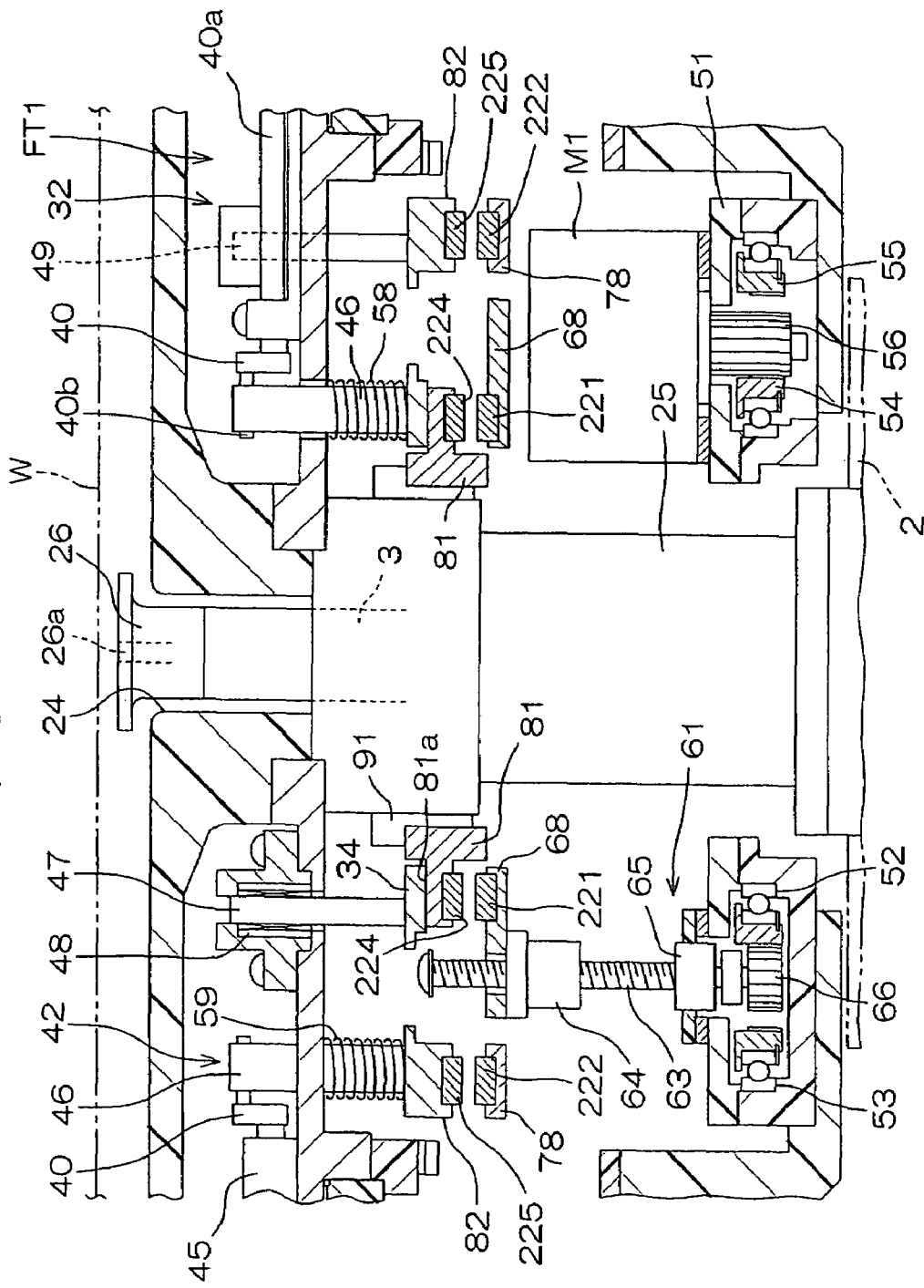
FIG. 18 is a sectional view for explaining the construction of a substrate treatment apparatus according to a sixth embodiment of the present invention.

FIG. 18 is a sectional view for explaining the construction of a substrate treatment apparatus according to a sixth embodiment of the present invention. In FIG. 18, components corresponding to those shown in FIG. 14 are denoted by the same reference characters as in FIG. 14.

In this embodiment, permanent magnets 221 and 222 are respectively fixed onto the upper surfaces of the first non-rotative movable member 68 and the second non-rotative movable member 78. Permanent magnets 224 and 225 are respectively fixed onto the lower surfaces of the first rotative movable member 81 and the second rotative movable member 82. The permanent magnets 221 and 224 are disposed in vertically opposed relation with their opposed poles having the same polarity (N-pole or S-pole). When the permanent magnet 221 is sufficiently close to the permanent magnet 224, the permanent magnet 224 is magnetically levitated above the permanent magnet 221 by a repulsive force occurring therebetween. Similarly, the permanent magnets 222 and 225 are disposed in vertically opposed relation with their opposed poles having the same polarity (N-pole or S-pole). When the permanent magnet 222 is sufficiently close to the permanent magnet 225, the permanent magnet 225 is magnetically levitated above the permanent magnet 222 by a repulsive force occurring therebetween.

This arrangement permits the relative rotation of the first rotative movable member 81 with respect to the first non-rotative movable member 68 about the rotary shaft 25, and allows for the transmission of the driving force from the first non-rotative movable member 68 to the first rotative movable member 81 when the first non-rotative movable member 68 is lifted. Further, this arrangement permits the relative rotation of the second rotative movable member 82 with respect to the second non-rotative movable member 78 about the rotary shaft 25, and allows for the transmission of the driving force from the second non-rotative movable member 78 to the second rotative movable member 82 when the second non-rotative movable member 78 is lifted.

The permanent magnets 221, 222, 224, 225 may each have a ring shape as surrounding the rotary shaft 25. Where one of the permanent magnets 221, 224 provided in pair in opposed relation has a ring shape, the other permanent magnet is not necessarily required to have a ring shape, but may include a plurality of permanent magnet pieces (e.g., three or more permanent magnet pieces) preferably equiangularly disposed in opposed relation to the ring-shaped permanent magnet with the opposed poles of the ring-shaped permanent magnet and the permanent magnet pieces having the same polarity. The other pair of permanent magnets 222, 225 disposed in opposed relation may also be modified in this manner.

Further, electromagnetic devices may be employed instead of the permanent magnets. Where the electromagnetic devices are employed, however, electric wiring is required. Therefore, it is preferred that the electromagnetic devices are provided on the first non-rotative movable member 68 and/or the second non-rotative movable member 78, and the permanent magnets are provided on the first rotative movable member 81 and the second rotative movable member 82.

Figure 19:
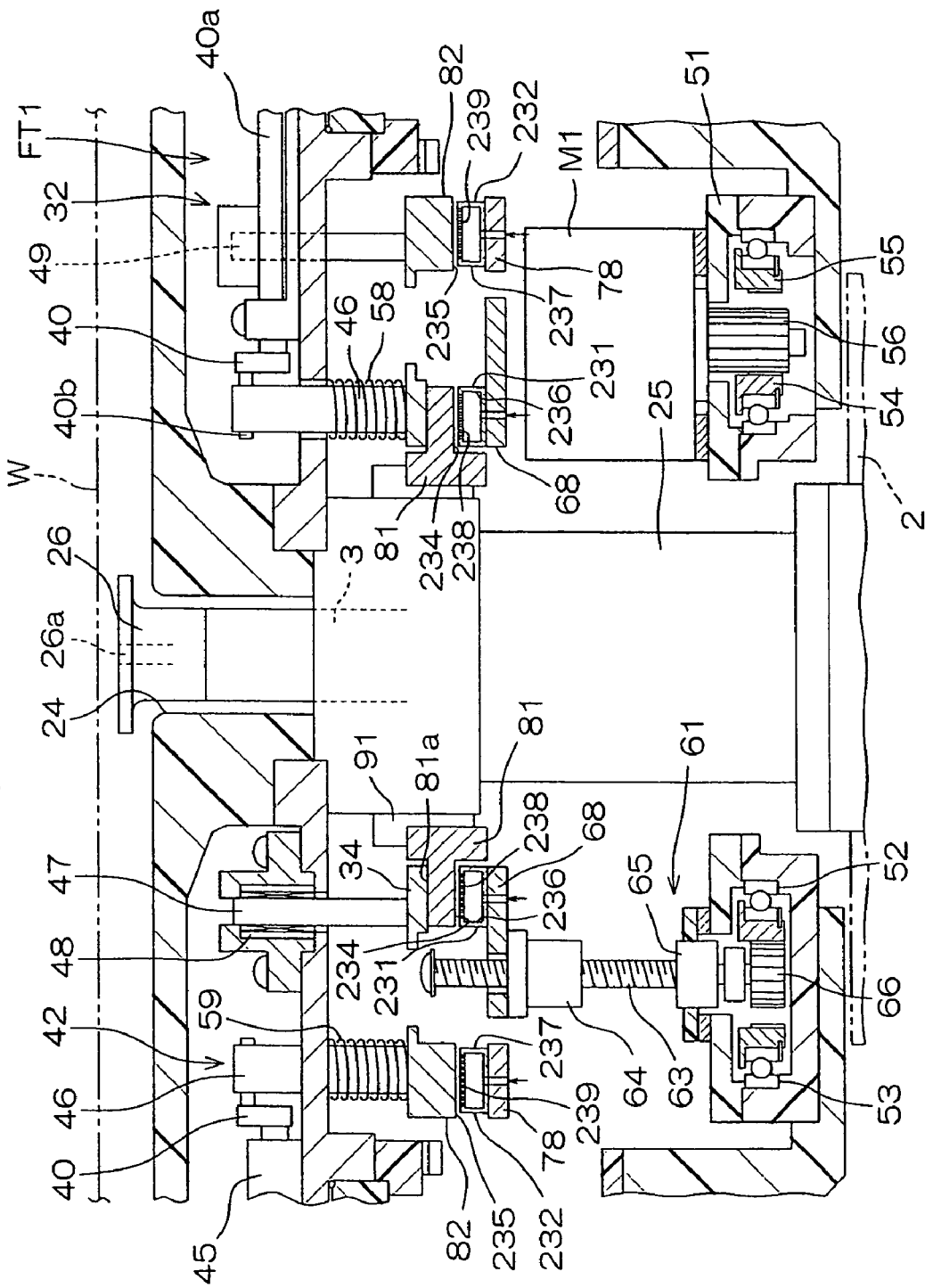
FIG. 19 is a sectional view for explaining the construction of a substrate treatment apparatus according to a seventh embodiment of the present invention.

FIG. 19 is a sectional view for explaining the construction of a substrate treatment apparatus according to a seventh embodiment of the present invention. In FIG. 19, components corresponding to those shown in FIG. 14 are denoted by the same reference characters as in FIG. 14.

In this embodiment, the first non-rotative movable member 68 and the second non-rotative movable member 78 respectively have gas ejecting portions 231 and 232 for ejecting a gas upward. The pressures of the gas ejected from the gas ejecting portions 231 and 232 are respectively received by a pressure receiving surface 234 formed on the lower surface of the first rotative movable member 81 and a pressure receiving surface 235 formed on the lower surface of the second rotative movable member 82. The pressure receiving surfaces 234, 235 of the first rotative movable member 81 and the second rotative movable member 82 each have a ring shape centered on the rotary shaft 25 and are each contained in a plane perpendicular to the rotary shaft 25.

With this arrangement, when the first non-rotative movable member 68 is lifted to bring the gas ejecting portion 231 thereof sufficiently close to the pressure receiving surface 234, the first rotative movable member 81 can be levitated by the pressure of the ejected gas. Similarly, when the second non-rotative movable member 78 is lifted to bring the gas ejecting portion 232 thereof sufficiently close to the pressure receiving surface 235, the second rotative movable member 82 can be levitated by the pressure of the ejected gas.

That is, the transmission of the driving force from the first non-rotative movable member 68 to the first rotative movable member 81 can be achieved, while the relative rotation of the first rotative movable member 81 with respect to the first non-rotative movable member 68 about the rotary shaft 25 is permitted. Further, the transmission of the driving force from the second non-rotative movable member 78 to the second rotative movable member 82 can be achieved, while the relative rotation of the second rotative movable member 82 with respect to the second non-rotative movable member 78 about the rotary shaft 25 is permitted.

Figure 20:
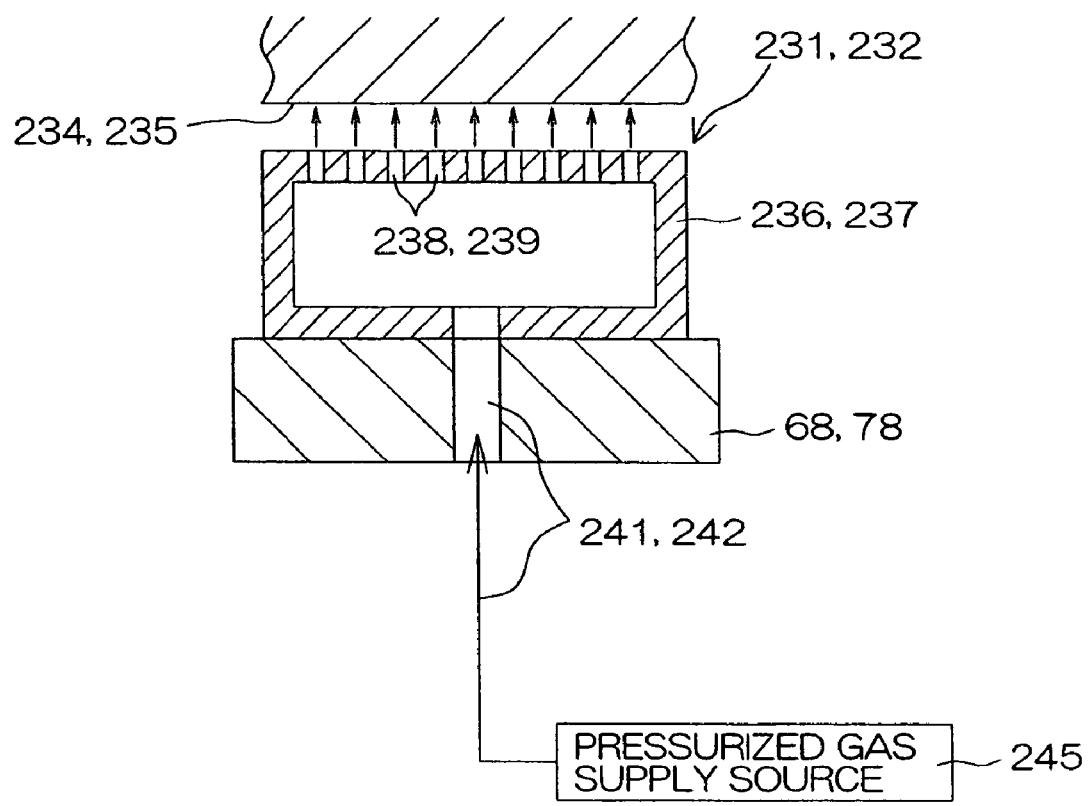
FIG. 20 is a sectional view illustrating major portions of the substrate treatment apparatus of FIG. 19 on a greater scale.

As illustrated on a greater scale in FIG. 20, the gas ejecting portions 231, 232 each include a ring-shaped duct 236, 237 centered on the rotary shaft 25 and having a rectangular cross section, and a plurality of gas ejection ports (holes or slits) 238, 239 provided in an upper face of the duct 236, 237. The gas (air or an inert gas such as nitrogen gas) is supplied to the ducts 236, 237 from a pressurized gas supply source 245 through gas supply passages 241, 242 under pressure.

The ducts 236, 237 are not necessarily required to have a ring shape, but may each be partitioned in a plurality of duct portions arranged in spaced relation circumferentially along the ring-shaped pressure receiving surface 234, 235.

Alternatively, ring-shaped pressure receiving surfaces may respectively be provided on the upper surfaces of the first non-rotative movable member 68 and the second non-rotative movable member 78, and the first rotative movable member 81 and the second rotative movable member 82 may respectively be provided with gas ejecting portions for ejecting the gas downward toward the pressure receiving surfaces. Further, ring-shaped pressure receiving surfaces may respectively be provided on the upper surface of the first non-rotative movable member 68 and on the lower surface of the second rotative movable member 82, and the first rotative movable member 81 and the second non-rotative movable member 78 may respectively be provided with a gas ejecting portion for ejecting the gas downward and a gas ejecting portion for ejecting the gas upward. Similarly, ring-shaped pressure receiving surfaces may respectively be provided on the lower surface of the first rotative movable member 81 and on the upper surface of the second non-rotative movable member 78, and the first non-rotative movable member 68 and the second rotative movable member 82 may respectively be provided with a gas ejecting portion for ejecting the gas upward and a gas ejecting portion for ejecting the gas downward. In these cases, however, the compressed gas should be supplied to the rotary components, so that the gas supply passages may each have a complicated structure.

As described above, the bearing mechanisms shown in FIG. 4, the rolling mechanisms shown in FIG. 14 and the like, the magnetic levitation mechanisms shown in FIG. 18 or the pneumatic levitation mechanisms shown in FIG. 19 can be employed as the driving force transmission mechanisms for transmitting the driving forces from the non-rotative movable members 68, 78 to the rotative movable members 81, 82. For the transmission of the driving force from the first non-rotative movable member 68 to the first rotative movable member 81 and for the transmission of the driving force from the second non-rotative movable member 78 to the second rotative movable member 82, the same type of driving force transmission mechanisms are not necessarily required, but different types of driving force transmission mechanisms may be employed in combination.

Figure 21:
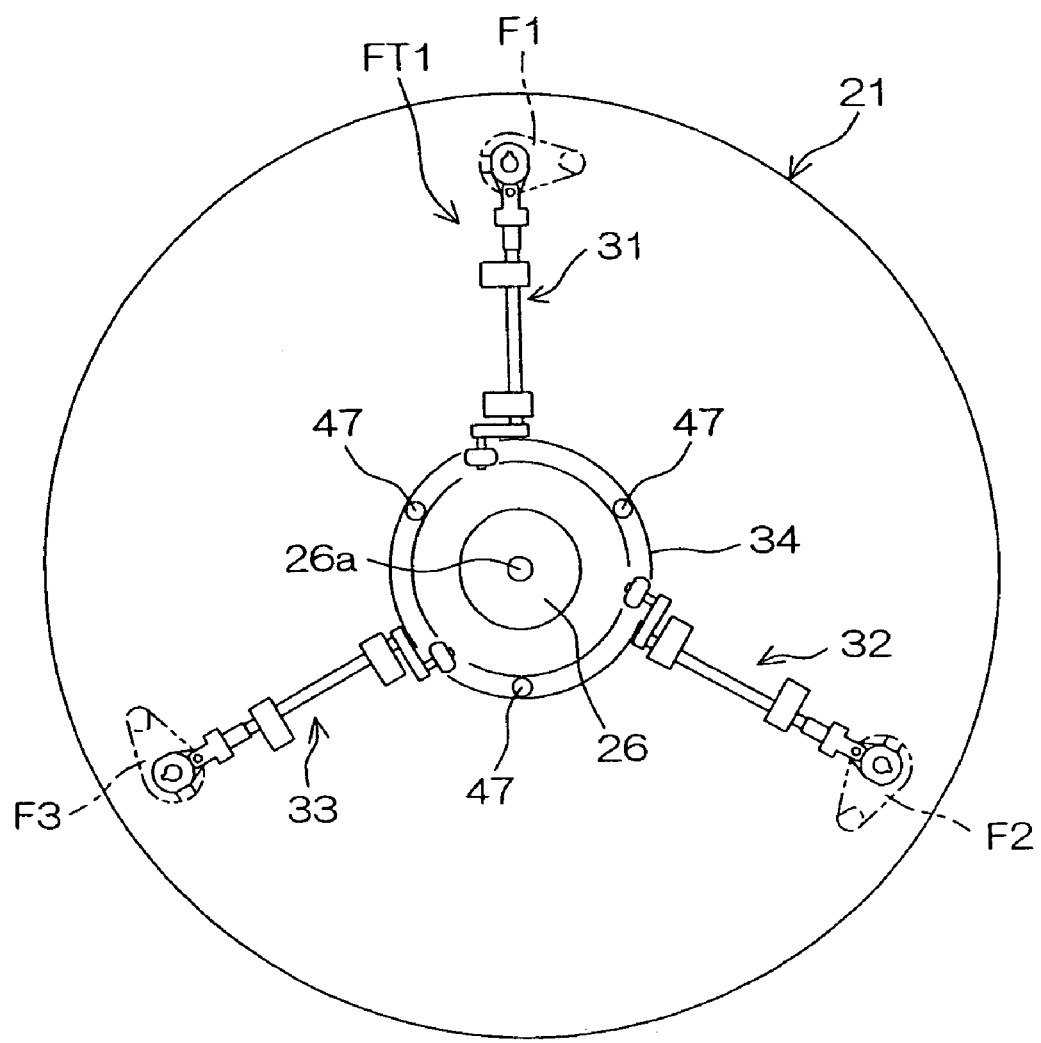
FIG. 21 is a plan view illustrating the internal construction of a spin chuck employed in a substrate treatment apparatus according to an eighth embodiment of the present invention.

FIG. 21 is a diagram for explaining the construction of a substrate treatment apparatus according to an eighth embodiment of the present invention, and illustrates the internal construction of a spin chuck in plan. In FIG. 21, components corresponding to those shown in FIG. 3 are denoted by the same reference characters as in FIG. 3. For explanation of this embodiment, a reference is made again to FIGS. 3, 4 and 9.

In this embodiment, the clamping members S1 to S3 (see FIG. 3) employed in the first embodiment are not provided, but only the three clamping members F1 to F3 are provided for clamping a wafer W. Further, the second movement converting mechanism FT2 (see FIG. 3) is not provided, but only the first movement converting mechanism FT1 is provided for operating the clamping members F1 to F3 in association with each other. This embodiment correspondingly differs from the first embodiment, and the second motor M2 and the driving force transmission mechanism for transmitting the driving force from the second motor M2 to the second movement converting mechanism FT2 (the second ball thread mechanism 62, the bearing 53, the second gear 55, the second bearing 72, the second non-rotative movable member 78, the second rotative movable member 82 and the like shown in FIG. 4) are obviated.

In this embodiment, the spin chuck 1 is rotated with the wafer W clamped by the clamping members F1 to F3 (rotation step). During this period, the control section 100 controls the motor M1 to lift the link ring 34, whereby (the wafer W is slightly or completely released from the clamping members F1 to F3 (complete/slight release step) In this state, the control section 100 accelerates or decelerates the rotation of the motor M (acceleration/deceleration step), whereby the wafer W is inertially rotated relative to the spin base 21. Therefore, the clamping members F1 to F3 are moved relative to the wafer W. When the link member 34 is lowered again for clamping the wafer W by the clamping members F1 to F3 (re-clamping step), the wafer clamping positions are changed during the rotation of the wafer W.

With this arrangement, the wafer clamping positions can be changed without stopping the rotation of the spin chuck 1. Therefore, the entire peripheral edge portion of the wafer W can uniformly be treated without reduction in productivity.

Figure 22:
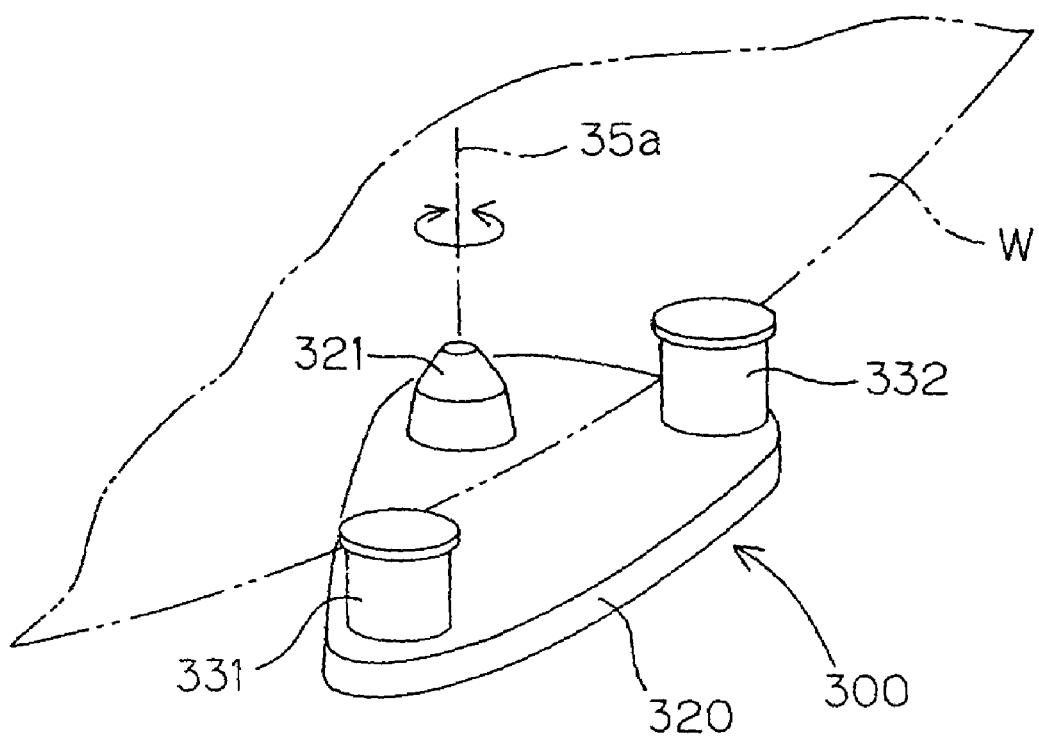
FIG. 22 is a perspective view illustrating the construction of a clamping member employed in a substrate treatment apparatus according to a ninth embodiment of the present invention.

FIG. 22 is a diagram for explaining a ninth embodiment of the present invention and, particularly, a perspective view illustrating the common construction of clamping members 300 employed instead of the clamping members F1 to F3 shown in FIG. 21. The clamping members 300 each include a base plate portion 320, a support portion 321 provided on the base portion 320 for supporting a peripheral edge portion of a lower surface of a wafer W, and first and second abutment portions 331, 332 for clamping the wafer W in abutment against a peripheral surface of the wafer W. The base portion 320 is connected to the shaft 35. The support portion 321 is located above the rotation axis 35a of the shaft 35.

By rotating the clamping member 300 about the rotation axis 35a, the first and second abutment portions 331, 332 are moved toward and away from the peripheral surface of the wafer W. Thus, the clamping member 300 can selectively assume a first clamping position where the first abutment portion 331 clamps the wafer W in abutment against the peripheral surface of the wafer W, a second clamping position where the second abutment portion 332 clamps the wafer W in abutment against the peripheral surface of the wafer W, and a retracted position where both of the first and second abutment portions 331, 332 are retracted from the peripheral surface of the wafer W. When an untreated wafer W is loaded into the substrate treatment apparatus and held on the spin chuck 1, or when a treated wafer W is unloaded from the spin chuck 1, the clamping members 300 each assume the retracted position.

With this arrangement, the control section 100 controls the motor M1 to operate the clamping members 300 so as to selectively bring the first and second abutment portions 331, 332 into abutment against the wafer W during the rotation of the spin chuck 1. As a result, the wafer clamping positions can be changed during the rotation of the spin chuck 1 without stopping the rotation. If the control section 100 controls the motor 2 to continuously rotate the spin chuck 1 at a constant speed at this time, the wafer W is not relatively rotated with respect to the spin chuck 1. Therefore, the generation of particles can be suppressed without sliding contact between the lower surface of the wafer W and the support portions 321.

If it is desired to change the lower surface portions of the wafer W in contact with the support portions 321, the control section 100 controls the motor 2 to accelerate or decelerate the rotation of the spin chuck 1 so as to relatively rotate the wafer W with respect to the spin chuck 1 during the switching between the first and second abutment portions 331 and 332.

In the arrangements illustrated in FIGS. 21 and 22, any of the bearing mechanisms, the rolling mechanisms, the magnetic levitation mechanisms and the pneumatic levitation mechanisms described above may be employed for driving the clamping members F1 to F3, 300.

In the embodiments described above, the first rotative movable member 81 and the second rotative movable member 82 each have a ring shape, but are not necessarily required to have the ring shape. Similarly, the first and second non-rotative movable members 68, 78 are not necessarily required to have the ring shape.

In the first to third embodiments described above, the link mechanisms 31 to 33, 41 to 43 are operated in association with each other by the link ring 34, 44. However, the lift members 46 of the link mechanisms 31 to 33 can be moved up and down in association with each other and the lift members 46 of the link mechanisms 41 to 43 can be moved up and down in association with each other without the provision of the annular link rings 34, 44, as long as the first rotative movable member 81 and the second rotative movable member 82 each have the ring shape.

In the first to seventh embodiments, the wafer W is first clamped by the clamping members F1 to F3, and then transferred to the clamping members S1 to S3. Alternatively, the wafer W may first be clamped by the clamping members S1 to S3, and then transferred to the clamping members F1 to F3.

During the transfer of the wafer W between the clamping members F1 to F3 and the clamping members S1 to S3, the control section 100 may control the motor 2 to continuously rotate the spin chuck 1 at a constant rotation speed and, as required, may control the motor 2 to change the rotation speed of the spin chuck 1. In either case, the wafer W is once clamped in the intermediate state for the transfer of the wafer W, so that the wafer W is not relatively rotated with respect to the spin chuck 1. Therefore, the generation of particles can be suppressed without sliding contact between the wafer W and any portion of the spin chuck 1.

In the first to seventh embodiments, the first and second non-rotative movable members 68, 78 are moved up and down by the motors M1, M2 and the ball thread mechanisms 61, 62, but the up and down movements of the first and second non-rotative movable members 68, 78 may be achieved by employing any other driving mechanisms such as air cylinders.

In the second embodiment, the clamping members F1 to F3 of the first clamping member set each have the first and second abutment portions A, B, and the clamping members S1 to S3 of the second clamping member set each have the third and fourth abutment portions C, D. Alternatively, only the clamping members F1 to F3 may each have two abutment portions A, B, and the clamping members S1 to S3 may each have one abutment portion 96 as in the first embodiment. In this case, the wafer clamping state is once switched from a first state where the wafer W is clamped by the three first abutment portions A of the clamping members F1 to F3 to a first intermediate state where the wafer W is clamped 5 by the three first abutment portions A of the clamping members F1 to F3 and the clamping members S1 to S3, then to a second state where the wafer W is clamped by the clamping members S1 to S3 and unclamped by the first abutment portions A, further to a second intermediate state where the wafer W is clamped by the three second abutment portions B of the clamping members F1 to F3 and the clamping members S1 to S3, and to a third state where the wafer W is clamped by the second abutment portions B and unclamped by the clamping members S1 to S3. Thus, the wafer W clamping state by the clamping members F1 to F3 is transferred from clamping by the first abutment portions A to clamping by the second abutment portions B.

Further, the clamping members F1 to F3 and/or the clamping members S1 to S3 may each include three or more abutment portions which are selectively brought into abutment against the peripheral surface of the wafer W.

In the first to ninth embodiments, the semiconductor wafer is employed as the substrate to be treated, but the present invention is applicable to any other round substrates such as optical disks, and rectangular substrates such as glass substrates for liquid crystal display devices.

Figure 23:
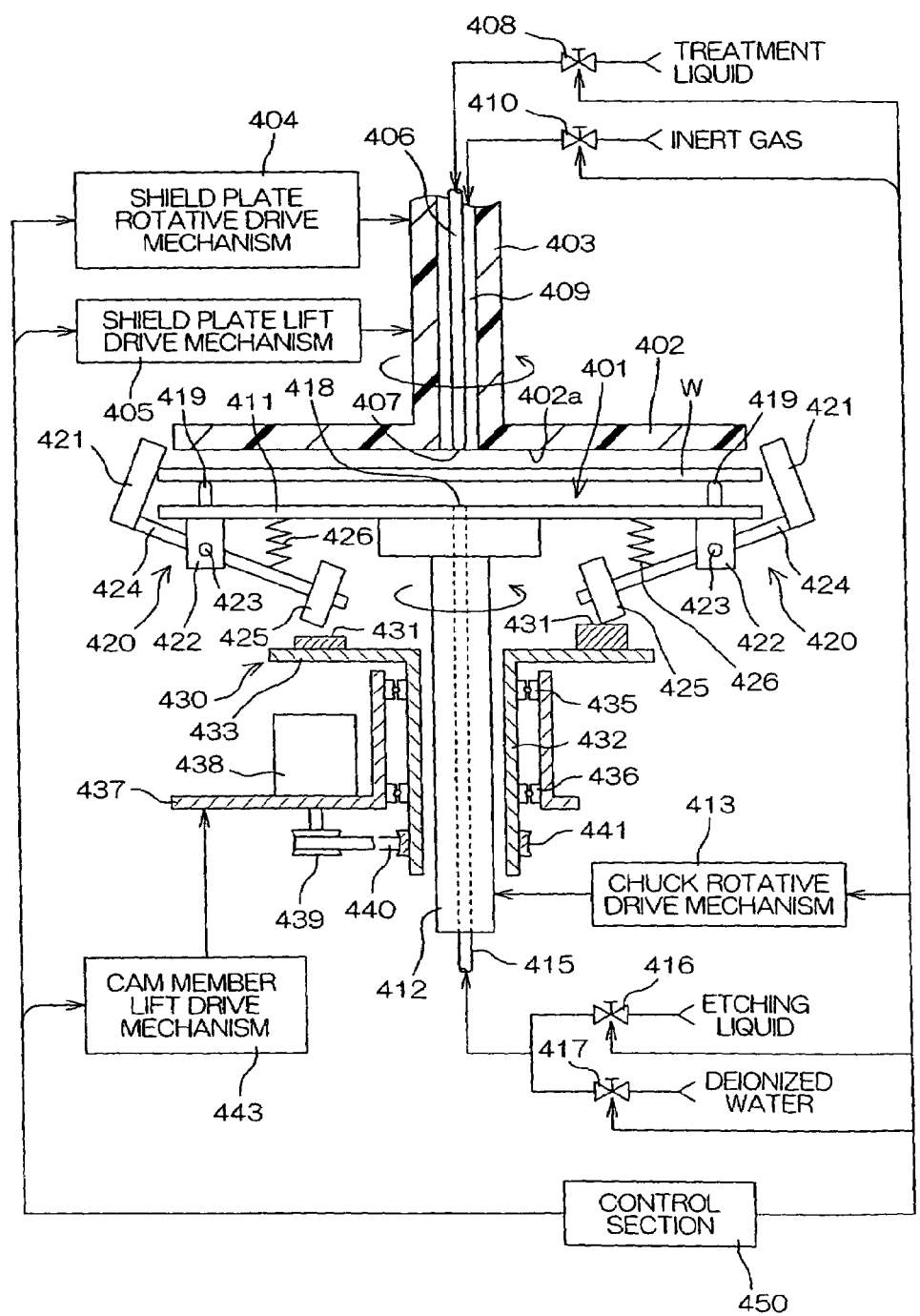
FIG. 23 is a schematic sectional view for explaining the construction of a substrate treatment apparatus according to a tenth embodiment of the present invention.

FIG. 23 is a schematic sectional view for explaining the construction of a substrate treatment apparatus according to a tenth embodiment of the present invention. This substrate treatment apparatus includes a spin chuck 401 for rotating a semiconductor wafer W as an example of a generally round substrate (hereinafter referred to simply as "wafer") about a vertical axis extending through the center thereof while horizontally holding the wafer W, and a shield plate 402 disposed above the spin chuck 401 and having a wafer opposed surface 402a to be located adjacent an upper surface of the wafer W held by the spin chuck 401. The shield plate 402 has a generally disk shape, and the wafer opposed surface 402a thereof has a round shape having a slightly smaller diameter than the wafer W. A vertical rotation shaft 403 is connected to an upper surface of the shield plate 402, and a torque from a shield plate rotative drive mechanism 404 is applied to the rotation shaft 403. A shield plate lift drive mechanism 405 is provided for moving up and down the shield plate 402 with respect to the spin chuck 401.

The rotation shaft 403 has a hollow inside in which a treatment liquid supply pipe 406 is inserted. A distal end portion of the treatment liquid supply pipe 406 serves as a treatment liquid supply nozzle 407 which extends through a through-hole formed in the center of the shield plate 402 to a position opposed to the center of the upper surface of the wafer W held by the spin chuck 401. A treatment liquid such as deionized water can be supplied to the treatment liquid supply pipe 406 via a treatment liquid supply valve 408.

An inert gas supply passage 409 is defined between an interior surface of the rotation shaft 403 and the treatment liquid supply pipe 406 in the rotation shaft 403. An inert gas such as nitrogen gas can be supplied to the inert gas supply passage 409 via an inert gas supply valve 410.

The spin chuck 401 includes a disk-shaped spin base 411, a vertical hollow rotary shaft 412 connected to the center of a lower surface of the spin base 411, and a chuck rotative drive mechanism 413 for applying a rotative driving force to the rotary shaft 412. A treatment liquid supply pipe 415 is inserted through the rotary shaft 412. To this treatment liquid supply pipe 415, an etching liquid or deionized water can be supplied from an etching liquid supply source or a deionized water supply source via an etching liquid supply valve 416 or a deionized water supply valve 417, respectively. The treatment liquid supply pipe 415 extends to an upper surface of the spin base 411, and a distal end portion thereof serves as a treatment liquid supply nozzle 418 for supplying the etching liquid or deionized water toward the center of a lower surface of the wafer W held by the spin chuck 401.

A plurality of support pins 419 for supporting a peripheral edge portion of the lower surface of the wafer W are provided circumferentially of the spin base 411 on the upper surface of the spin base 411 (for example, three support pins are equiangularly provided). A plurality of clamp pins (six clamp pins) 421 are provided on the spin base 411 for clamping the wafer W on the support pins 419 in abutment against a peripheral surface of the wafer W. In this embodiment, the clamp pins 421 are arranged equiangularly circumferentially of the spin base 411.

Movement converting mechanisms 420 are provided in association with the respective clamp pins 421 for causing the clamp pins 421 to clamp and unclamp the wafer W. More specifically, the movement converting mechanisms 420 each include a rocking lever 424 connected to the clamp pin 421 at one end thereof, and a roll 425 as a cam follower rotatably attached to the other end of the rocking lever 424. The rocking lever 424 is coupled to a bracket 422 fixed to the lower surface of the spin base 411 pivotally about a support shaft 423. The support shaft 423 extends horizontally and perpendicularly to a radius of the spin base 411. Therefore, the rocking lever 424 is pivotal within a vertical plane containing the radius of the spin base 411.

A compression coil spring 426 as a biasing mechanism for biasing the clamp pin 421 into a wafer clamping state is provided as extending from the lower surface of the spin base 411 to a portion of the rocking lever 424 between the support shaft 423 and the roll 425. That is, the compression coil spring 426 biases the rocking lever 424 downward at a position radially inward of the spin base 411. Thus, a portion of the rocking lever 424 radially outward from the support shaft 423 is moved upward, whereby the clamp pin 421 is biased radially inwardly.

The roll 425 is provided at the end of the rocking lever 424 rotatably about an axis of the rocking lever 424. A cam member 430 is provided below the roll 425 around the rotary shaft 412. The cam member 430 has a cam surface 431 formed on an upper surface thereof opposed to the roll 425 as having a shape surrounding the rotary shaft 412. More specifically, the cam member 430 includes a cylindrical body 432 provided rotatably about the rotary shaft 412 with the rotary shaft 412 inserted therethrough, and a flange 433 projecting radially outwardly from an upper edge of the body 432. The cam surface 431 is formed on the upper surface of the flange 433.

The cylindrical body 432 is coupled to a bracket 437 via a pair of bearings 435, 436 fitted around the body 432 as spaced longitudinally of the rotary shaft 412. A motor 438 as a cam member rotative drive mechanism for generating a driving force for driving the cam member 430 rotatively about the rotary shaft 412 is attached to the bracket 437. The torque of the cam member rotation motor 438 is transmitted to a pulley 441 coupled to a lower end portion of the cylindrical body 432 via a motor pulley 439 and a timing belt 440.

On the other hand, a cam member lift drive mechanism 443, for example, including a multi-step air cylinder and a ball thread mechanism is coupled to the bracket 437. The cam member 430 can be moved up and down along the rotary shaft 412 by operating the cam member lift drive mechanism 443 to move up and down the bracket 437.

Figure 24A:
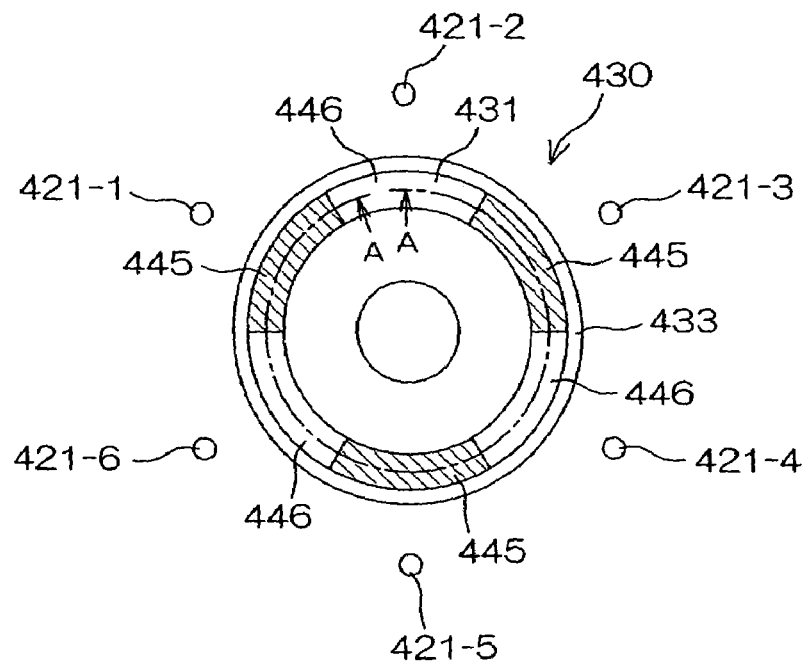
FIGS. 24(A) and 24(B) are diagrams for explaining the configuration of a cam face.
Figure 24B:
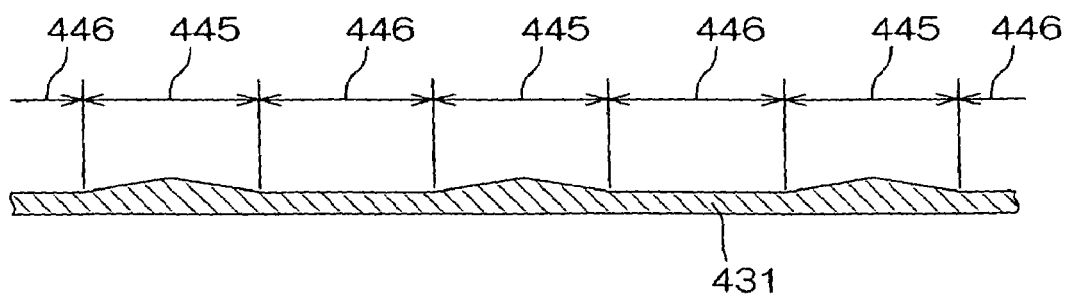

FIG. 24(A) is a plan view for explaining the configuration of the cam surface 431, and FIG. 24(B) is a sectional view taken along a section line A-A extending circumferentially of the cam surface 431. A plurality of projections 445 (three projections 445 hatched in FIGS. 24(A) and 24(B) in this embodiment) are provided in circumferentially (equidistantly) spaced relation on the cam surface 431 as projecting upward (parallel to the rotary shaft). Troughs 446 defined between adjacent projections 445 and 445 each have a planar surface.

In this embodiment, the planar surfaces of the troughs 446 each have an angular span of greater than 60 degrees and, as a result, the projections 445 each have an angular span of smaller than 60 degrees. The projections 445 each have a chevron shape having upward and downward gentle slopes extending circumferentially, and apexes of the three projections 445 are equiangularly spaced (i.e., at an angular interval of 120 degrees) on the cam surface 431.

Where the six clamp pins 421-1 to 421-6 are located in a positional relationship with respect to the cam surface 431 as shown in FIG. 24(A) when the cam surface 431 is positioned at a proper height, the rolls 425 (see FIG. 23) of the movement converting mechanisms 420 for the clamp pins 421-1, 421-3, 421-5 are moved upward along the rotary shaft 412. As a result, the clamp pins 421-1, 421-3, 421-5 are retracted from the peripheral surface of the wafer W thereby to unclamp the wafer W. On the other hand, the rolls 425 of the movement converting mechanisms 420 for the clamp pins 421-2, 421-4, 421-6 located in association with the troughs 446 receive no upward thrust force from the cam surface 431. Therefore, the clamp pins 421-2, 421-4, 421-6 are kept in abutment against the peripheral surface of the wafer W by the biasing forces of the compression coil springs 426 thereby to clamp the wafer W.

When the cam member 430 is rotated relative to the spin chuck 401 about the rotary shaft 412 in this state, the positional relationship between the clamp pins 421-1 to 421-6 and the projections 445 is changed. As a result, a wafer clamping state is switched alternately between a first clamping state where the wafer W is clamped by one set of three clamp pins 421-1, 421-3, 421-5 and a second clamping state where the wafer W is clamped by the other set of three clamp pins 421-2, 421-4, 421-6. Since the planar surfaces of the troughs 446 each have an angular span of greater than 60 degrees as described above, there is an intermediate clamping state where the wafer W is clamped by all the clamp pins 421-1 to 421-6 when the wafer clamping state is switched between the first clamping state and the second clamping state.

The height of the cam surface 431 can be changed by operating the cam member lift drive mechanism 443. Where the cam surface 431 is located at a sufficiently low level (at an all-closing position), the projections 445 of the cam surface 431 are brought into contact with none of the rolls 425 of the movement converting mechanisms 420. Thus, all the clamp pins 421-1 to 421-6 are kept in the wafer clamping state (closed state). Therefore, the clamp pins 421-1 to 421-6 constantly clamp the wafer W in a first inactive mode, irrespective of the relative rotation of the cam member 430 with respect to the spin chuck 401.

Where the cam surface 431 is located at an intermediate height (at an opening/closing position) such that the rolls 425 are lifted on the projections 445 and not lifted on the troughs 446, the clamp pins 421-1-to 421-6 are opened and closed in association with the relative rotation of the cam member 430 with respect to the spin chuck 401, i.e., in association with the rotation of the spin chuck 401, in an active mode.

Further, where the cam surface 431 is located at a sufficiently high level (at an all-opening position) such that the rolls 425 are lifted on both the projections 445 and the troughs 446, all the clamp pins 421-1 to 421-6 are retracted from the peripheral surface of the wafer W in a unclamping state (opened state) in a second inactive mode, irrespective of the relative rotation of the cam member 430 with respect to the spin chuck 401.

The operations of the chuck rotative drive mechanism 413, the cam member rotation motor 438, the cam member lift drive mechanism 443, the shield plate rotative drive mechanism 404 and the shield plate lift drive mechanism 405 are controlled by a control section 450. Further, the opening and closing of the treatment liquid supply valve 408, the inert gas supply valve 410, the etching liquid supply valve 416 and the deionized water supply valve 417 are controlled by the control section 450.

When an untreated wafer W is to be loaded, the control section 450 controls the shield plate lift drive mechanism 405 to retract the shield plate 402 upward above the spin chuck 401. The control section 450 controls the cam member lift drive mechanism 443 to lift the cam member 430 to the all-opening position, whereby the operation mode is switched to the second inactive mode in which all the clamp pins 421-1 to 421-6 are kept in the wafer unclamping state. In this state, the untreated wafer W is placed on the support pins 419 on the spin base 411 by a transport robot (not shown). At this time, a device formation surface (active surface) of the wafer W faces upward as opposed to the shield plate 402.

Next, the control section 450 controls the cam member lift drive mechanism 443 to lower the cam member 430 to the all-closing position, whereby the operation mode is switched to the first inactive mode. Therefore, the wafer W is stably clamped by all the clamp pins 421. Further, the control section 450 controls the shield plate lift drive mechanism 405 to lower the shield plate 402 toward the spin chuck 401, whereby the wafer opposed surface 402a is located in the vicinity of the upper surface of the wafer W.

In this state, the control section 450 controls the shield plate rotative drive mechanism 404 and the chuck rotative drive mechanism 413 to synchronously rotate the spin chuck 401 and the shield plate 402, for example, in the same direction at substantially the same rotation speed. At the same time, the control section 450 opens the inert gas supply valve 410 to supply the inert gas to the upper surface of the wafer W. The control section 450 opens the etching liquid supply valve 416 to supply the etching liquid from the treatment liquid supply nozzle 418 toward the center of the lower surface of the wafer W.

The control section 450 controls the cam member rotation motor 438 to rotate the cam member 430 for relative rotation of the cam member 430 with respect to the spin chuck 401 at a predetermined speed. For example, it is preferred that the cam member 430 and the spin chuck 401 are rotated in the same direction and a difference in rotation speed between the spin chuck 401 and the cam member 430 is 10 rpm to 300 rpm (more preferably about 60 rpm).

After the spin chuck 401 is accelerated to a predetermined rotation speed to be rotated at the constant rotation speed, the control section 450 controls the cam member lift drive mechanism 443 to lift the cam member 430 to the opening/closing position at the intermediate height. At the opening/ closing position, the rolls 425 are lifted on the projections 445 of the cam surface 431, but not lifted on the troughs 446. Thus, the three clamp pins 421-1, 421-3, 421-5 arranged at an angular interval of 120 degrees are synchronously opened and closed, while the other three clamp pins 421-2, 421-4, 421-6 arranged at an angular interval of 120 degrees are synchronously opened and closed. The set of the three clamp pins 421-1, 421-3, 421-5 and the set of the three clamp pins 421-2, 421-4,421-6 are opened and closed in alternately staggered timing relation. Thus, the wafer clamping positions can be changed, while the wafer W is constantly clamped by either or both of the sets of the clamp pins 421.

The etching liquid supplied to the center of the lower surface of the wafer W from the treatment liquid supply nozzle 418 flows over the lower surface of the wafer W radially outwardly of the wafer W by a centrifugal force, and then flows over the peripheral surface of the wafer W to reach the peripheral edge portion of the upper surface of the wafer W. Thus, a so-called bevel etching process or bevel cleaning process can be performed by etching away an unnecessary substance from the peripheral surface of the wafer W and the peripheral edge portion of the upper surface of the wafer W. During the bevel etching process or the bevel cleaning process, the clamp pins 421 are opened and closed to change the wafer clamping positions. Therefore, the peripheral surface of the wafer W and the peripheral edge portion of the upper surface of the wafer W can entirely and properly be subjected to the etching process.

The amount of the etching liquid flowing onto the upper surface of the wafer W is controlled by controlling the rotation speed of the spin chuck 401, the distance between the shield plate 402 and the upper surface of the wafer W and the flow rate of the inert gas supplied to the upper surface of the wafer W.

Upon completion of the bevel etching process, the control section 450 closes the etching liquid supply valve 416, and opens the deionized water supply valve 417. Thus, deionized water is supplied from the treatment liquid supply nozzle 418 toward the center of the lower surface of the wafer W, whereby a deionized water rinse process is performed for rinsing off the etching liquid from the surface of the wafer W. At this time, the treatment liquid supply valve 408 is opened under the control of the control section 450 to supply deionized water to the upper surface of the wafer W as required.

During the deionized water rinse process, the set of the clamp pins 421-1, 421-3, 421-5 and the set of the clamp pins 421-2, 421-4, 421-6 are opened and closed in alternately staggered timing relation, so that the entire surface of the wafer W can properly be rinsed.

Upon completion of the rinse process, the control section 450 closes the deionized water supply valve 417 and, if the treatment liquid supply valve 408 is opened, closes the valve 408. Thereafter, the control section 450 controls the cam member lift drive mechanism 443 to move the cam member 430 down to the all-closing position, and then stops the motor 438. Thus, all the clamp pins 421 are brought into the wafer clamping state. In this state, the control section 450 controls the chuck rotative drive mechanism 413 and the shield plate rotative drive mechanism 404 to accelerate the rotation of the spin chuck 401 and the shield plate 402 so as to rotate the wafer W at a high speed. Thus, a drying process is performed by spinning off water from the surface of the wafer W by a centrifugal force. During the drying process, the wafer W is stably clamped by all the clamp pins 421-1 to 421-6.

After the spin chuck 401 is rotated at a high speed for a predetermined period to complete the drying process, the control section 450 controls the shield plate rotative drive mechanism 404 and the chuck rotative drive mechanism 413 to stop the rotation of the spin chuck 401 and the shield plate 402. Further, the control section 450 controls the shield plate lift drive mechanism 405 to lift the shield plate 402 upward to the retracted position above the spin chuck 401. Further, the control section 450 controls the cam member lift drive mechanism 443 to lift the cam member 430 to the all-opening position. Thus, all the clamp pins 421 are brought into the wafer unclamping state. In this state, the treated wafer W is unloaded from the support pins 419 by the transport robot.

In this embodiment, the clamp pins 421 can thus be opened and closed in association with the rotation of the spin chuck 401 simply by rocking the rocking levers 424 by means of the cam mechanism. The set of the three clamp pins 421-1, 421-3, 421-5 and the set of the three clamp pins 421-2, 421-4, 421-6 clamp the wafer W in alternately staggered timing relation, so that the entire peripheral surface and peripheral edge portion of the wafer W can properly be treated without the relative rotation of the wafer W with respect to the spin chuck 401. Therefore, the abrasion of the clamp pins 421 can be suppressed.

In addition, the wafer W is clamped by all the clamp pins 421-1 to 421-6 in the intermediate clamping state when the wafer clamping state is switched between the first clamping state with the wafer W clamped by the three clamp pins 421-1, 421-3, 421-5 and the second clamping state with the wafer W clamped by the three clamp pins 421-2, 421-4, 421-6. Therefore, the wafer W is constantly stably held by all or some of the clamp pins 421. This eliminates an unstable wafer holding period. Accordingly, there is no possibility that the wafer W is spun out of the spin chuck 401. Further, the shield plate 402 can assuredly be spaced a minute distance from the wafer W, whereby the amount of the etching liquid flowing onto the upper surface of the wafer W can strictly be controlled. This makes it possible to precisely treat the peripheral edge portion of the wafer W.

In this embodiment, the cam member 430 is rotatable about the rotary shaft 412, and the rotation speed of the cam member 430 can be controlled independently of the rotation speed of the spin chuck 401. Therefore, a clamp pin opening and closing interval can properly be set. As required, the clamp pin opening and closing interval may be varied during the treatment of the wafer W.

By moving up and down the cam member 430, the operation mode can be switched among the first inactive mode where the clamp pins 421 are kept in the wafer clamping state, the second inactive mode where the clamp pins 421 are kept in the wafer unclamping state, and the active mode where the clamp pins 421 are alternately switched between the wafer clamping state and the wafer unclamping state. Thus, the operation mode of the clamp pins 421 can be switched with the simple construction.

Figure 25A:
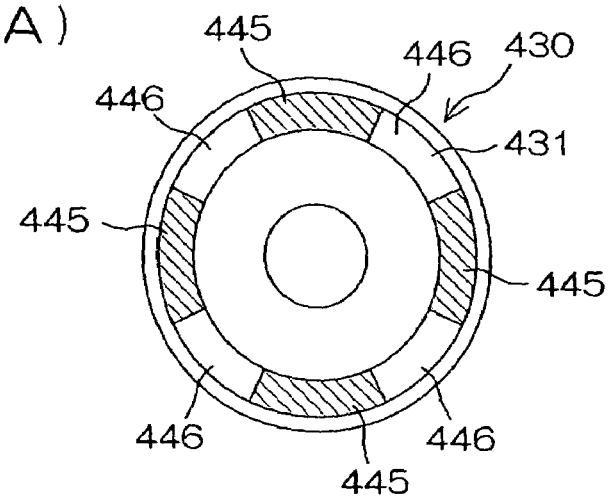
FIGS. 25(A), 25(B) and 25(C) are plan views illustrating modifications of the configuration of the cam face.
Figure 25B:
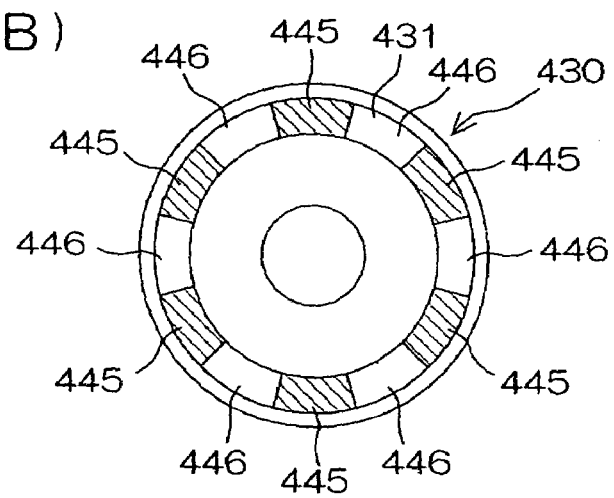
Figure 25C:
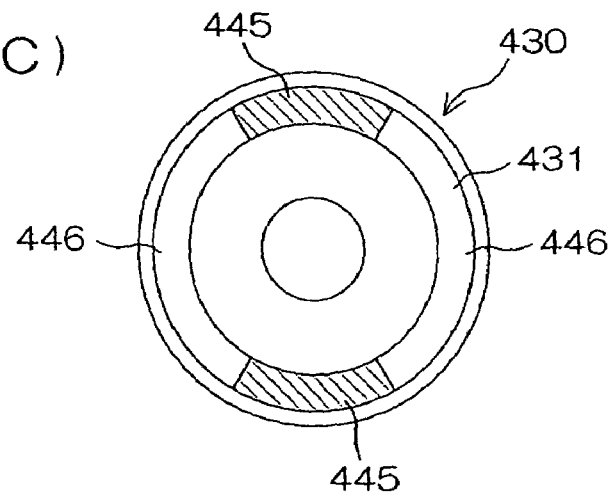

Although the three projections 445 are provided in circumferentially spaced relation on the cam surface 431 in the embodiment described above, four projections 445 may be provided on the cam surface 431 as shown in FIG. 25(A). Alternatively, six projections 445 may be provided in circumferentially spaced relation on the cam surface 431 as shown in FIG. 25(B), or two projections 445 may be provided in opposed relation about the rotation center as shown in FIG. 25(C). With any of these arrangements, the plurality of clamp pins can be switched between the wafer clamping state and the wafer unclamping state.

With the arrangement shown in FIG. 25(C), for example, the six clamp pins 421-1 to 421-6 are sequentially brought into the wafer unclamping state with each opposed pair of clamp pins about the rotary shaft being opened and with the other four clamp pins being closed to clamp the wafer W.

With the arrangement shown in FIG. 25(B), the six clamp pins 421-1 to 421-6 are simultaneously opened or closed. Where it is desired to relatively rotate the wafer W on the spin chuck 401, this arrangement is preferably employed. That is, if the abrasion of the clamp pins 421 is not a serious problem, the rotational position of the wafer W relative to the spin chuck 401 may be changed by accelerating or decelerating the rotation of the spin chuck 401 with all the clamp pins 421 being opened when the treatment is performed by supplying the treatment liquid such as the etching liquid to the wafer W.

In general, however, the configuration and arrangement of the projections 445 on the cam surface 431 are preferably determined so as to prevent each adjacent pair of clamp pins 421 from being simultaneously brought into the unclamping state when the cam member 430 is located at the opening/closing position. Thus, the relative rotation of the wafer W with respect to the spin chuck 401 can be suppressed.

In the embodiment described above, the wafer W is clamped by the six clamp pins 421 disposed circumferentially of the wafer in equiangularly spaced relation. However, any number of clamp pins may be employed as long as the wafer W can properly be held.

Figure 26A:
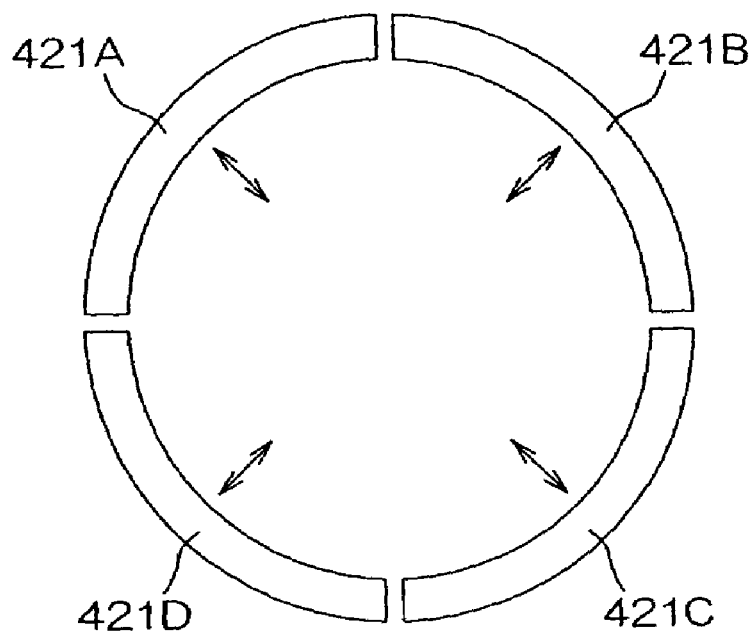
FIGS. 26(A) and 26(B) are plan views illustrating modified clamping members.
Figure 26B:
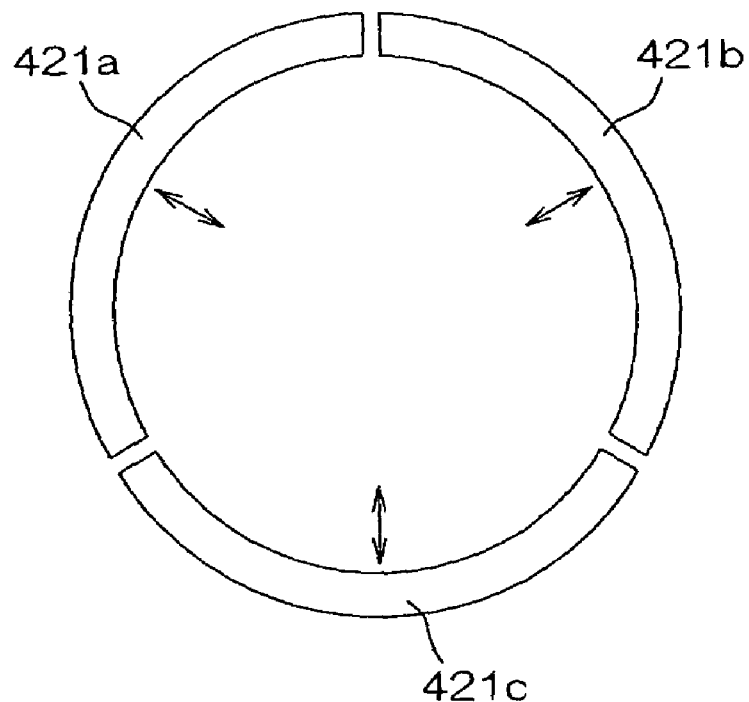

Further, the clamping members for clamping the wafer W are not necessarily required to have a pin shape, but arcuate clamping members 421A, 421B, 421C, 421D, or 421a, 421b, 421c may be employed which are each brought into line contact with the peripheral surface of the wafer W over a predetermined angular span as shown in FIGS. 26(A) or 26(B).

With the arrangement shown in FIG. 26(A), for example, the four arcuate clamping members 421A, 421B, 421C, 421D are disposed in equiangularly spaced relation, and are each brought into line contact with the peripheral surface of the wafer W over an angular span of about 90 degrees, whereby the wafer W can be clamped by either of the two pairs of clamping members 421A, 421C; 421B, 421D disposed in opposed relation about the rotation center. Even if the two pairs of clamping members 421A, 421C; 421B, 421D are alternately opened and closed during the treatment with the etching liquid or the like, the wafer W can stably be held by either of the two pairs of clamping members 421A, 421C; 421B, 421D.

With the arrangement shown in FIG. 26(B), the three arcuate clamping members 421a, 421b, 421c are disposed in equiangularly spaced relation, and are each brought into line contact with the peripheral surface of the wafer W over an angular span of about 120 degrees. These clamping members 421a, 421b, 421c are circularly opened and closed one by one, whereby the wafer W can stably be held over an angular span of about 240 degrees (i.e., over an angular span of greater than 180 degrees) for properly treating the peripheral edge portion of the wafer W.

In the embodiment described above, the substrate treatment apparatus is adapted to perform the bevel etching process or the bevel cleaning process while holding the peripheral surface of the wafer W. However, the inventive substrate treatment apparatus maybe embodied as a substrate treatment apparatus which is adapted to perform a treatment process by supplying the treatment liquid such as the etching liquid over the entire surface of the substrate in addition to the bevel etching process or the bevel cleaning process.

In the embodiment described above, the cam member 430 is disposed rotatably about the rotary shaft 412, but the cam member 430 may be disposed in a non-rotatable manner about the rotary shaft 412. In this case, the clamp pin opening and closing interval depends on the rotation speed of the spin chuck 401 alone.

In the embodiment described above, the wafer W is employed as the substrate to be treated by way of an example. However, the present invention is applicable to substrate treatment apparatuses for treating any other types of round substrates such as for optical disks and magnetic disks and substrate treatment apparatuses for treating rectangular substrates such as glass substrates for liquid crystal display devices.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application corresponds to Japanese Patent Applications No. 2002-218723 and No. 2002-218724 filed with the Japanese Patent Office on Jul. 26, 2002, No. 2002-281628 filed with the Japanese Patent Office on Sep. 26, 2002, and No. 2003-83695 and No. 2003-83696 filed with the Japanese Patent Office on Mar. 25, 2003, the disclosure of which is incorporated herein by reference.

What is claimed is:

1. A substrate treatment apparatus comprising:

a substrate holding mechanism comprising a first clamping member set including at least two clamping members, and a second clamping member set provided separately from the first clamping member set and including at least two clamping members;

a rotative drive mechanism for rotating the substrate holding mechanism;

a first clamping member drive mechanism for driving the first clamping member set;

a second clamping member drive mechanism for driving the second clamping member set; and a controller for independently controlling the first clamping member drive mechanism and the second clamping member drive mechanism;

wherein the substrate holding mechanism comprises a rotary member including a rotary shaft rotatively driven by the rotative drive mechanism, a first substrate clamping mechanism including the first clamping member set, and a second substrate clamping mechanism including the second clamping member set, wherein the first clamping member drive mechanism comprises a first non-rotative movable member which is movable parallel to the rotary shaft, a first driving mechanism for moving the first non-rotative movable member parallel to the rotary shaft, a first rotative movable member which is movable parallel to the rotary shaft in association with movement of the first non-rotative movable member by a driving force received from the first non-rotative movable member and is rotatable together with the rotary member, and a first movement converting mechanism for converting movement of the first rotative movable member into movement of the first substrate clamping member set, wherein the second clamping member drive mechanism comprises a second non-rotative movable member which is movable parallel to the rotary shaft, a second driving mechanism for moving the second non-rotative movable member parallel to the rotary shaft, a second rotative movable member which is movable parallel to the rotary shaft in association with movement of the second non-rotative movable member by a driving force received from the second non-rotative movable member and is rotatable together with the rotary member, and a second movement converting mechanism for converting movement of the second rotative movable member into movement of the second substrate clamping member set.

2. A substrate treatment apparatus as set forth in claim 1, wherein the controller controls the rotative drive mechanism, the first clamping member drive mechanism and the second clamping member drive mechanism to perform a first substrate rotation process for rotating the substrate holding mechanism while clamping the substrate by the first clamping member set, to perform a second substrate rotation process after the first substrate rotation process for rotating the substrate holding mechanism while clamping the substrate by the first clamping member set and the second clamping member set, and to perform a third substrate rotation process after the second substrate rotation process by unclamping the substrate from the first clamping member set for rotating the substrate holding mechanism while clamping the substrate by the second clamping member set.

3. A substrate treatment apparatus as set forth in claim 1, wherein the clamping members of at least one of the first clamping member set and the second clamping member set each have at least two abutment portions which are selectively brought into abutment against the substrate, wherein the controller performs an abutment portion switching process for switchably bringing the at least two abutment portions into abutment against the substrate.

4. A substrate treatment apparatus as set forth in claim 1, wherein the controller is capable of controlling the first clamping member drive mechanism and the second clamping member drive mechanism so as to clamp the substrate by both the first clamping member set and the second clamping member set.

5. A substrate treatment apparatus as set forth in claim 1, wherein the controller controls the first and second driving mechanisms to switch, when the rotary member is rotated by the rotative drive mechanism, a substrate clamping state between a first clamping state where the substrate is clamped by the clamping members of the first substrate clamping mechanism and unclamped by the clamping members of the second substrate clamping mechanism and a second clamping state where the substrate is clamped by the clamping members of the second substrate clamping mechanism and unclamped by the clamping members of the first substrate clamping mechanism.

6. A substrate treatment apparatus as set forth in claim 1, wherein at least one of the first non-rotative movable member and the first rotative movable member is configured annularly about the rotary shaft, and at least one of the second non-rotative movable member and the second rotative movable member is configured annularly about the rotary shaft.

7. A substrate treatment apparatus as set forth in claim 1, wherein the first driving mechanism and the second driving mechanism comprise a first driving force source and a second driving force source, respectively, which are independently controllable, wherein the controller controls the first driving force source and the second driving force source independently.

8. A substrate treatment apparatus as set forth in claim 1, further comprising a first driving force transmission mechanism for transmitting the driving force from the first non-rotative movable member to the first rotative movable member while permitting relative rotation of the first rotative movable member with respect to the first non-rotative movable member about the rotary shaft.

9. A substrate treatment apparatus as set forth in claim 8, wherein the first driving force transmission mechanism comprises a first annular bearing which couples the first non-rotative movable member and the first rotative movable member so as to permit the relative rotation of the first rotative movable member with respect to the first non-rotative movable member about the rotary shaft.

10. A substrate treatment apparatus as set forth in claim 8, wherein the first driving force transmission mechanism comprises a plurality of first rolling members provided on at least one of the first non-rotative movable member and the first rotative movable member so as to be rolled on a surface of the other movable member.

11. A substrate treatment apparatus as set forth in claim 8, wherein the first driving force transmission mechanism comprises a first stationary magnet and a first rotary magnet respectively provided on the first non-rotative movable member and the first rotative movable member with opposed poles thereof having the same polarity.

12. A substrate treatment apparatus as set forth in claim 8, wherein the first driving force transmission mechanism comprises a first gas supply mechanism for supplying a gas between the first non-rotative movable member and the first rotative movable member so as to keep the first non-rotative movable member and the first rotative movable member in spaced relation.

13. A substrate treatment apparatus as set forth in claim 8, further comprising a second driving force transmission mechanism for transmitting the driving force from the second non-rotative movable member to the second rotative movable member while permitting relative rotation of the second rotative movable member with respect to the second non-rotative movable member about the rotary shaft.

14. A substrate treatment apparatus as set forth in claim 13, wherein the second driving force transmission mechanism comprises a second annular bearing which couples the second non-rotative movable member and the second rotative movable member so as to permit the relative rotation of the second rotative movable member with respect to the second non-rotative movable member about the rotary shaft.

15. A substrate treatment apparatus as set forth in claim 13, wherein the second driving force transmission mechanism comprises a plurality of second rolling members provided on at least one of the second non-rotative movable member and the second rotative movable member so as to be rolled on a surface of the other movable member.

16. A substrate treatment apparatus as set forth in claim 13, wherein the second driving force transmission mechanism comprises a second stationary magnet and a second rotary magnet respectively provided on the second non-rotative movable member and the second rotative movable member with opposed poles thereof having the same polarity.

17. A substrate treatment apparatus as set forth in claim 13, wherein the second driving force transmission mechanism comprises a second gas supply mechanism for supplying a gas between the second non-rotative movable member and the second rotative movable member so as to keep the second non-rotative movable member and the second rotative movable member in spaced relation.

18. A substrate treatment apparatus as set forth in claim 1, further comprising a treatment fluid supply mechanism for supplying a treatment fluid to a surface of the substrate held and rotated by the substrate holding mechanism.

19. A substrate treatment apparatus as set forth in claim 18, wherein the treatment fluid supply mechanism comprises an etching liquid supply mechanism for supplying an etching liquid for removing an unnecessary substance from a peripheral edge portion of the substrate held and rotated by the substrate holding mechanism.

* * * * *